(12) United States Patent
Lee et al.

(10) Patent No.: US 12,464,882 B2
(45) Date of Patent: Nov. 4, 2025

(54) LIGHT EMITTING DEVICE FOR DISPLAY AND DISPLAY APPARATUS HAVING THE SAME

(71) Applicant: SEOUL VIOSYS CO., LTD., Ansan-si (KR)

(72) Inventors: Seom Geun Lee, Ansan-si (KR); Seong Kyu Jang, Ansan-si (KR); Yong Woo Ryu, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/600,228

(22) Filed: Mar. 8, 2024

(65) Prior Publication Data

US 2024/0282803 A1    Aug. 22, 2024

Related U.S. Application Data

(63) Continuation of application No. 17/314,562, filed on May 7, 2021, now Pat. No. 11,961,873.

(60) Provisional application No. 63/022,670, filed on May 11, 2020.

(51) Int. Cl.
| | |
|---|---|
| *H01L 25/13* | (2006.01) |
| *H01L 25/075* | (2006.01) |
| *H10H 20/831* | (2025.01) |
| *H10H 20/857* | (2025.01) |
| *H10H 29/14* | (2025.01) |

(52) U.S. Cl.
CPC ....... *H10H 29/142* (2025.01); *H01L 25/0753* (2013.01); *H10H 20/8312* (2025.01); *H10H 20/857* (2025.01)

(58) Field of Classification Search
CPC ............. H10H 29/142; H10H 20/8312; H10H 20/857; H01L 25/0753; H01L 25/0756; H01L 2933/0016; H01L 2933/0066
See application file for complete search history.

(56) References Cited

U.S. PATENT DOCUMENTS

| | | | |
|---|---|---|---|
| 2010/0051975 A1 | 3/2010 | Suzuki et al. | |
| 2011/0089440 A1 | 4/2011 | Park | |
| 2017/0288093 A1* | 10/2017 | Cha ................... | H10H 20/8312 |
| 2019/0097088 A1 | 3/2019 | Huppmann et al. | |
| 2019/0164944 A1 | 5/2019 | Chae et al. | |
| 2019/0165207 A1 | 5/2019 | Kim et al. | |
| 2019/0214373 A1 | 7/2019 | Kim et al. | |

(Continued)

FOREIGN PATENT DOCUMENTS

| | | |
|---|---|---|
| KR | 1020170042426 A | 4/2017 |
| KR | 1020170115142 A | 10/2017 |

OTHER PUBLICATIONS

Search report issued in corresponding International Application No. PCT/KR2021!005897, mailed Aug. 25, 2021.

*Primary Examiner* — Cuong B Nguyen
(74) *Attorney, Agent, or Firm* — Perkins Coie LLP

(57) ABSTRACT

A light emitting device for a display according to an exemplary embodiment includes a first LED stack, a second LED stack located under the first LED stack, and a third LED stack located under the second LED stack. The light emitting device further includes a first bonding layer, a second bonding layer, a first planarization layer, a second planarization layer, lower buried vias, and upper buried vias. The first planarization layer is recessed inwardly to expose an edge of the second LED stack.

14 Claims, 46 Drawing Sheets

(56) References Cited

U.S. PATENT DOCUMENTS

| | | |
|---|---|---|
| 2019/0252460 A1 | 8/2019 | Andrews et al. |
| 2020/0176637 A1 | 6/2020 | Wu et al. |
| 2021/0305189 A1 | 9/2021 | Jin et al. |
| 2021/0351229 A1 | 11/2021 | Lee et al. |
| 2022/0028841 A1 | 1/2022 | Kishimoto |

\* cited by examiner

LIGHT EMITTING DEVICE FOR DISPLAY AND DISPLAY APPARATUS HAVING THE SAME

CROSS-REFERENCE OF RELATED APPLICATIONS AND PRIORITY

This application is a continuation of U.S. patent application Ser. No. 17/314,562, filed on May 7, 2021, which is claims priority to and the benefit U.S. Provisional Application No. 63/022,670, filed on May 11, 2020. The aforementioned applications of which are incorporated herein by reference in their entireties.

TECHNICAL FIELD

Exemplary embodiments relate to a light emitting device for a display and a display apparatus, and, more particularly, to a light emitting device for a display, which has a stack structure of LEDs, and a display apparatus including the same.

BACKGROUND

As an inorganic light source, light emitting diodes have been used in various fields including displays, vehicular lamps, general lighting, and the like. With various advantages such as long lifespan, low power consumption, and rapid response, light emitting diodes have been replacing existing light sources in the art.

Light emitting diodes have been used as backlight light sources in display apparatuses. However, LED displays that directly realize images using the light emitting diodes have been recently developed.

In general, a display apparatus realizes various colors through mixture of blue, green and red light. So as to realize various images, the display apparatus comprises a plurality of pixels, each of which comprises sub-pixels corresponding to blue, green and red light, respectively, in which a color of a certain pixel is determined based on the colors of the sub-pixels so that images can be realized through combination of such pixels.

As LEDs can emit various colors depending upon materials thereof, it is possible to provide a display apparatus by arranging individual LED chips emitting blue, green and red light on a two-dimensional plane. However, when one LED chip is arranged in each sub-pixel, several LED chips may be used for one LED chip, which may result in a mounting process during manufacture that is costly and time consuming.

Moreover, the sub-pixels are arranged on the two-dimensional plane in the display apparatus, and a relatively large area is occupied by one pixel that includes the sub-pixels for blue, green, and red light. Accordingly, an area of each LED chip may be reduced to arrange the sub-pixels in a restricted area. However, reduction in size of LED chips may cause difficulty in mounting LED chips and result in reduction of luminous areas of the LED chips.

SUMMARY

Exemplary embodiments provide a light emitting device for a display capable of increasing an area of each sub-pixel in a restricted pixel area and a display apparatus including the same.

Exemplary embodiments provide a light emitting device for a display capable of reducing a time for a mounting process and a display apparatus including the same.

Exemplary embodiments provide a light emitting device for a display capable of increasing a process yield and a display apparatus including the same.

Alight emitting device for a display according to an exemplary embodiment includes (i) a first LED stack, (ii) a second LED stack located under the first LED stack, (iii) a third LED stack located under the second LED stack, (iv) a first bonding layer interposed between the second LED stack and the third LED stack, (v) a second bonding layer interposed between the first LED stack and the second LED stack, (vi) a first planarization layer interposed between the second bonding layer and the second LED stack, (vii) a second planarization layer disposed on the first LED stack, (viii) lower buried vias passing through the first planarization layer, the second LED stack, and the first bonding layer, and electrically connected to a first conductivity type semiconductor layer and a second conductivity type semiconductor layer of the third LED stack, respectively, and (ix) upper buried vias passing through the second planarization layer and the first LED stack, in which the first planarization layer is recessed inwardly from an edge of the second LED stack.

A display apparatus according to an exemplary embodiment includes a circuit board, and a plurality of light emitting devices arranged on the circuit board, in which each of the light emitting devices is the light emitting device set forth above.

DESCRIPTION OF DRAWINGS

FIG. 6A illustrates patterning a third LED stack using photolithography and etching techniques;

FIG. 6B illustrates a cross-section view of FIG. 6A along the A-A' line;

FIG. 6C illustrates a cross-section view of FIG. 6A along the B-B' line;

FIG. 7A illustrates forming a second p-electrode pad;

FIG. 7B illustrates a cross-section view of FIG. 7A along the A-A' line;

FIG. 7C illustrates a cross-section view of FIG. 7A along the B-B' line;

FIG. 8A illustrates forming lower buried vias to fill through holes;

FIG. 8B illustrates a cross-section view of FIG. 8A along the A-A' line;

FIG. 8C illustrates a cross-section view of FIG. 8A along the B-B' line;

FIG. 9A illustrates forming lower connectors;

FIG. 9B illustrates a cross-section view of FIG. 9A along the A-A' line;

FIG. 9C illustrates a cross-section view of FIG. A along the B-B' line;

FIG. 10A illustrates patterning a first planarization layer to remove a part of the first planarization layer near a device isolation region;

FIG. 10B illustrates a cross-section view of FIG. 10A along the A-A' line;

FIG. 10C illustrates a cross-section view of FIG. 10A along the B-B' line;

FIG. 11A illustrates a first LED stack bonded to the second LED stack;

FIG. 11B illustrates a cross-section view of FIG. 11A along the A-A' line;

FIG. 11C illustrates a cross-section view of FIG. 11B along the B-B' line;

FIG. 12A illustrates forming a second planarization layer covering the first LED stack;

FIG. 12B illustrates a cross-section view of FIG. 12A along the A-A' line;

FIG. 12C illustrates a cross-section view of FIG. 12A along the B-B' line;

FIG. 13A illustrates forming upper connectors;

FIG. 13B illustrates a cross-section view of FIG. 13A along the A-A' line;

FIG. 13C illustrates a cross-section view of FIG. 13A along the B-B' line;

FIG. 14A illustrates forming a first upper insulation layer covering the second planarization layer;

FIG. 14B illustrates a cross-section view of FIG. 14A along the A-A' line;

FIG. 14C illustrates a cross-section view of FIG. 14A along the A-A' line;

FIG. 15A illustrates forming openings the upper connectors formed in FIG. 14A;

FIG. 15B illustrates a cross-section view of FIG. 15A along the A-A' line;

FIG. 15C illustrates a cross-section view of FIG. 15A along the B-B' line;

FIG. 16A illustrates forming a planarization layer on an underlying layer S;

FIG. 16B illustrates forming a sidewall insulation layer;

FIG. 16C illustrates blanket etching the sidewall insulation layer; and

FIG. 16D illustrates forming a seed layer in the planarization layer;

FIG. 17A illustrates forming a first or second planarization layer;

FIG. 17B illustrates forming a sidewall insulation layer;

FIG. 17C illustrates blanket etching using a dry etching technique; and

FIG. 17D illustrates forming a seed layer and a plating layer.

FIG. 19A illustrates isolating a plurality of light emitting devices and arranging on a third substrate;

FIG. 19B illustrates selectively bonding bump pads of the light emitting devices on a circuit board; and FIG. 19C illustrates separating the light emitting devices from the third substrate and transferring to the circuit board.

DETAILED DESCRIPTION OF EMBODIMENTS

Figure 1:
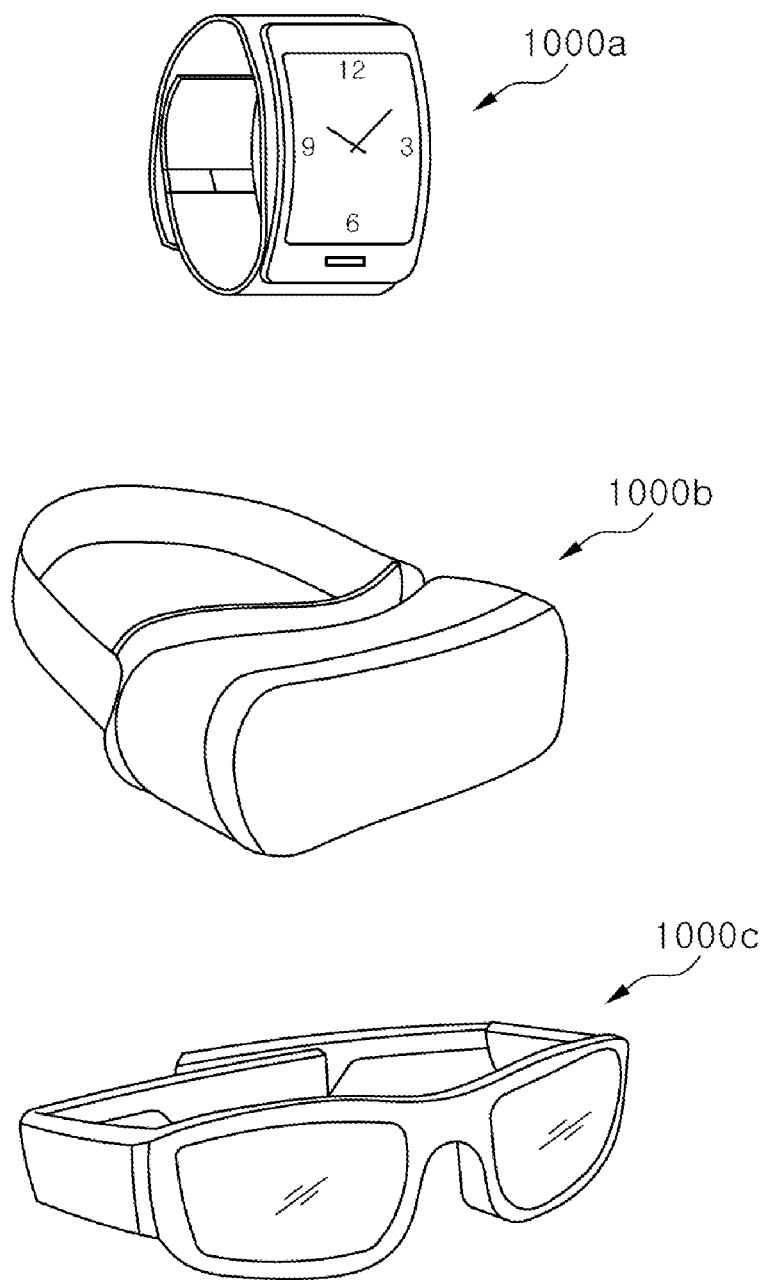
FIG. 1 shows schematic perspective views illustrating display apparatuses according to exemplary embodiments.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

A light emitting device for a display according to an exemplary embodiment includes a first LED stack, a second LED stack located under the first LED stack, a third LED stack located under the second LED stack, a first bonding layer interposed between the second LED stack and the third LED stack, a second bonding layer interposed between the first LED stack and the second LED stack, a first planarization layer interposed between the second bonding layer and the second LED stack, a second planarization layer disposed on the first LED stack, lower buried vias passing through the first planarization layer, the second LED stack, and the first bonding layer, and electrically connected to a first conductivity type semiconductor layer and a second conductivity type semiconductor layer of the third LED stack, respectively, and upper buried vias passing through the second planarization layer and the first LED stack, in which the first planarization layer is recessed inwardly from an edge of the second LED stack.

In some forms, the plurality of lower buried vias is structured to pass through the first planarization layer, the second LED stack, and the first bonding layer, the lower buried vias electrically connected to a first conductivity type semiconductor layer and a second conductivity type semiconductor layer of the third LED stack, respectively. The plurality of upper buried vias is structured to pass through the second planarization layer and the first LED stack.

Hereinafter, for convenience of description, the second LED stack is described as being disposed under the first LED stack, and the third LED stack is described as being disposed under the second LED stack, however, in some exemplary embodiments, the light emitting device may be flip-bonded. In this case, upper and lower positions of these first, second, and third LED stacks may be reversed.

In an exemplary embodiment, the first LED stack may be configured to emit light having a longer wavelength than that emitted from the second LED stack, and the second LED stack may be configured to emit light having a longer wavelength than that emitted from the third LED stack. For example, the first, second, and third LED stacks may emit red light, green light, and blue light, respectively.

In another exemplary embodiment, the first, second, and third LED stacks may be configured to emit red light, blue light, and green light, respectively. As the second LED stack is configured to emit blue light and the third LED stack is configured to emit green light, a color mixing ratio may be adjusted by reducing luminous intensity of light generated in the second LED stack.

The light emitting device may further include lower connectors covering the lower buried vias, in which portions of the upper buried vias may be connected to the lower connectors. As the lower connectors are included, electrical connection of the upper buried vias may be strengthened, and further, reliability of a process of forming the upper buried vias may be improved.

In an exemplary embodiment, portions of the upper buried vias may be disposed to be overlapped with the lower buried vias.

In at least one variation, the light emitting device may further include a lower buried via passing through the first planarization layer and a second conductivity type semiconductor layer of the second LED stack and electrically connected to a first conductivity type semiconductor layer of the second LED stack, and one of the lower connectors may cover the lower buried via electrically connected to the first conductivity type semiconductor layer of the second LED stack.

Additionally or alternatively, the light emitting device may further include a second p-electrode pad electrically connected to the second conductivity type semiconductor layer of the second LED stack, and a lower buried via passing through the first planarization layer and connected to the second p-electrode pad.

In another variant, the lower buried via passing through the first planarization layer and connected to the second p-electrode pad may have a smaller difference in area between a bottom surface and an upper surface than those of other lower buried vias. In some forms, the second lower buried via has a height between a bottom surface and an upper surface smaller than heights of the rest of the lower buried vias.

Meanwhile, the first planarization layer and the second planarization layer may be continuous. In some forms, the first planarization layer and the second planarization layer are continuous such that the first planarization layer covers an entire area of the first LED stack and the second planarization layer covers an entire area of the second LED stack.

In further another variant, the lower connectors may be located at substantially the same elevation. Accordingly, the upper buried vias may be easily formed.

Meanwhile, the lower buried vias and the upper buried vias may be surrounded by sidewall insulation layers in corresponding through holes, respectively. In some forms, the lower buried vias and the upper buried vias are surrounded by sidewall insulation layers arranged inside corresponding through holes, respectively. Furthermore, the sidewall insulation layers may be thinner as they are closer to bottoms of the through holes. In some forms, the sidewall insulation layers become thinner toward deeper ends of the corresponding through holes.

The light emitting device may further include a first transparent electrode in ohmic contact with a second conductivity type semiconductor layer of the first LED stack, a second transparent electrode in ohmic contact with the second conductivity type semiconductor layer of the second LED stack, and a third transparent electrode in ohmic contact with the second conductivity type semiconductor layer of the third LED stack, in which the second transparent electrode may have substantially the same shape as the first planarization layer. For example, a side surface of the second transparent electrode may be flush with a side surface of the first planarization layer.

In at least one variant, the light emitting device may further include upper connectors disposed on the first LED stack, in which the upper connectors may cover the upper buried vias and be electrically connected to the upper buried vias, respectively.

Further, the light emitting device may further include bump pads disposed on the upper connectors, respectively.

In another variant, the bump pads may include a first bump pad commonly electrically connected to the first, second, and third LED stacks, and second, third, and fourth bump pads electrically connected to the second conductivity type semiconductor layers of the first, second, and third LED stacks, respectively.

Meanwhile, the light emitting device may further include a first n-electrode pad disposed on a first conductivity type semiconductor layer of the first LED stack and an upper buried via passing through the second planarization layer and connected to the first n-electrode pad, in which one of the upper connectors may be electrically connected to the first n-electrode pad through the upper buried via.

In further another variant, the upper connectors may include a reflective metal layer reflecting light generated in the first LED stack, and the reflective metal layer may include, for example, Au or an Au alloy.

In another variant, wherein the upper buried vias and the lower buried vias extend in a first direction, the first planarization layer and the second planarization layer are arranged in a second direction perpendicular to the first direction, and with respect to the first direction, when viewed in a cross-section, a side surface of the second LED stack is flush with a side surface of the third LED stack, and a side surface of the first LED stack is stepped from the side surface of the second LED stack.

In another variant, a side surface of the second LED stack may be flush with a side surface of the third LED stack, and a side surface of the first LED stack may be stepped from the side surface of the second LED stack.

Additionally or alternatively, an insulation layer covering the side surface of the first LED stack may be thicker than an insulation layer covering the second LED stack and the third LED stack.

In further another variant, a display apparatus according to an exemplary embodiment includes a circuit board; and a plurality of light emitting devices arranged on the circuit board, in which each of the light emitting devices may be any one of the light emitting devices set forth above.

Hereinafter, exemplary embodiments of the inventive concepts will be described in detail with reference to the accompanying drawings.

FIG. 1 shows schematic perspective views illustrating display apparatuses according to exemplary embodiments.

A light emitting device according to the exemplary embodiment is not particularly limited, but, particularly, it may be used in a VR display apparatus such as a smart watch 1000a or a VR headset 1000b, or an AR display apparatus such as augmented reality glasses 1000c. For instance, the light emitting device may be used or included as a display for the VR display apparatus and the AR display apparatus.

Figure 2:
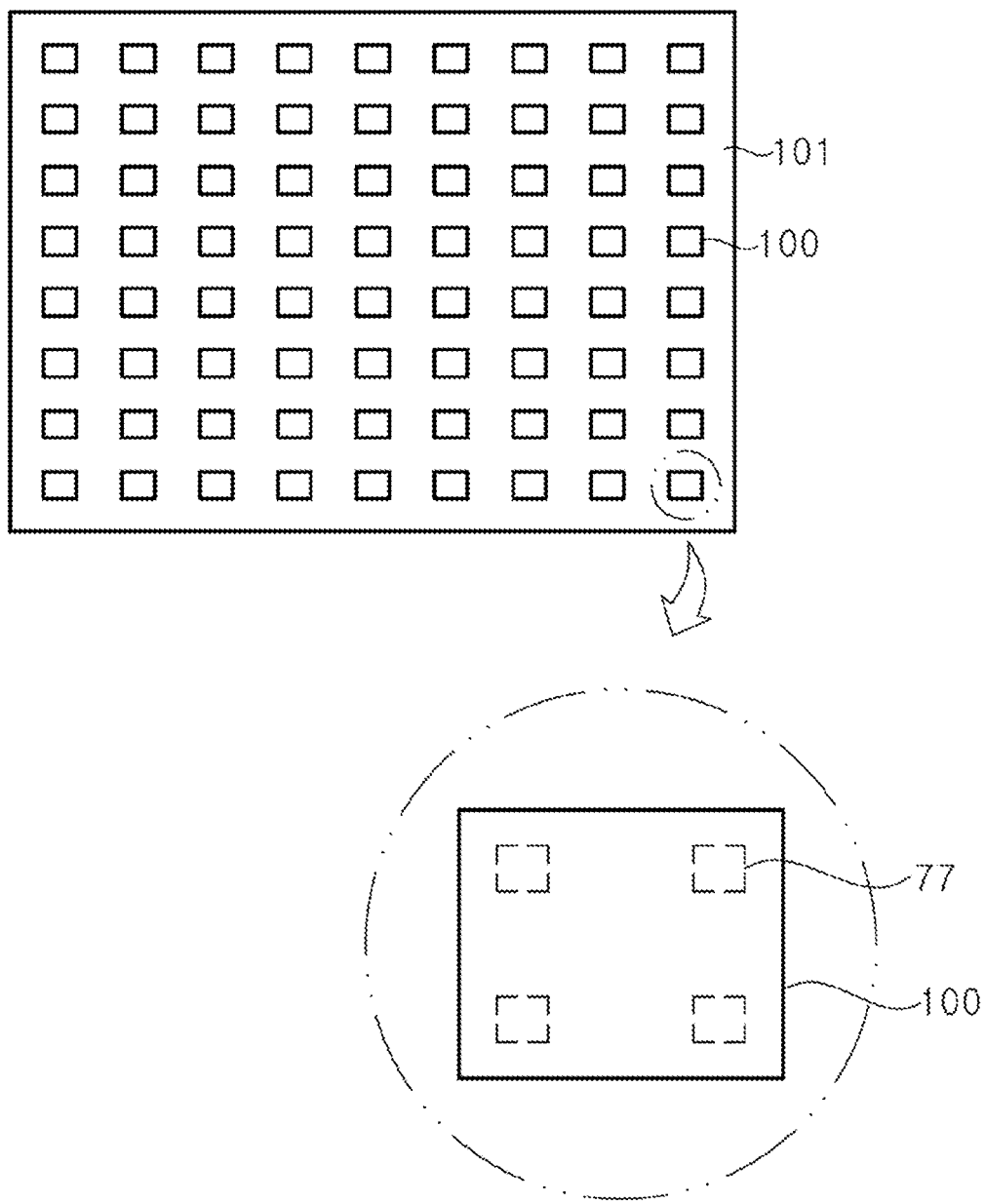
FIG. 2 is a schematic plan view illustrating a display panel according to an exemplary embodiment.

A display panel for implementing an image is mounted in the display apparatus. FIG. 2 is a schematic plan view illustrating the display panel according to an exemplary embodiment. Referring to FIG. 2, the display panel includes a circuit board 101 and light emitting devices 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

A plurality of light emitting devices 100 is arranged on the circuit board 101. Each of the light emitting devices 100 constitutes one pixel. The light emitting device 100 includes bump pads 77, and the bump pads 77 are electrically connected to the circuit board 101. For example, the bump pads 77 may be bonded to pads exposed on the circuit board 101.

In some forms, an interval between the light emitting devices 100 may be greater than at least a width of the light emitting device 100.

Figure 3:
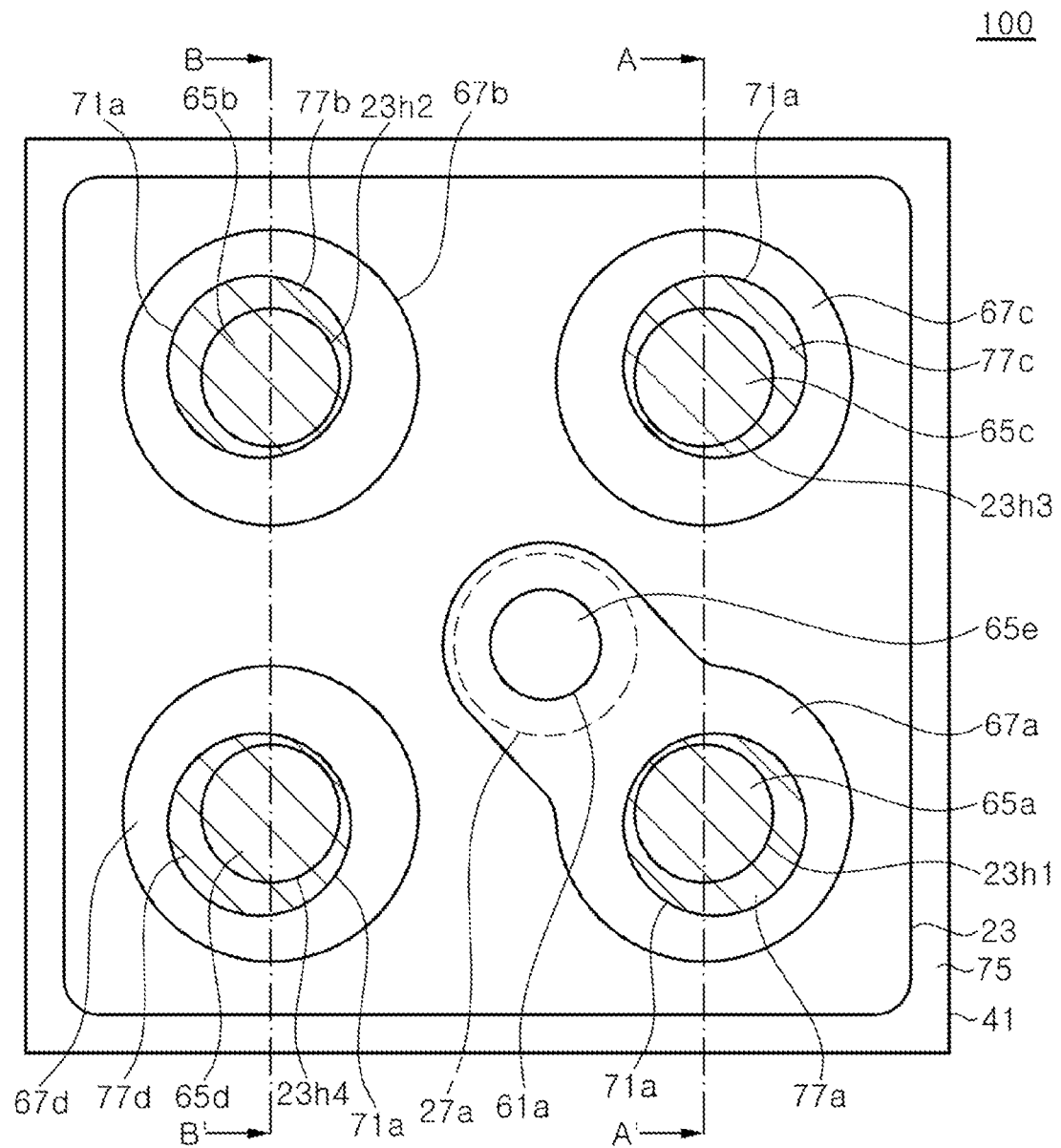
FIG. 3 is a schematic plan view illustrating a light emitting device according to an exemplary embodiment.

A configuration of the light emitting device 100 according to an exemplary embodiment will be described with reference to FIGS. 3, 4A, and 4B. FIG. 3 is a schematic plan view illustrating the light emitting device 100 according to an exemplary embodiment, and FIGS. 4A and 4B are schematic cross-sectional views taken along lines A-A' and B-B' of FIG. 3, respectively, to illustrate the light emitting device 100 according to an exemplary embodiment.

Hereinafter, although bump pads 77a, 77b, 77c, and 77d are illustrated and described as being disposed at an upper side in the drawings by way of example, the inventive concepts are not limited thereto. For example, in some exemplary embodiments, the light emitting device 100 may be flip-bonded on the circuit board 101 shown in FIG. 2, and in this case, the bump pads 77a, 77b, 77c, and 77d may be disposed at a lower side of the light emitting device 100. Additionally or alternatively, the bump pads 77a, 77b, 77c, and 77d may be omitted. In addition, although a substrate 41 is illustrated together, the substrate 41 may be omitted.

Figure 4A:
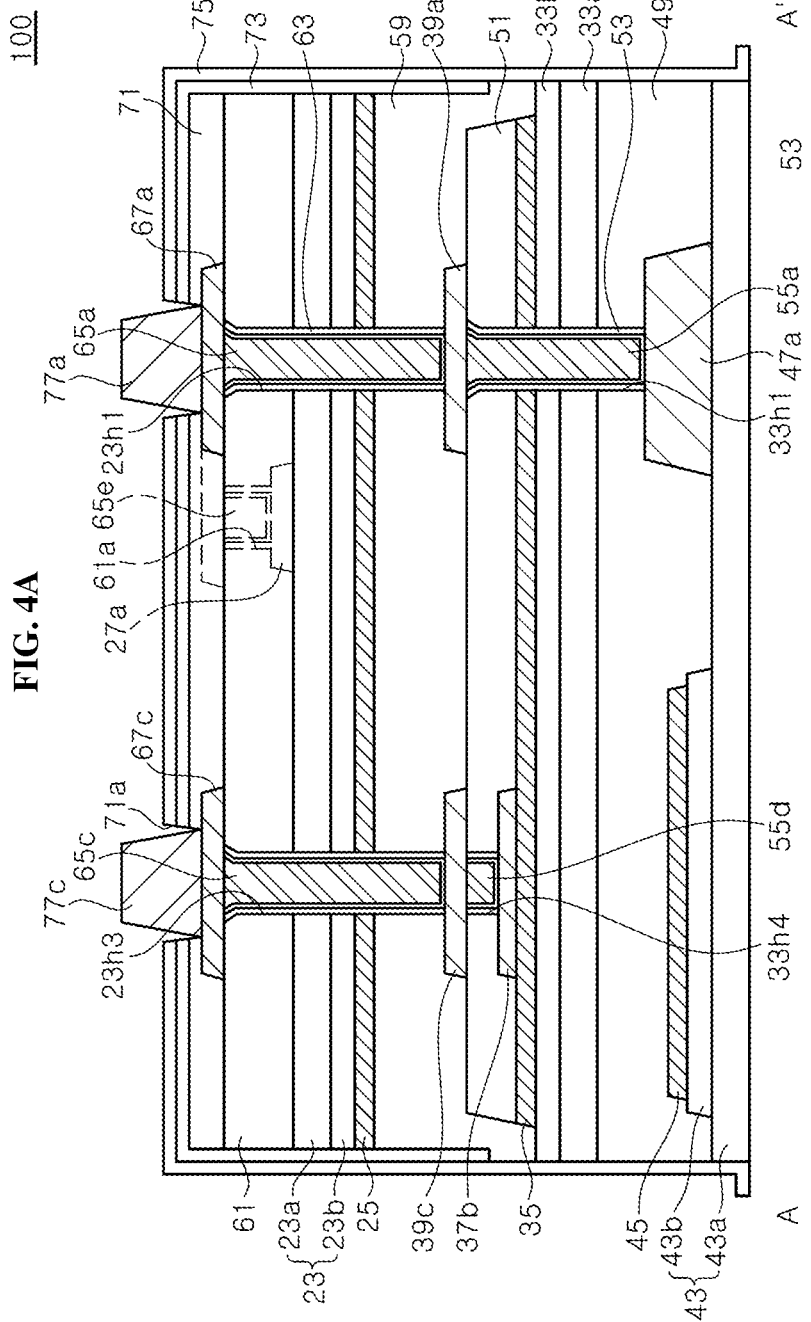
FIG. 4A is a schematic cross-sectional view taken along lines A-A' of FIG. 3.
Figure 4B:
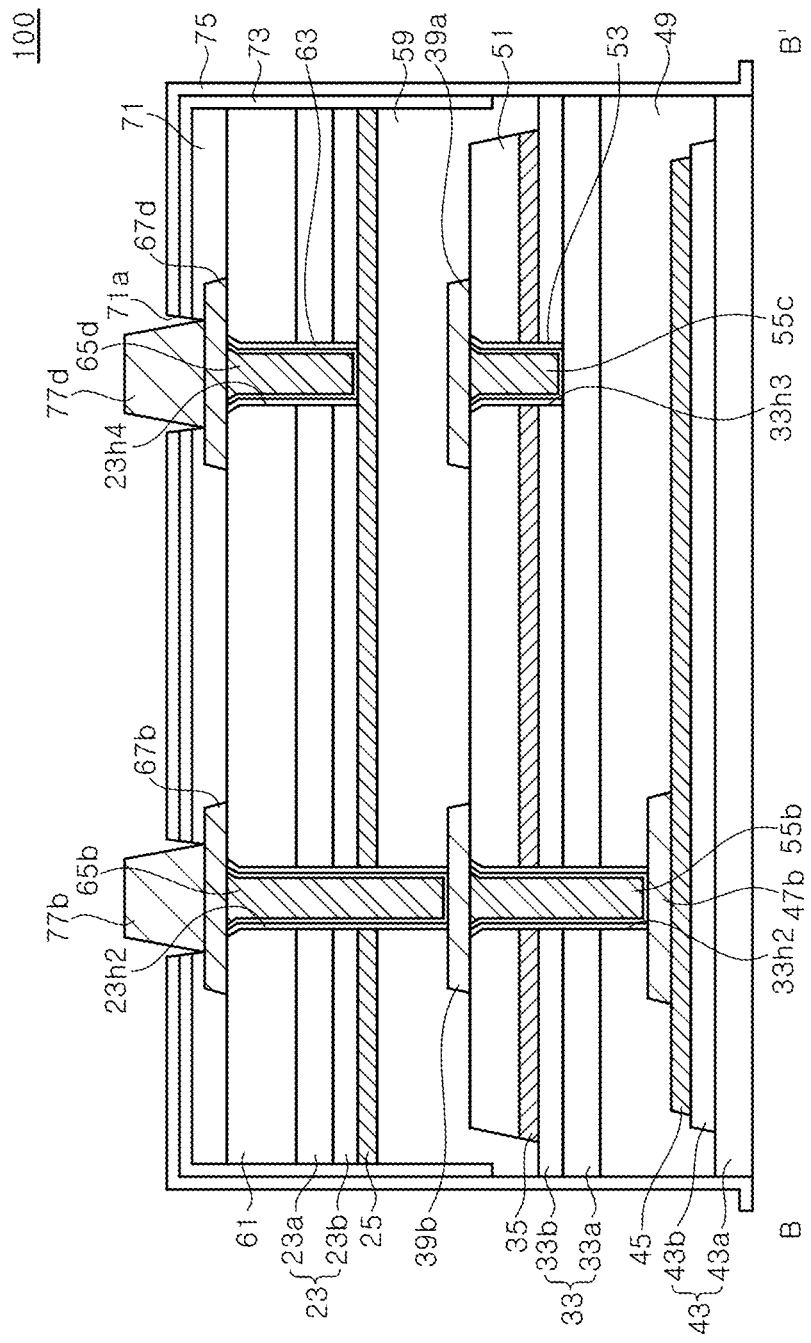
FIG. 4B is a schematic cross-sectional view taken along line B-B' of FIG. 3.

Referring to FIGS. 3, 4A, and 4B, the light emitting device 100 may include a first LED stack 23, a second LED stack 33, a third LED stack 43, and a first transparent electrode 25, a second transparent electrode 35, a third transparent electrode 45, a first n-electrode pad 27a, a second p-electrode pad 37b, a third n-electrode pad 47a, a third p-electrode pad 47b, first, second, and third lower connectors 39a, 39b, and 39c, lower buried vias 55a, 55b, 55c, and 55d, upper buried vias 65a, 65b, 65c, 65d, and 65e, a first sidewall insulation layer 53, first, second, third, and fourth upper connectors 67a, 67b, 67c, and 67d, a first bonding layer 49, a second bonding layer 59, a first upper insulation layer 71, a second upper insulation layer 73, a third upper insulation layer 75, a first planarization layer 51, a second planarization layer 61, and bump pads 77a, 77b, 77c, and 77d. Furthermore, the light emitting device 100 may include through holes 23h1, 23h2, 23h3, and 23h4 passing through the first LED stack 23, through holes 33h1 and 33h2 passing through the second LED stack 33, and a through hole 33h3 partially passing through the second LED stack 33.

As shown in FIGS. 4A and 4B, the first, second, and third LED stacks 23, 33, and 43 according to an exemplary embodiment are stacked in the vertical direction. In some forms, the first, second, and third LED stacks 23, 33, and 43 may be grown on different growth substrates from each other, and according to the illustrated exemplary embodiment, each of the growth substrates may be removed from the final light emitting device 100. As such, the light emitting device 100 does not include the growth substrates of the first, second, and third LED stacks 23, 33, and 43. However, the inventive concepts are not limited thereto, and in other forms, at least one of the growth substrates may be included in the light emitting device 100.

Each of the first LED stack 23, the second LED stack 33 and the third LED stack 43 includes a first conductivity type semiconductor layer 23a, 33a, or 43a, a second conductivity type semiconductor layer 23b, 33b, or 43b, and an active layer (not shown in the drawing) interposed therebetween. In particular, the active layer may have a multiple quantum well structure.

The second LED stack 33 is disposed under the first LED stack 23, and the third LED stack 43 is disposed under the second LED stack 33. Light generated in the first, second, and third LED stacks 23, 33, and 43 may be emitted to the outside of the light emitting device 100 through the third LED stack 43.

In an exemplary embodiment, the first LED stack 23 may emit light having a longer wavelength than those emitted from the second and third LED stacks 33 and 43, and the second LED stack 33 may emit light having a longer wavelength than that emitted from the third LED stack 43. For example, the first LED stack 23 may be an inorganic light emitting diode emitting red light, the second LED stack 33 may be an inorganic light emitting diode emitting green light, and the third LED stack 43 may be an inorganic light emitting diode emitting blue light.

In another exemplary embodiment, to adjust a color mixing ratio of light emitted from the first, second, and third LED stacks 23, 33, and 43, the second LED stack 33 may emit light having a shorter wavelength than that emitted from the third LED stack 43. As such, luminous intensity of light emitted from the second LED stack 33 may be reduced and luminous intensity of light emitted from the third LED stack 43 may be increased. As such, it is possible to dramatically change a luminous intensity ratio of light emitted from the first, second, and third LED stacks 23, 33, and 43. For example, the first LED stack 23 may be configured to emit red light, the second LED stack 33 may be configured to emit blue light, and the third LED stack 43 may be configured to emit green light.

Hereinafter, although the second LED stack 33 is exemplarily described as emitting light of a shorter wavelength than that emitted from the third LED stack 43, such as blue light, the inventive concepts are not limited thereto. In some exemplary embodiments, the second LED stack 33 may emit light of a longer wavelength than that emitted from of the third LED stack 43, such as green light.

In some forms, the first LED stack 23 may include an AlGaInP-based well layer, the second LED stack 33 may include an AlGaInN-based well layer, and the third LED stack 43 may include an AlGaInP or AlGaInN-based well layer.

As the first LED stack 23 emits light of a longer wavelength than that emitted from the second and third LED stacks 33 and 43, light generated in the first LED stack 23 may be emitted to the outside through the second and third LED stacks 33 and 43. In addition, since the second LED stack 33 emits light of a shorter wavelength than that emitted from the third LED stack 43, a portion of light generated in the second LED stack 33 may be absorbed by the third LED stack 43 and lost, and thus, luminous intensity of light generated in the second LED stack 33 may be reduced. Meanwhile, as light generated in the third LED stack 43 is emitted to the outside without passing through the first and second LED stacks 23 and 33, luminous intensity thereof may be increased.

Meanwhile, the first conductivity type semiconductor layer 23a, 33a or 43a of each of the LED stacks 23, 33, and 43 is an n-type semiconductor layer, and the second conductivity type semiconductor layer 23b, 33b or 43b thereof is a p-type semiconductor layer. In addition, in the exemplary embodiment, an upper surface of the first LED stack 23 is an n-type semiconductor layer 23b, an upper surface of the second LED stack 33 is a p-type semiconductor layer 33b, and an upper surface of the third LED stack 43 is a p-type semiconductor layer 43b. That is, a stack sequence in the first LED stack 23 is reversed from those in the second LED stack 33 and the third LED stack 43, as shown in FIGS. 4A and 4B. The semiconductor layers of the second LED stack 33 are stacked in the same order as the semiconductor layers of the third LED stack 43, and thus, process stability may be ensured. This will be described in detail later with reference to a manufacturing method.

As illustrated in FIGS. 3 and 4B, the second LED stack 33 may not include a mesa etching region. The first lower connector 39a may be electrically connected to the first conductivity type semiconductor layer 33a through the through hole 33h3. However, the inventive concepts are not limited thereto, and the second LED stack 33 may include a mesa etching region such that the second conductivity type semiconductor layer 33b is removed to expose an upper surface of the first conductivity type semiconductor layer 33a. An electrode pad may be disposed on the first conductivity type semiconductor layer 33a exposed to the mesa etching region. The third LED stack 43 may include a mesa etching region exposing an upper surface of the first conductivity type semiconductor layer 43a by removing the second conductivity type semiconductor layer 43b, and the third n-electrode pad 47a may be disposed on the exposed first conductivity type semiconductor layer 43a. However, the first LED stack 23 may not include a mesa etching region.

Meanwhile, the third LED stack 43 may have a flat lower surface, but the inventive concepts are not limited thereto. For example, the third LED stack 43 may include irregularities on a surface of the first conductivity type semiconductor layer 43a, and light extraction efficiency may be improved by the irregularities. Although the surface irregularities of the first conductivity type semiconductor layer 43a may be formed by separating a patterned sapphire substrate, it is not necessarily limited thereto, but it may be further formed by texturing it after the growth substrate is separated. The second LED stack 33 may also have the first conductivity type semiconductor layer 33a having a textured surface.

In the exemplary embodiment, the first LED stack 23, the second LED stack 33, and the third LED stack 43 may be overlapped with one another, and may have a light emitting area of substantially similar size. However, the light emitting areas of the first, second, and third LED stacks 23, 33, and 43 may be adjusted by the mesa etching region, the through holes 23h1, 23h2, 23h3, and 23h4, and the through holes 33h1, 33h2, and 33h3. For example, the light emitting areas of the first and third LED stacks 23 and 43 may be larger than that of the second LED stack 33, and thus, luminous intensity of light generated in the first LED stack 23 or the third LED stack 43 may be further increased compared to that of light generated in the second LED stack 33.

The first transparent electrode 25 may be disposed between the first LED stack 23 and the second LED stack 33. The first transparent electrode 25 is in ohmic contact with the second conductivity type semiconductor layer 23b of the first LED stack 23 and transmits light generated in the first LED stack 23. The first transparent electrode 25 may be formed using a metallic layer or a transparent oxide layer such as indium tin oxide (ITO). The first transparent electrode 25 may cover an entire surface of the second conductivity type semiconductor layer 23b of the first LED stack 23, and a side surface thereof may be disposed to be flush with a side surface of the first LED stack 23. That is, a side surface of the first transparent electrode 25 may not be covered with the second bonding layer 59. Furthermore, the through holes 23h1, 23h2, and 23h3 may pass through the first transparent electrode 25, and thus, the first transparent electrode 25 may be exposed to sidewalls of the through holes 23h1, 23h2, and 23h3. Meanwhile, the through hole 23h4 may expose an upper surface of the first transparent electrode 25. However, the inventive concepts are not limited thereto, and the first transparent electrode 25 may be partially removed along an edge of the first LED stack 23, so that the side surface of the first transparent electrode 25 may be covered with the second bonding layer 59. In addition, since the first transparent electrode 25 may be removed by patterning in advance in a region where the through holes 23h1, 23h2, and 23h3 are formed, the first transparent electrode 25 may be prevented from being exposed to sidewalls of the through holes 23h1, 23h2, and 23h3.

Meanwhile, the second transparent electrode 35 is in ohmic contact with the second conductivity type semiconductor layer 33b of the second LED stack 33. As shown in the drawing, the second transparent electrode 35 contacts the upper surface of the second LED stack 33 between the first LED stack 23 and the second LED stack 33. The second transparent electrode 35 may be formed of a metallic layer or a conductive oxide layer that is transparent to red light. The conductive oxide layer may include $SnO_2$, $InO_2$, ITO, ZnO, IZO, or the like. In particular, the second transparent electrode 35 may be formed of ZnO which may be formed as a single crystal on the second LED stack 33, and thus, the ZnO has favorable electrical and optical characteristics as compared with the metallic layer or other conductive oxide layers. Moreover, since ZnO has a strong adhesion to the second LED stack 33, reliability of the light emitting device may be improved.

Meanwhile, the second transparent electrode 35 may be partially removed along an edge of the second LED stack 33, and accordingly, an outer side surface of the second transparent electrode 35 may not be exposed to the outside, but covered with the second bonding layer 59, for example. That is, the side surface of the second transparent electrode 35 may be recessed inwardly than that of the second LED stack 33, and a region where the second transparent electrode 35 is recessed may be filled with the second bonding layer 59, as shown in FIGS. 4A and 4B. As recessed inwardly, the side surfaces of the second transparent electrode 35 may be prevented from being potentially damaged during subsequent processes. Furthermore, during a subsequent isolation process, a periphery of the second transparent electrode 35 may be subject to drying etching and particles of the second transparent electrode may remain. These remaining particles may affect electrical connection such as current leakage. The inwardly recessed structure of the second transparent electrode 35 may prevent, avoid and/or significantly mitigate potential damages during subsequent processes.

The third transparent electrode 45 is in ohmic contact with the second conductivity type semiconductor layer 43b of the third LED stack 43. The third transparent electrode 45 may be disposed between the second LED stack 33 and the third LED stack 43, and contacts the upper surface of the third LED stack 43. The third transparent electrode 45 may be formed of a metallic layer or a conductive oxide layer that is transparent to red light and blue light. For example, the conductive oxide layer may include $SnO_2$, $InO_2$, ITO, ZnO, IZO, or the like. In particular, the third transparent electrode 45 may be formed of ZnO, which may be formed as a single crystal on the third LED stack 43. In this manner, the ZnO may have favorable electrical and optical characteristics as compared with the metallic layer or other conductive oxide layers. In particular, since ZnO has a strong adhesion to the third LED stack 43, reliability of the light emitting device may be improved.

The third transparent electrode 45 may be partially removed along an edge of the third LED stack 43, and accordingly, an outer side surface of the third transparent electrode 45 may not be exposed to the outside, but covered with the first bonding layer 49, for example. That is, the side surface of the third transparent electrode 45 may be recessed inwardly than that of the third LED stack 43, and a region where the third transparent electrode 45 is recessed may be filled with the first bonding layer 49. Meanwhile, the third transparent electrode 45 may also be recessed near the mesa etching region of the third LED stack 43, and the recessed region may be filled with the first bonding layer 49.

The third transparent electrode 45 is recessed as described above, and thus, the side surfaces thereof may be prevented from being exposed to an etching gas, thereby improving the production yield of the light emitting device 100.

According to an exemplary embodiment, the second transparent electrode 35 and the third transparent electrode 45 may be formed of an identical kind of conductive oxide layer, for example, ZnO, and the first transparent electrode 25 may be formed of a different kind of conductive oxide layer from the second and third transparent electrodes 35 and 45, such as ITO. However, the inventive concepts are not limited thereto, and each of the first, second, and third transparent electrodes 25, 35, and 45 may be of the identical kind, or at least one may be of a different kind.

The first n-electrode pad 27a is in ohmic contact with the first conductivity type semiconductor layer 23a of the first LED stack 23. The first n-electrode pad 27a may include, for example, AuGe or AuTe.

The third n-electrode pad 47a is in ohmic contact with the first conductivity type semiconductor layer 43a of the third LED stack 43. The third n-electrode pad 47a may be disposed on the first conductivity type semiconductor layer 43a exposed through the second conductivity type semiconductor layer 43b, that is, in the mesa etching region. The third n-electrode pad 47a may be formed of, for example, Cr/Au/Ti. An upper surface of the third n-electrode pad 47a may be placed higher than that of the second conductivity type semiconductor layer 43b, and further, higher than that of the third transparent electrode 45, as shown in FIG. 4A. For example, a thickness of the third n-electrode pad 47a may be about 2 μm or more. The third n-electrode pad 47a may have a shape of a truncated cone, but the inventive concepts are not limited thereto. The third n-electrode pad 47a may have various shapes, such as a square pyramid, a cylindrical shape, or a square-cylinder shape.

The second p-electrode pad 37b is disposed on the second transparent electrode 35. The second p-electrode pad 37b may be connected to the second transparent electrode 35 and may be electrically connected to the second conductivity type semiconductor layer 33b through the second transparent electrode 35. The second p-electrode pad 37b may be formed of a metallic material.

The third p-electrode pad 47b may be formed with an identical material as the third n-electrode pad 47a. However, an upper surface of the third p-electrode pad 47b may be located at substantially the same elevation as the third n-electrode pad 47a, and, accordingly, a thickness of the third p-electrode pad 47b may be less than that of the third n-electrode pad 47a. More particularly, the thickness of the third p-electrode pad 47b may be approximately equal to a thickness of a portion of the third n-electrode pad 47a protruding above the second transparent electrode 45. For example, the thickness of the third p-electrode pad 47b may be about 1.2 μm or less. The upper surface of the third p-electrode pad 47b is located at substantially the same elevation as that of the third n-electrode pad 47a, and thus, the third p-electrode pad 47b and the third n-electrode pad 47a may be simultaneously exposed when the through holes 33h1 and 33h2 are formed. When the elevations of the third n-electrode pad 47a and the third p-electrode pad 47b are different, any one of the electrode pads may be damaged in the etching process. As such, the elevations of the third n-electrode pad 47a and the third p-electrode pad 47b are set to be approximately equal, and thus, it is possible to prevent any one of the electrode pads from being damaged during the etching process or the like.

The first bonding layer 49 couples the second LED stack 33 to the third LED stack 43. The first bonding layer 49 may couple them between the first conductivity type semiconductor layer 33a and the third transparent electrode 35. The first bonding layer 49 may contact the third transparent electrode 45, the third n-electrode pad 47a, and the third p-electrode pad 47b. The first bonding layer 49 may also partially contact the first conductivity type semiconductor layer 43a exposed in the mesa etching region.

The first bonding layer 49 may be formed of a transparent organic material layer, or may be formed of a transparent inorganic material layer. For example, the organic material layer may include SU8, poly methylmethacrylate (PMMA), polyimide, parylene, benzocyclobutene (BCB), or the like, and the inorganic material layer may include $Al_2O_3$, $SiO_2$, SiNx, or the like. In addition, the first bonding layer 49 may be formed of spin-on-glass (SOG).

The first planarization layer 51 may be disposed on the second LED stack 33. The first planarization layer 51 may be continuous. The first planarization layer 51 may be disposed in an upper region of the second conductivity type semiconductor layer 33b, and recessed inwardly from the edge of the second LED stack 33. For example, a side surface of the first planarization layer 51 may be flush with that of the second transparent electrode 35. The first planarization layer 51 may be patterned by photolithography and etching processes, and in this case, the second transparent electrode 35 may also be patterned. As such, the second conductivity type semiconductor layer 33b may be exposed around the first planarization layer 51.

The through holes 33h1 and 33h2 may pass through the first planarization layer 51, the second transparent electrode 35, the second LED stack 33, and the first bonding layer 49 to expose the third n-electrode pad 47a and the third p-electrode pad 47b. The through hole 33h3 may pass through the first planarization layer 51, the second transparent electrode 35, and the second conductivity type semiconductor layer 33b to expose the first conductivity type semiconductor layer 33a. Meanwhile, the through hole 33h4 may pass through the first planarization layer 51 to expose the second p-electrode pad 37b.

The first sidewall insulation layer 53 covers sidewalls of the through holes 33h1, 33h2, 33h3, and 33h4, and has openings exposing bottoms of the through holes. The first sidewall insulation layer 53 may be formed using, for example, a chemical vapor deposition technique or an atomic layer deposition technique, and may be formed of, for example, $Al_2O_3$, $SiO_2$, $Si_3N_4$, or the like.

The lower buried vias 55a, 55b, 55c, and 55d may fill the through holes 33h1, 33h2, 33h3, and 33h4, respectively. The lower buried vias 55a, 55b, and 55c may be insulated from the second transparent electrode 35 and the second LED stack 33 by the first sidewall insulation layer 53. The lower buried via 55a may be electrically connected to the third n-electrode pad 47a, and the lower buried via 55b may be electrically connected to the third p-electrode pad 47b. In addition, the lower buried via 55c may be electrically connected to the first conductivity type semiconductor layer 33a of the second LED stack 33, and the lower buried via 55d may be electrically connected to the second p-electrode pad 37b.

The lower buried vias 55a, 55b, 55c, and 55d may be formed using a chemical mechanical polishing technique. For example, after a seed layer is formed and the through holes 33h1, 33h2, 33h3, and 33h4 are filled with a conductive material such as Cu using a plating technique, the lower buried vias 55a, 55b, 55c, and 55d may be formed by removing metallic layers on the first planarization layer 51 using the chemical mechanical polishing technique. As shown in FIGS. 4A and 4B, the lower buried vias 55a, 55b, and 55c may have a relatively wider width at inlets of the through holes 33h1, 33h2, and 33h3 than at bottom surfaces thereof, and thus, the electrical connection may be strengthened. Meanwhile, the lower buried via 55d may have a column shape with upper and bottom surfaces having substantially the same size.

The lower buried vias 55a, 55b, 55c, and 55d may be formed together through an identical process. Accordingly, the lower buried vias 55a, 55b, 55c, and 55d may have an upper surface substantially flush with the first planarization layer 51. A detailed process of forming the lower buried vias will be described in more detail later. However, the inventive concepts are not limited to the illustrated exemplary embodiment, and may be formed through different processes from one another.

The lower connectors 39a, 39b, and 39c may be disposed on respective regions of the first planarization layer 51. The first lower connector 39a may be electrically connected to the lower buried via 55a, and may extend in the lateral direction to be electrically connected to the lower buried via 55c. Accordingly, the first conductivity type semiconductor layer 43a of the third LED stack 43 and the first conductivity type semiconductor layer 33a of the second LED stack 33 may be commonly electrically connected. The first lower connector 39a may cover the lower buried vias 55a and 55c (see FIG. 9A).

The second lower connector 39b is electrically connected to the lower buried via 55b. The second lower connector 39b may cover the lower buried via 55b. The third lower connector 39c is electrically connected to the lower buried via 55d. The third lower connector 39c may cover the lower buried via 55d.

In the illustrated exemplary embodiment, all of the first, second, and third lower connectors 39a, 39b, and 39c are disposed on the first planarization layer 51. The first, second, and third lower connectors 39a, 39b, and 39c may be formed together through an identical process, and thus, elevations of the upper surfaces thereof may be identical to one another.

The second bonding layer 59 couples the first LED stack 23 to the second LED stack 33. As shown in FIGS. 4A and 4B, the second bonding layer 59 may be disposed between the first transparent electrode 25 and the first planarization layer 51. The second bonding layer 59 may also cover the first, second, and third lower connectors 39a, 39b, and 39c. Moreover, the second bonding layer 59 may cover the side surface of the first planarization layer 51 and the side surface of the second transparent electrode 35, and may contact the second conductivity type semiconductor layer 33b. The second bonding layer 59 may be formed of an identical material as the material for the first bonding layer 49 described above, and a detailed description thereof will be omitted to avoid redundancy.

The second planarization layer 61 covers the first LED stack 23. The second planarization layer 61 may have a flat upper surface as that of the first planarization layer 51. The second planarization layer 61 may be formed of an aluminum oxide layer, a silicon oxide layer, or a silicon nitride layer. The second planarization layer 61 may be formed as a single layer or multiple layers. Furthermore, the second planarization layer 61 may be formed of a distributed Bragg reflector. The second planarization layer 61 may have an opening 61a exposing the first n-electrode pad 27a.

Meanwhile, the through holes 23h1, 23h2, 23h3, and 23h4 pass through the second planarization layer 61 and the first LED stack 23. Further, the through holes 23h1, 23h2, and 23h3 may pass through the first transparent electrode 25 and the second bonding layer 59 to expose the lower connectors 39a, 39b, and 39c, and the through hole 23h4 may expose the first transparent electrode 25. For example, the through hole 23h1 is formed to provide a passage for allowing electrical connection to the lower buried via 55a, the through hole 23h2 is formed to provide a passage for allowing electrical connection to the lower buried via 55b, and the through hole 23h3 is formed to provide a passage for allowing electrical connection to the lower buried via 55d.

The through hole 23h4 is formed to provide a passage for allowing electrical connection to the first transparent electrode 25. The through hole 23h4 does not pass through the first transparent electrode 25. However, the inventive concepts are not limited thereto, and the through hole 23*h*4 may pass through the first transparent electrode 25 as long as it provides the passage for electrical connection to the first transparent electrode 25, A second sidewall insulation layer 63 covers sidewalls of the through holes 23*h*1, 23*h*2, 23*h*3, and 23*h*4, and has openings exposing bottoms of the through holes. The second sidewall insulation layer 63 may also cover a sidewall of the opening 61*a*, and may have an opening exposing the first n-electrode pad 27*a*. The second sidewall insulation layer 63 may be formed using, for example, a chemical vapor deposition technique or an atomic layer deposition technique, and may be formed of, for example, $Al_2O_3$, $SiO_2$, $SiN_4$, or the like.

The upper buried vias 65*a*, 65*b*, 65*c*, and 65*d* may fill the through holes 23*h*1, 23*h*2, 23*h*3, and 23*h*4, respectively, and the upper buried via 65*e* may fill the opening 61*a*. The upper buried vias 65*a*, 65*b*, 65*c*, and 65*d* are electrically insulated from the first LED stack 23 by the second sidewall insulation layer 63.

The upper buried via 65*a* may be electrically connected to the lower buried via 55*a* through the first lower connector 39*a*, and the upper buried via 65*b* may be electrically connected to the lower buried via 55*b* through the second lower connector 39*b*, and the upper buried via 65*c* may be electrically connected to the lower buried via 55*d* through the third lower connector 39*c*. The upper buried via 65*d* may also be electrically connected to the first transparent electrode 25. The upper buried vias 65*a* and 65*b* may be disposed to be overlapped with the lower buried vias 55*a* and 55*b*, respectively. In addition, the upper buried via 65*c* may be disposed to be overlapped with the lower buried via 55*d*. Meanwhile, the upper buried via 65*d* is spaced apart from the lower buried via 55*c*. The upper buried via 65*d* may be disposed over the lower buried vias 55*c* to be overlapped with the lower buried vias 55*c*, but the exemplary embodiment is not limited thereto.

The upper buried vias 65*a*, 65*b*, 65*c*, 65*d*, and 65*e* may be formed using a chemical mechanical polishing technique. For example, after a seed layer is formed and the through holes 23*h*1, 23*h*2, 23*h*3, and 23*h*4 and the openings 61*a* are filled using a plating technique, the upper buried vias 65*a*, 65*b*, 65*c*, 65*d*, and 65*e* may be formed by removing metallic layers on the second planarization layer 61 using the chemical mechanical polishing technique. Furthermore, a metal barrier layer may be formed before the seed layer is formed.

The upper buried vias 65*a*, 65*b*, 65*c*, 65*d*, and 65*e* may be formed together through an identical process and may be substantially flush with the second planarization layer 61. However, the present disclosure is not limited to the illustrated exemplary embodiment, and they may be formed through different processes from one another.

The first upper connector 67*a*, the second upper connector 67*b*, the third upper connector 67*c*, and the fourth upper connector 67*d* are disposed on the second planarization layer 61. The first upper connector 67*a* may be electrically connected to the upper buried via 65*a* and the upper buried via 65*e*, the second upper connector 67*b* may be electrically connected to the upper buried via 65*b*, the third upper connector 67*c* may be electrically connected to the upper buried via 65*c*, and the fourth upper connector 67*d* may be electrically connected to the upper buried via 65*d*. As illustrated, the first, second, third, and fourth upper connectors 67*a*, 67*b*, 67*c*, and 67*d* may cover the upper buried vias 65*a*, 65*b*, 65*c*, and 65*d*, respectively. Further, the first upper connector 67*a* may cover the upper buried via 65*e* filling the opening 61*a* (FIG. 3) of the second planarization layer 61.

As such, the first conductivity type semiconductor layers 23*a*, 33*a*, and 43*a* of the first, second, and third LED stacks 23, 33, and 43 are commonly electrically connected to one another.

The first upper connector 67*a*, the second upper connector 67*b*, the third upper connector 67*c*, and the fourth upper connector 67*d* may be formed of an identical material in an identical process, for example, Ni/Au/Ti.

The first upper insulation layer 71 may cover the second planarization layer 61, and may cover the first, second, third, and fourth upper connectors 67*a*, 67*b*, 67*c*, and 67*d*. The first upper insulation layer 71 may be formed of a silicon oxide layer or a silicon nitride layer.

The second upper insulation layer 73 may be disposed on the first upper insulation layer 71, and furthermore, may cover side surfaces of the first upper insulation layer 71, the second planarizing layer 61, and the first LED stack 23. As illustrated in FIGS. 4A and 4B, the second upper insulation layer 73 may cover the side surface of the first transparent electrode 25, and further, may partially cover a side surface of the second bonding layer 59.

The second upper insulation layer 73 may be formed of an insulation layer such as a silicon oxide layer, a silicon nitride layer, an aluminum oxide layer, or the like. Although the second upper insulation layer 73 is illustrated as covering an upper surface of the first upper insulation layer 71, the second upper insulation layer 73 on the first upper insulation layer 71 may be removed.

The third upper insulation layer 75 may cover the side surface of the light emitting device 100 as shown in FIGS. 4A and 4B. Accordingly, the side surfaces of the first LED stack 23 may be double covered by the second and third upper insulation layers 73 and 75, and the side surfaces of the second LED stack 33 and the third LED stack 43 may be covered with the third upper insulation layer 75. In another exemplary embodiment, the third insulation layer 75 may be omitted.

The first, second, and third upper insulation layers 71, 73, and 75 may have openings 71*a* (FIG. 3) exposing the first, second, third, and fourth upper connectors 67*a*, 67*b*, 67*c*, and 67*d*. The openings 71*a* may be generally disposed on flat surfaces of the first upper connector 67*a*, the second upper connector 67*b*, the third upper connector 67*c*, and the fourth upper connector 67*d*.

The bump pads 77*a*, 77*b*, 77*c*, and 77*d* may be disposed on the first upper connector 67*a*, the second upper connector 67*b*, the third upper connector 67*c*, and the fourth upper connector 67*d* in the openings 71*a*, respectively, and electrically connected to them.

The first bump pad 77*a* is electrically connected to the upper buried vias 65*a* and the first n-electrode pad 27*a* through the first upper connector 67*a*, and thus, commonly electrically connected to the first conductivity type semiconductor layers 23*a*, 33*a*, and 43*a* of the first, second, and third LED stacks 23, 33, and 43.

The second bump pad 77*b* may be electrically connected to the second conductivity type semiconductor layer 43*b* of the third LED stack 43 through the second upper connector 67*b*, the upper buried via 65*b*, the second lower connector 39*b*, the lower buried via 55*b*, the third p-electrode pad 47*b*, and the third transparent electrode 45.

The third bump pad 77*c* may be electrically connected to the second conductivity type semiconductor layer 33*b* of the second LED stack 33 through the third upper connector 67*c*, the upper buried via 65*c*, the third lower connector 39*c*, the lower buried via 55*d*, the second p-electrode pad 37*b*, and the second transparent electrode 35.

The fourth bump pad 77d may be electrically connected to the second conductivity type semiconductor layer 23b of the first LED stack 23 through the fourth upper connector 67d, the upper buried via 65d, and the first transparent electrode 25.

That is, the second, third, and fourth bump pads 77b, 77c, and 77d are electrically connected to the second conductivity type semiconductor layers 23b, 33b, and 43b of the first, second, and third LED stacks 23, 33, and 43, respectively, and the first bump pad 77a is commonly electrically connected to the first conductivity type semiconductor layers 23a, 33a, and 43a of the first, second, and third LED stacks 23, 33, and 43.

The bump pads 77a, 77b, 77c, and 77d may cover the openings 71a of the first, second, and third upper insulation layers 71, 73, and 75. In an exemplary embodiment, the bump pads 77a, 77b, 77c, and 77d may have a width smaller than or equal to a width of the opening 71a. In another exemplary embodiment, portions of the bump pads 77a, 77b, 77c, and 77d may be disposed on the third upper insulation layer 75.

As shown in FIG. 3, the centers of the bump pads 77a, 77b, 77c, and 77d may be disposed outside the centers of the upper buried vias 65a, 65b, 65c, and 65d, respectively. In addition, the centers of the bump pads 77a, 77b, 77c, and 77d may be disposed outside the centers of the first to fourth upper connectors 67a, 67b, 67c, and 67d, respectively. The centers of the bump pads 77a, 77b, 77c, and 77d may be shifted from the centers of the upper buried vias 65a, 65b, 65c, and 65d or the centers of the first to fourth upper connectors 67a, 67b, 67c, and 67d outwardly in the diagonal direction of the light, respectively.

The bump pads 77a, 77b, 77c, and 77d may be formed of Au or Au/In, and Au may be formed to have a thickness of about 3 μm, and In may be formed to have a thickness of about 1 μm, for example. The light emitting device 100 may be bonded onto pads on the circuit board 101 using Au or In. In the illustrated exemplary embodiment, bonding of the bump pads using Au or In is described, but the inventive concepts are not limited thereto, and may be bonded using Pb or AuSn.

According to the illustrated exemplary embodiment, the first LED stack 23 is electrically connected to the bump pads 77a and 77d, the second LED stack 33 is electrically connected to the bump pads 77a and 77c, and the third LED stack 43 is electrically connected to the bump pads 77a and 77b. Accordingly, cathodes of the first LED stack 23, the second LED stack 33, and the third LED stack 43 are commonly electrically connected to the first bump pad 77a, and anodes thereof are electrically connected to the bump pads 77b, 77c, and 77d, respectively. As such, the first, second, and third LED stacks 23, 33, and 43 may be independently driven.

In the illustrated exemplary embodiment, it has been exemplarily described that the bump pads 77a, 77b, 77c, and 77d are formed, but the bump pads may be omitted. In particular, when bonding to a circuit board using an anisotropic conductive film or anisotropic conductive paste, the bump pads may be omitted, and the upper connectors 67a, 67b, 67c, and 67d may be directly bonded. Accordingly, it is possible to increase a bonding area.

Figure 5A:
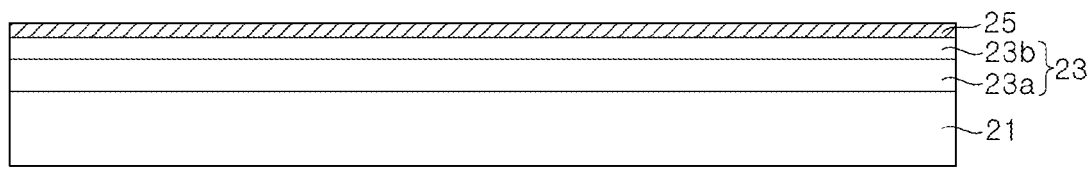
FIG. 5A is a schematic cross-sectional view illustrating a first LED stack grown on a growth substrate according to an exemplary embodiment.
Figure 5B:
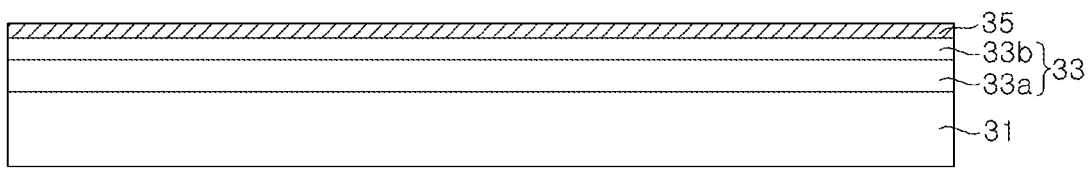
FIG. 5B is a schematic cross-sectional view illustrating second LED stack grown on a growth substrate according to an exemplary embodiment.
Figure 5C:
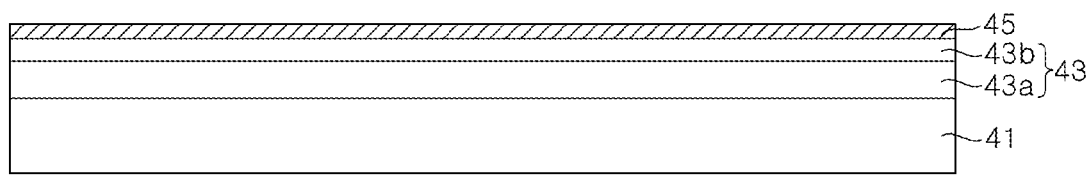
FIG. 5C is a schematic cross-sectional view illustrating third LED stack grown on a growth substrate according to an exemplary embodiment.

Hereinafter, a method of manufacturing the light emitting device 100 will be described in detail. A structure of the light emitting device 100 will also be understood in more detail through the manufacturing method described below. FIGS. 5A, 5B, and 5C are schematic cross-sectional views illustrating the first, second, and third LED stacks grown on growth substrates, respectively, according to an exemplary embodiment.

First, referring to FIG. 5A, a first LED stack 23 including a first conductivity type semiconductor layer 23a and a second conductivity type semiconductor layer 23b is grown on a first substrate 21. An active layer (not shown in the drawing) may be interposed between the first conductivity type semiconductor layer 23a and the second conductivity type semiconductor layer 23b.

The first substrate 21 may be a substrate capable of growing the first LED stack 23 thereon, such as a GaAs substrate. The first conductivity type semiconductor layer 23a and the second conductivity type semiconductor layer 23b may be formed of an AlGaInAs-based or AlGaInP-based semiconductor layer, and the active layer may include, for example, an AlGaInP-based well layer. A composition ratio of AlGaInP may be determined so that the first LED stack 23 emits red light, for example.

A first transparent electrode 25 may be formed on the second conductivity type semiconductor layer 23b. As described above, the first transparent electrode 25 may be formed of a metal layer or a conductive oxide layer that transmits light generated by the first LED stack 23, for example, red light. The first transparent electrode 25 may be formed of, for example, indium-tin oxide (ITO).

Referring to FIG. 5B, a second LED stack 33 including a first conductivity type semiconductor layer 33a and a second conductivity type semiconductor layer 33b is grown on a second substrate 31. An active layer (not shown in the drawing) may be interposed between the first conductivity type semiconductor layer 33a and the second conductivity type semiconductor layer 33b.

The second substrate 31 may be a substrate capable of growing the second LED stack 33 thereon, such as a sapphire substrate, a SiC substrate, or a GaN substrate. In an exemplary embodiment, the second substrate 31 may be a flat sapphire substrate, but it may be a patterned sapphire substrate. The first conductivity type semiconductor layer 33a and the second conductivity type semiconductor layer 33b may be formed of an AlGaInN-based semiconductor layer, and the active layer may include, for example, an AlGaInN-based well layer. A composition ratio of AlGaInN may be determined so that the second LED stack 33 emits blue light, for example.

A second transparent electrode 35 may be formed on the second conductivity type semiconductor layer 33b. As described above, the second transparent electrode 35 may be formed of a metal layer or a conductive oxide layer that transmits light generated by the first LED stack 23, for example, red light. In particular, the second transparent electrode 35 may be formed of ZnO.

Referring to FIG. 5C, a third LED stack 43 including a first conductivity type semiconductor layer 43a and a second conductivity type semiconductor layer 43b is grown on a third substrate 41. An active layer (not shown in the drawing) may be interposed between the first conductivity type semiconductor layer 43a and the second conductivity type semiconductor layer 43b.

The third substrate 41 may be a substrate capable of growing the third LED stack 43 thereon, such as a sapphire substrate, a GaN substrate, or a GaAs substrate. The first conductivity type semiconductor layer 43a and the second conductivity type semiconductor layer 43b may be formed of an AlGaInAs-based or AlGaInP-based semiconductor layer, or an AlGaInN-based semiconductor layer, and the active layer may include, for example, an AlGaInP-based well layer or AlGaInN-based well layer. A composition ratio of AlGaInP or AlGaInN may be determined so that the third LED stack 43 emits green light, for example.

A third transparent electrode 45 may be formed on the second conductivity type semiconductor layer 43b. As described above, the third transparent electrode 45 may be formed of a metal layer or a conductive oxide layer that transmits light generated in the first and second LED stacks 23 and 33, for example, red light and blue light. In particular, the third transparent electrode 45 may be formed of ZnO.

The first, second, and third LED stacks 23, 33, and 43 are grown on the different growth substrates 21, 31, and 41, respectively, and, accordingly, the order of the manufacturing process is not particularly limited.

Hereinafter, a method of manufacturing the light emitting device 100 using first, second, and third LED stacks 23, 33, and 43 grown on growth substrates 21, 31, and 41 will be described. Hereinafter, although a region of a single light emitting device 100 will be mainly illustrated and described, a plurality of light emitting devices 100 may be manufactured in a batch in the same manufacturing process using the LED stacks 23, 33, and 43 grown on the growth substrates 21, 31, and 41.

FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, and 15C are schematic plan views and cross-sectional views illustrating a method of manufacturing a light emitting device for a display according to an exemplary embodiment. Herein, the cross-sectional views correspond to lines A-A' or B-B' of FIG. 3.

Figure 6A:
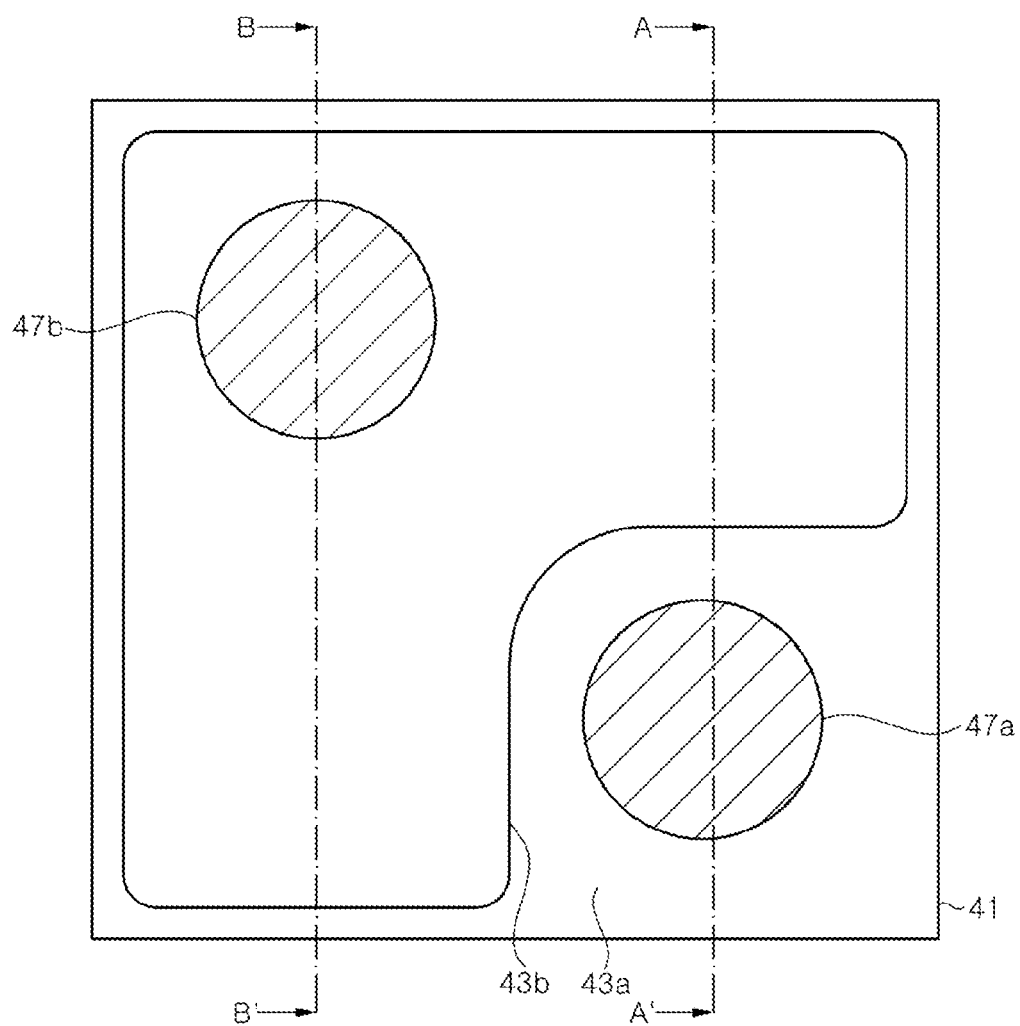
FIGS. 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, and 15C are schematic plan views and cross-sectional views illustrating a method of manufacturing a light emitting device for a display according to an exemplary embodiment, where.
Figure 6B:
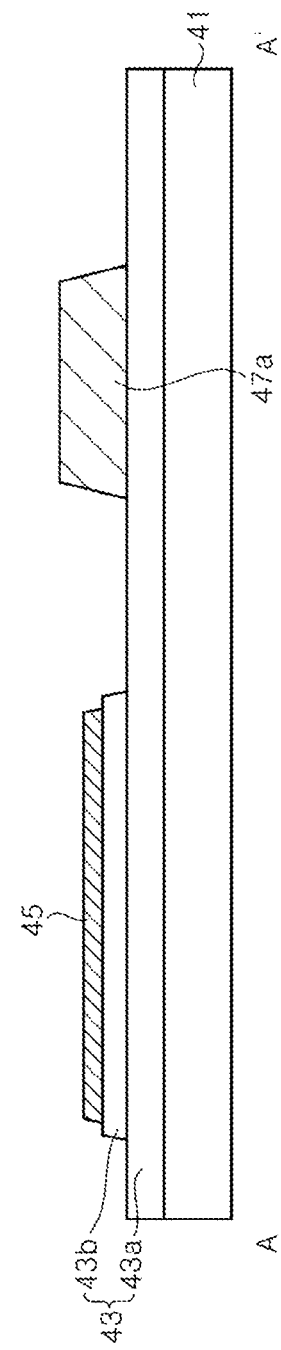
Figure 6C:
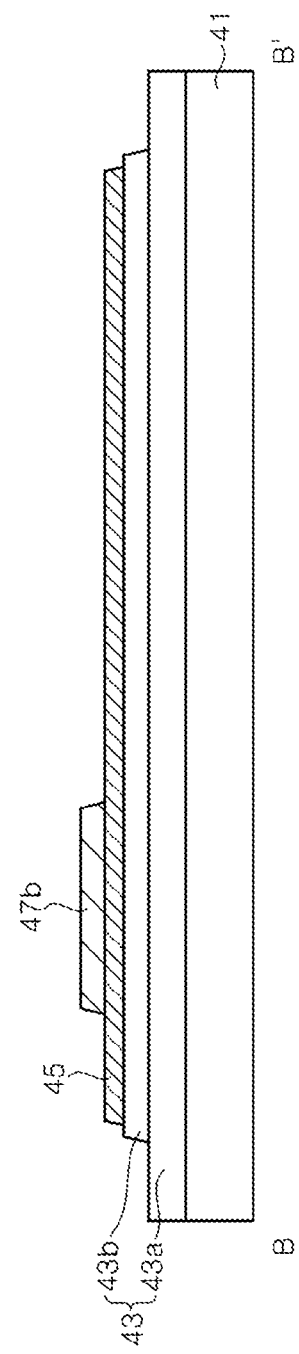

First, referring to FIGS. 6A, 6B, and 6C, the third transparent electrode 45 and the second conductivity type semiconductor layer 43b of the third LED stack 43 are patterned to expose the first conductivity type semiconductor layer 43a using photolithography and etching techniques. This process corresponds to, for example, a mesa etching process. A photoresist pattern may be used as an etching mask. For example, after the etching mask is formed, the third transparent electrode 45 may be etched first by a wet etching technique, and then the second conductivity type semiconductor layer 43b may be etched by a dry etching technique using the same etching mask. In this manner, the third transparent electrode 45 may be recessed from a mesa etching region. FIG. 6A exemplarily shows an edge of the mesa and does not show an edge of the third transparent electrode 45 to simplify illustrating. However, since the third transparent electrode 45 is wet etched using the same etching mask, the edge of the third transparent electrode 45 may also be recessed from the edge of the mesa toward an inner side of the mesa. Since the same etching mask is used, the number of photolithography processes may not be increased, thereby reducing the process costs. However, the inventive concepts are not limited thereto, and the etching mask for etching the mesa etching process may be different from the etching mask for etching the third transparent electrode 45.

Subsequently, a third n-electrode pad 47a and a third p-electrode pad 47b are formed on the first conductivity type semiconductor layer 43a and the third transparent electrode 45, respectively. The third n-electrode pad 47a and the third p-electrode pad 47b may have different thicknesses from each other. In particular, upper surfaces of the third n-electrode pad 47a and the third p-electrode pad 47b may be located at substantially the same elevation.

Figure 7A:
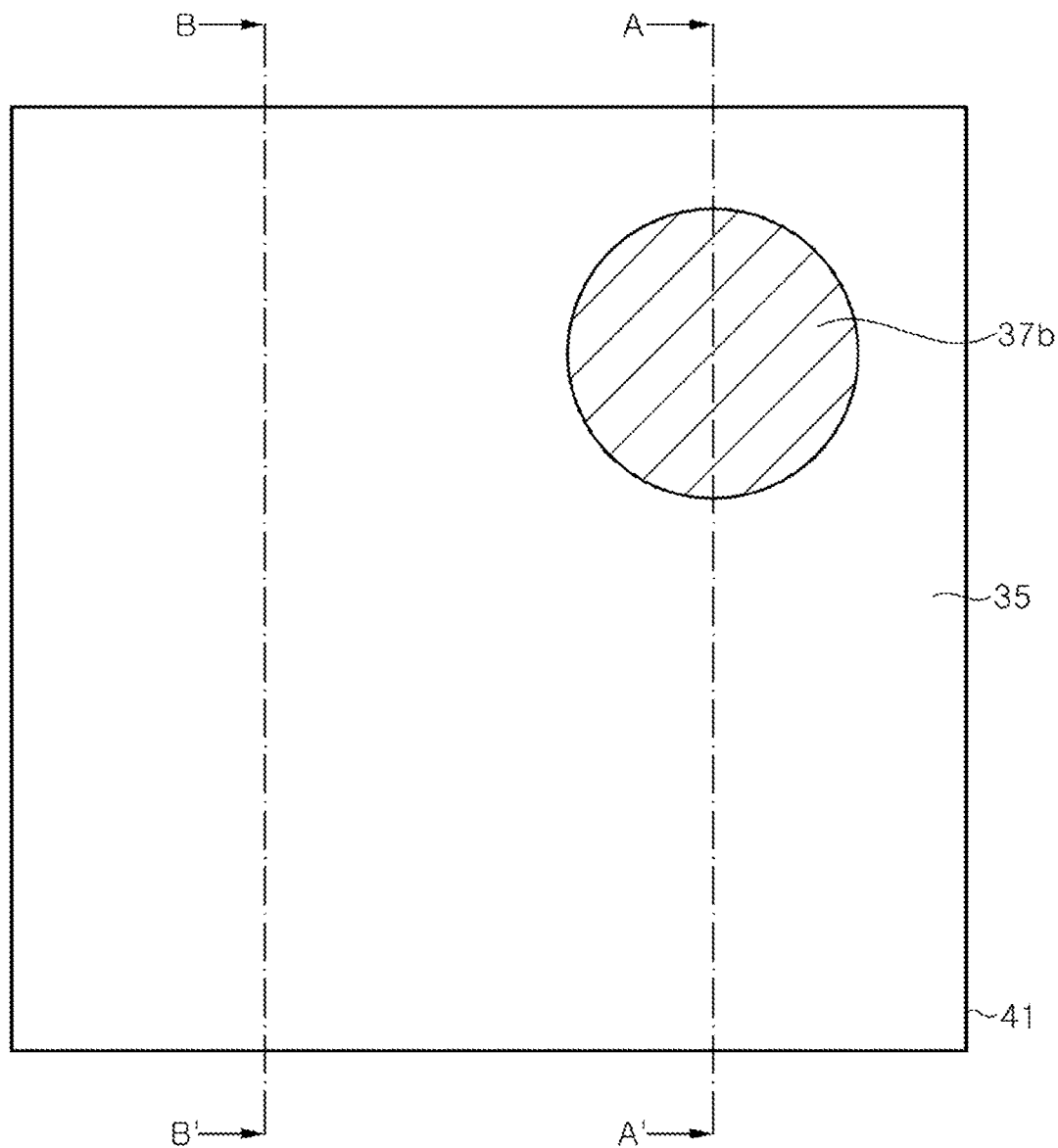
Figure 7B:
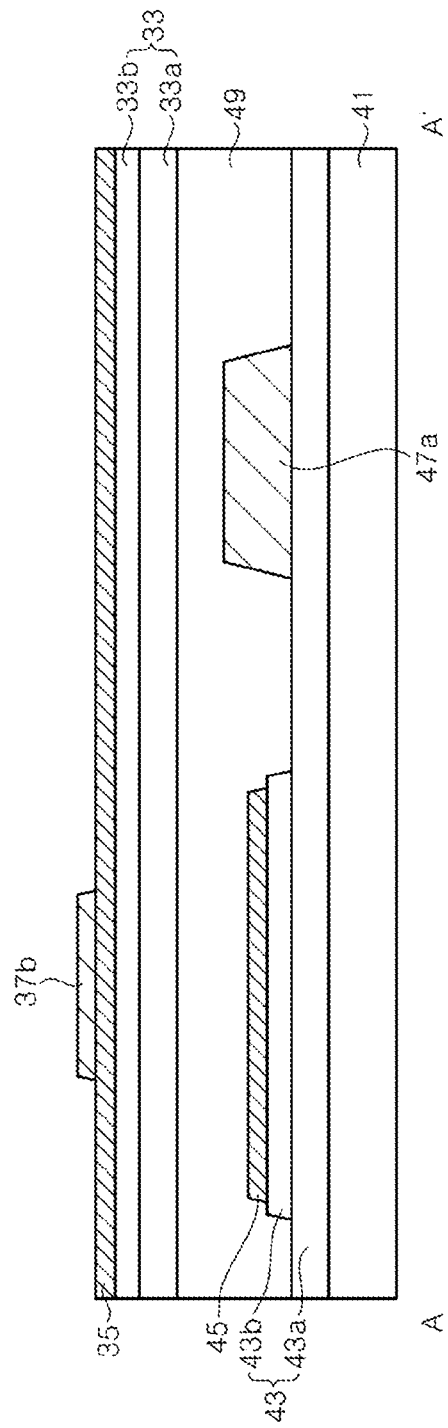
Figure 7C:
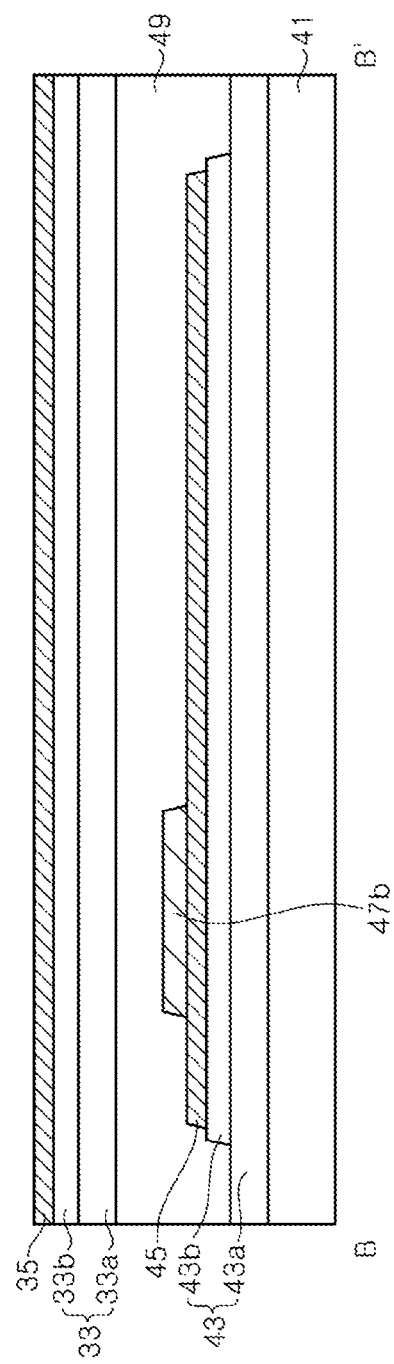

Referring to FIGS. 7A, 7B, and 7C, the second LED stack 33 described with reference to FIG. 5B is bonded onto the third LED stack 43 described with reference to FIGS. 6A, 6B, and 6C. The second LED stack 33 is bonded to a temporary substrate using a temporary bonding/debonding (TBDB) technique, and the second substrate 31 is removed from the second LED stack 33. The second substrate 31 may be removed using, for example, a laser lift off technique. After the second substrate 31 is removed, a roughened surface may be formed on a surface of the first conductivity type semiconductor layer 33a. Thereafter, the first conductivity type semiconductor layer 33a of the second LED stack 33 bonded to the temporary substrate may be disposed to face the third LED stack 43 and bonded to the third LED stack 43. The second LED stack 33 and the third LED stack 43 are bonded to each other by a first bonding layer 49. After bonding the second LED stack 33 to the third LED stack 43, the temporary substrate may be removed using the laser lift off technique. Accordingly, the second LED stack 33 may be disposed on the third LED stack 43, in which the second transparent electrode 35 may form an upper surface.

Subsequently, a second p-electrode pad 37b may be formed on the second transparent electrode 35. The second p-electrode pad 37b is disposed outside an upper region of the third n-electrode pad 47a. More particularly, the second p-electrode pad 37b may be disposed so as not to be overlapped with the third n-electrode pad 47a.

Figure 8A:
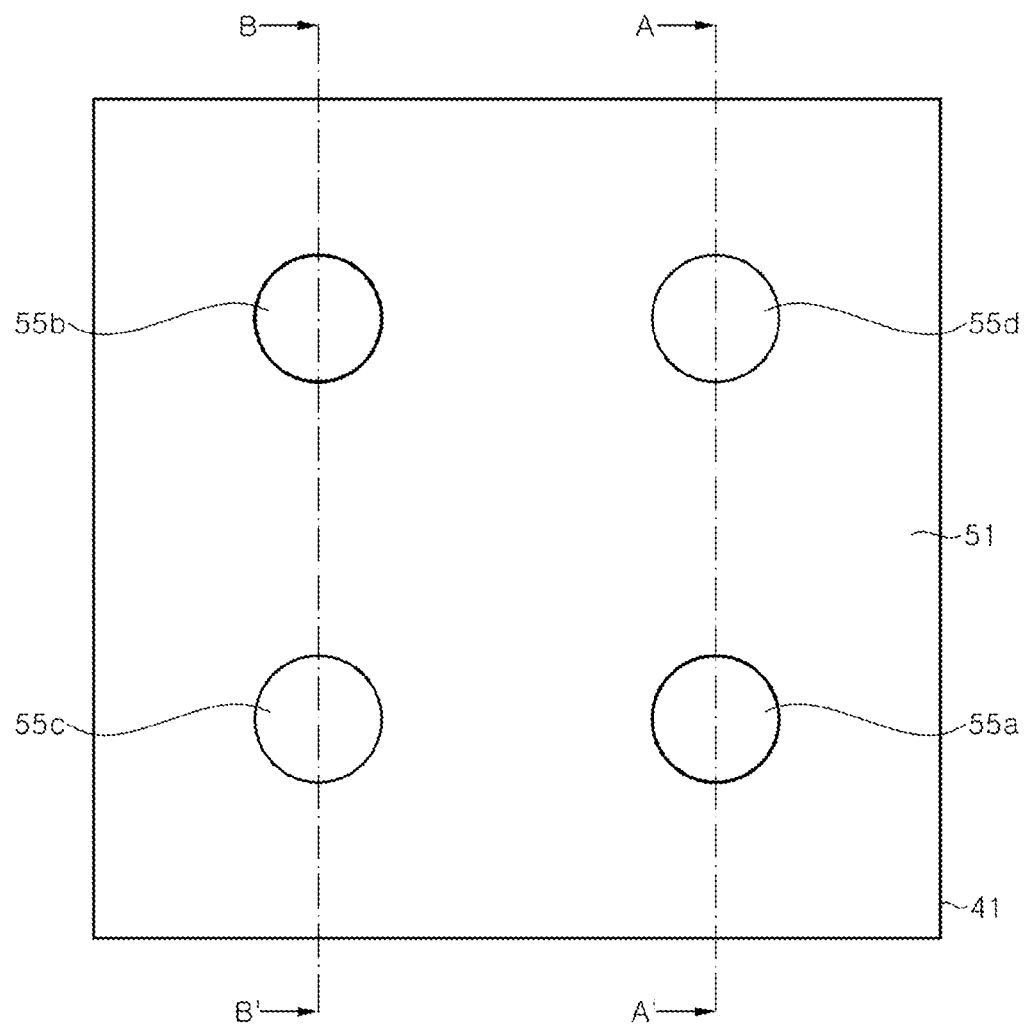
Figure 8B:
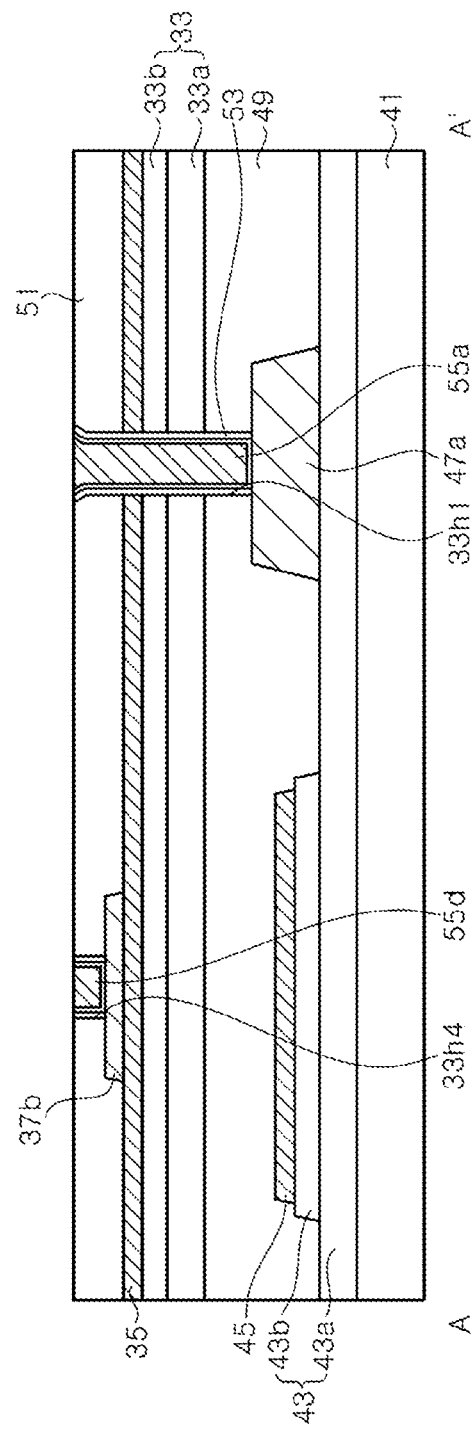
Figure 8C:
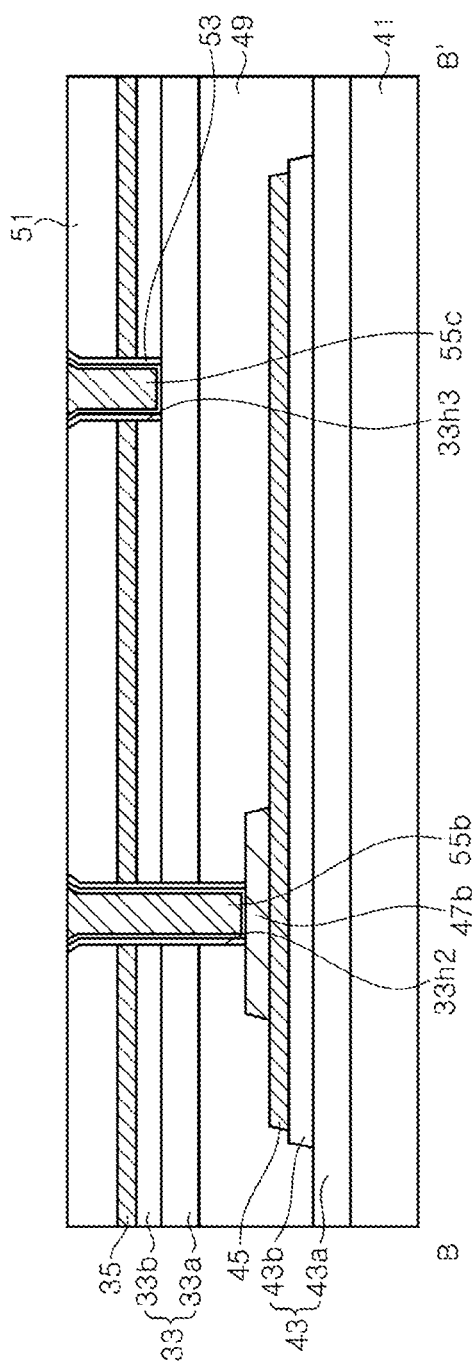

Referring to FIGS. 8A, 8B and 8C, a first planarization layer 51 is formed on the second transparent electrode 35. The first planarization layer 51 may also cover the second p-electrode pad 37b. The first planarization layer 51 may have a substantially flat upper surface, and may be formed as an insulation layer.

Subsequently, through holes 33h1, 33h2, 33h3, and 33h4 passing through the first planarization layer 51 are formed. The through holes 33h1 and 33h2 pass through the first planarization layer 51, the second transparent electrode 35, the second LED stack 33, and the first bonding layer 49, and expose the third n-electrode pad 47a and the third p-electrode pad 37b, respectively. The through hole 33h3 passes through the first planarization layer 51, the second transparent electrode 35, and the second conductivity type semiconductor layer 33b, and exposes the first conductivity type semiconductor layer 33a. The through hole 33h4 passes through the first planarization layer 51 and exposes the second p-electrode pad 37b.

The through holes 33h1, 33h2, 33h3, and 33h4 may be formed using photolithography and etching techniques. The through holes 33h1, 33h2, 33h3, and 33h4 may be formed together through an identical process, or formed through different processes from one another. In particular, since the through holes 33h1 and 33h2 have substantially the same depth, they may be formed together through the identical process. Since the through holes 33h3 and 33h4 have a different depth from those of the through holes 33h1 and 33h2, they may be formed through a process different from that of forming the through holes 33h1 and 33h2. In an exemplary embodiment, after the through holes 33h1, 33h2, and 33h3 are partially formed in advance, remaining portions of the through holes 33h1, 33h2, and 33h3 may be formed together with the through hole 33h4.

In the illustrated exemplary embodiment, the second transparent electrode 35 may also be etched while the through holes 33h1, 33h2, and 33h3 are formed. Accordingly, the second transparent electrode 35 may be exposed to sidewalls of the through holes 33h1, 33h2, and 33h3. In another exemplary embodiment, the second transparent electrode 35 may be removed in advance in a region where the through holes 33h1, 33h2, and 33h3 are to be formed. In this case, it is possible to prevent the second transparent electrode 35 from being exposed to the sidewalls of the through holes 33*h*1, 33*h*2, and 33*h*3.

Meanwhile, a first sidewall insulation layer 53 is formed. The first sidewall insulation layer 53 may be formed first to cover an upper region of the first planarization layer 51 and sidewalls and bottom surfaces of the through holes 33*h*1, 33*h*2, 33*h*3, and 33*h*4. For example, the first sidewall insulation layer 53 may be formed using a chemical vapor deposition technique or an atomic layer deposition technique.

Subsequently, the first sidewall insulation layer 53 is blanket etched using a dry etching technique. Accordingly, the first sidewall insulation layer 53 formed on the bottom of the through holes 33*h*1, 33*h*2, 33*h*3, and 33*h*4 is removed, and the second p-electrode pad 37*b*, the first conductivity type semiconductor layer 33*a*, the third n-electrode pad 47*a*, and the third p-electrode pad 47*b* are exposed. The first sidewall insulation layer 53 formed on the first planarization layer 51 may be removed during the blanket etching, and a portion of the first planarization layer 51 may also be removed near inlets of the through holes 33*h*1, 33*h*2, and 33*h*3. Accordingly, the inlets of the through holes 33*h*1, 33*h*2, and 33*h*3 may have a wider width than the bottom thereof. This will be described in detail later with reference to FIGS. 17A through 17D.

Thereafter, lower buried vias 55*a*, 55*b*, 55*c*, and 55*d* may be formed to fill the through holes 33*h*1, 33*h*2, 33*h*3, and 33*h*4 using a seed layer and a plating technique. The seed layer and the plating layer formed on the first planarization layer 51 may be removed using a chemical mechanical polishing technique.

Figure 9A:
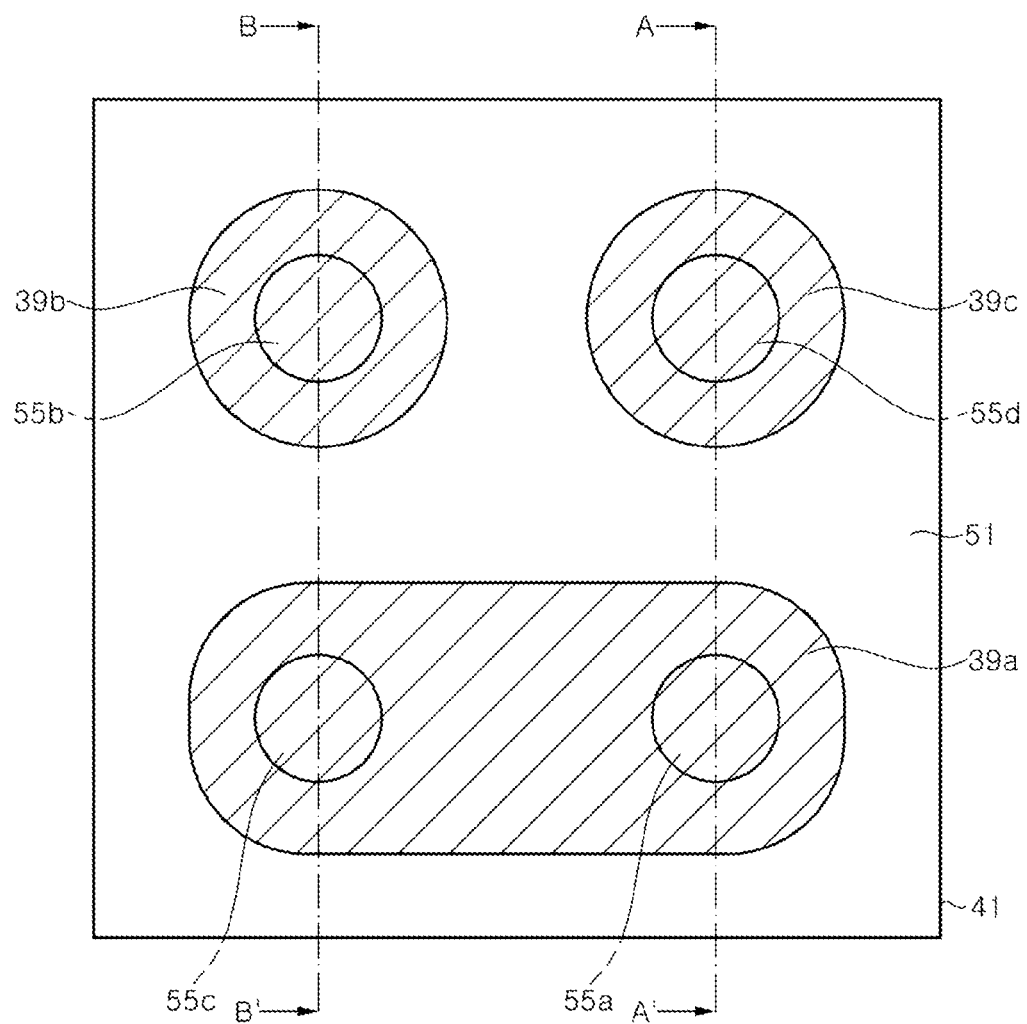
Figure 9B:
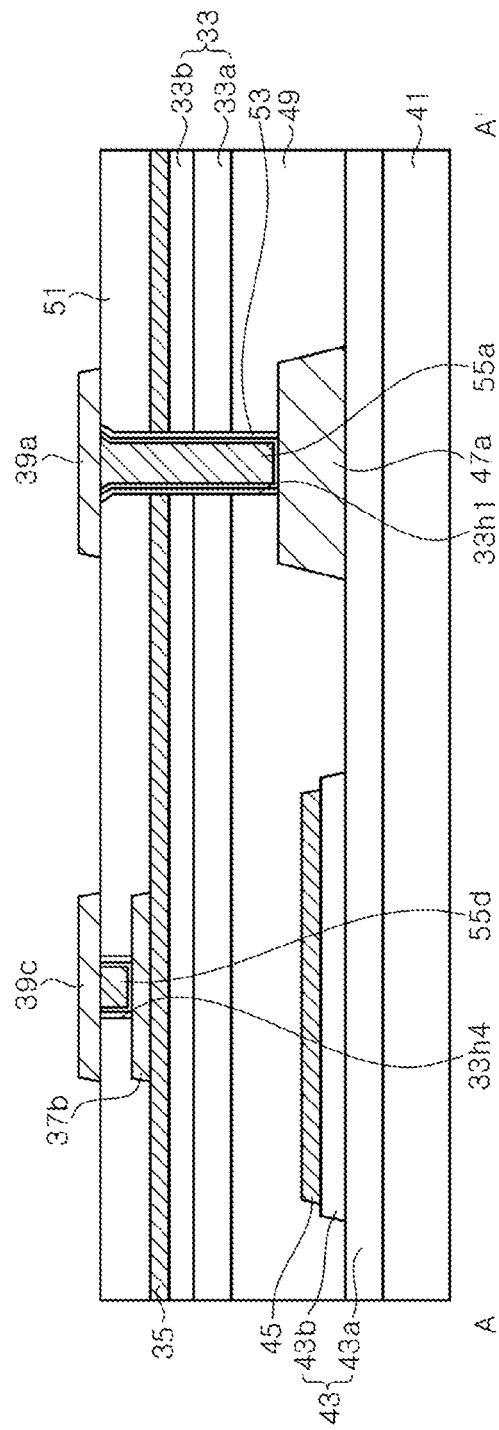
Figure 9C:
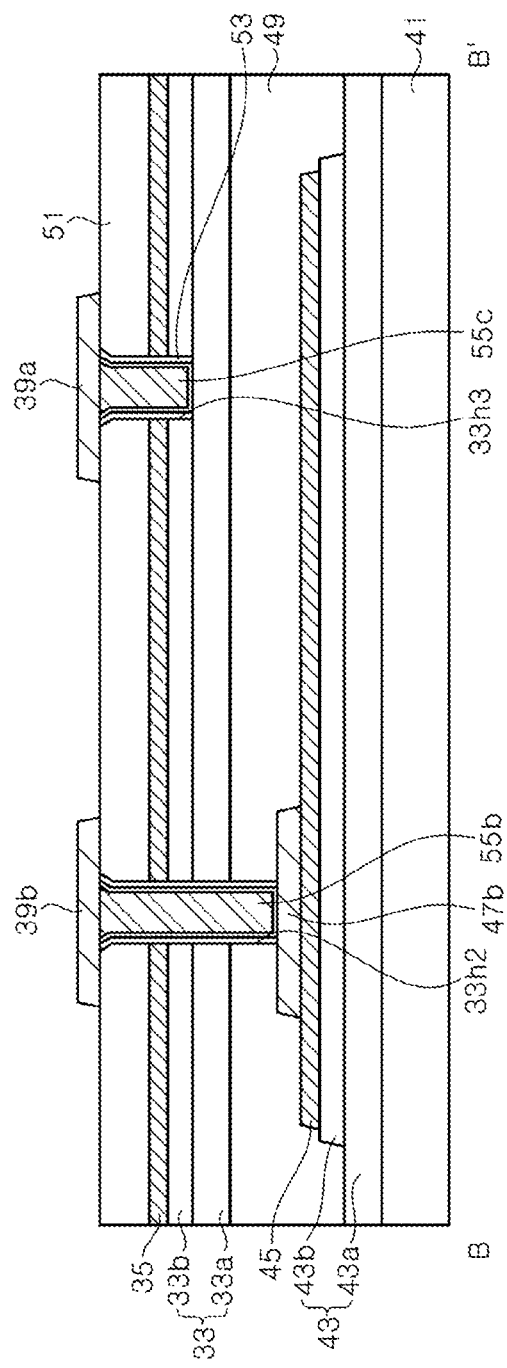

Referring to FIGS. 9A, 9B, and 9C, lower connectors 39*a*, 39*b*, and 39*c* are formed. The lower connector 39*a* may be formed to cover the lower buried vias 55*a* and 55*c*, the lower connector 39*b* may be formed to cover the lower buried via 55*b*, and the lower connector 39*c* may be formed to cover the lower buried via 55*d*.

The lower buried via 55*a* and the lower buried via 55*c* may be electrically connected to each other by the lower connector 39*a*, and thus, the first conductivity type semiconductor layer 33*a* of the second LED stack 33 and the first conductivity type semiconductor layer 43*a* of the third LED stack 43 may be electrically connected.

Figure 10A:
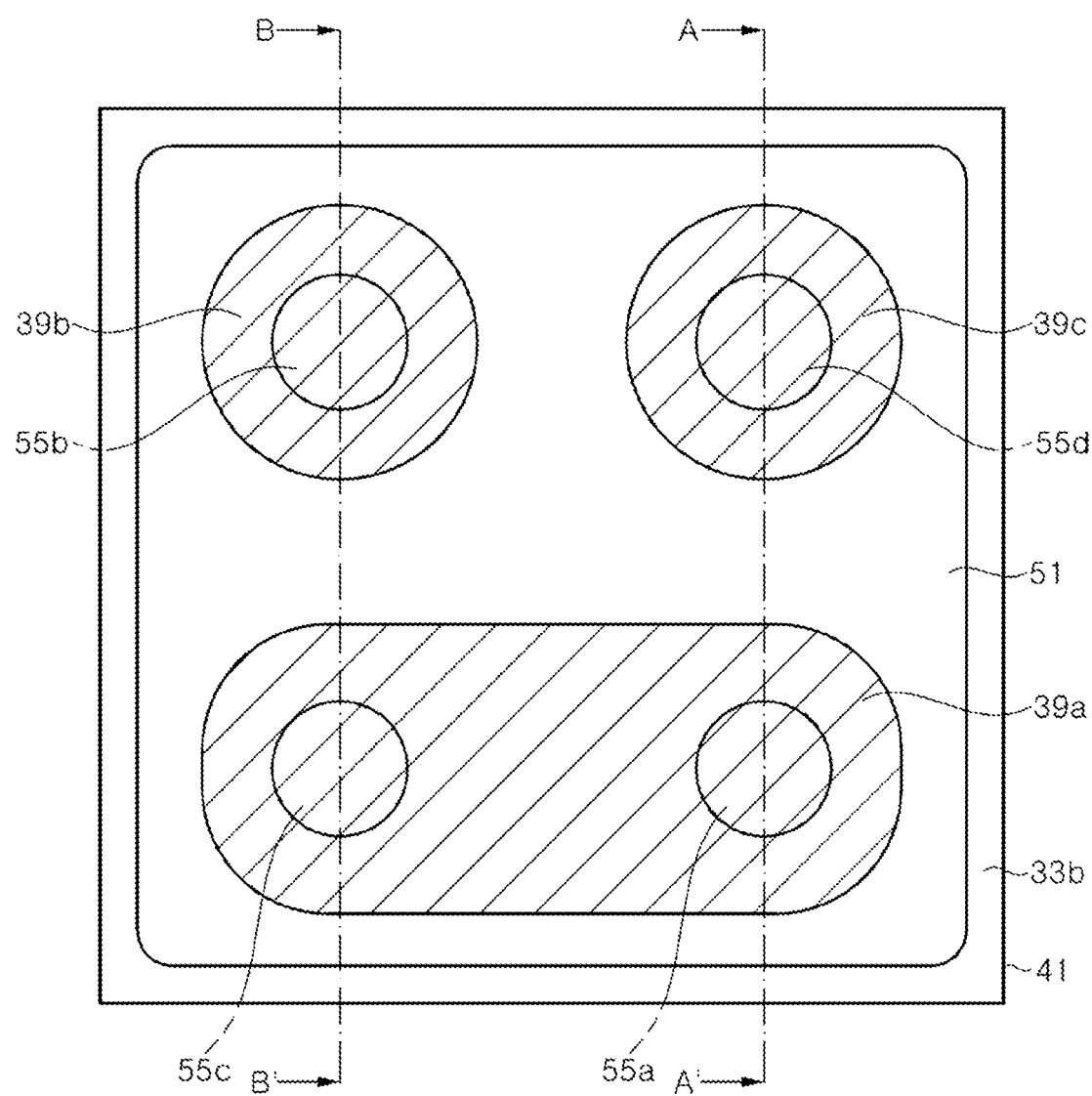
Figure 10B:
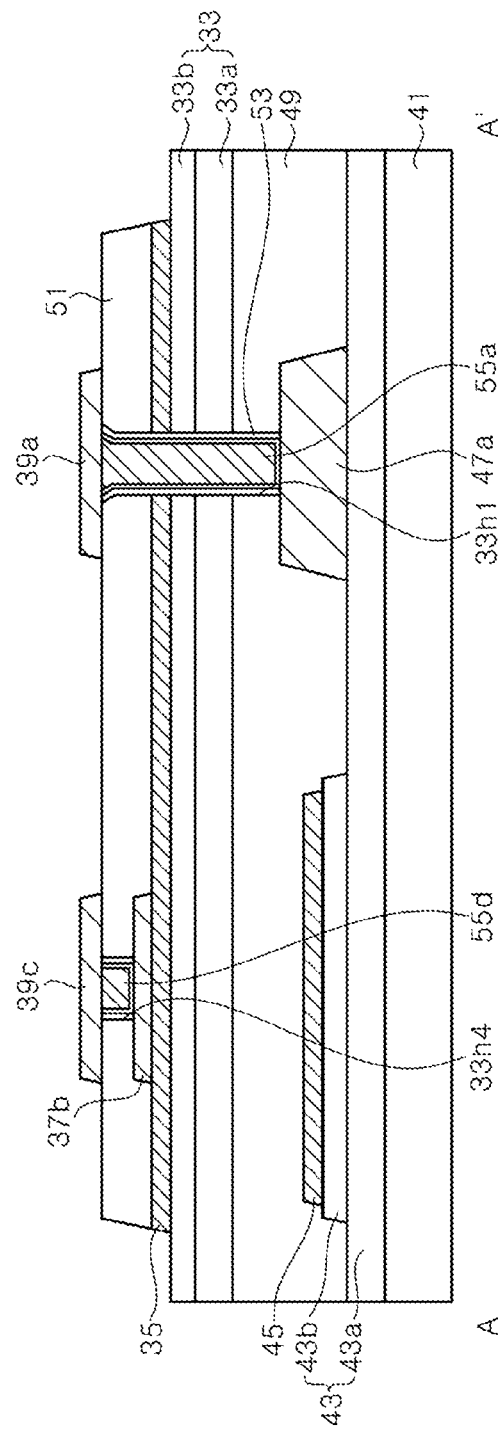
Figure 10C:
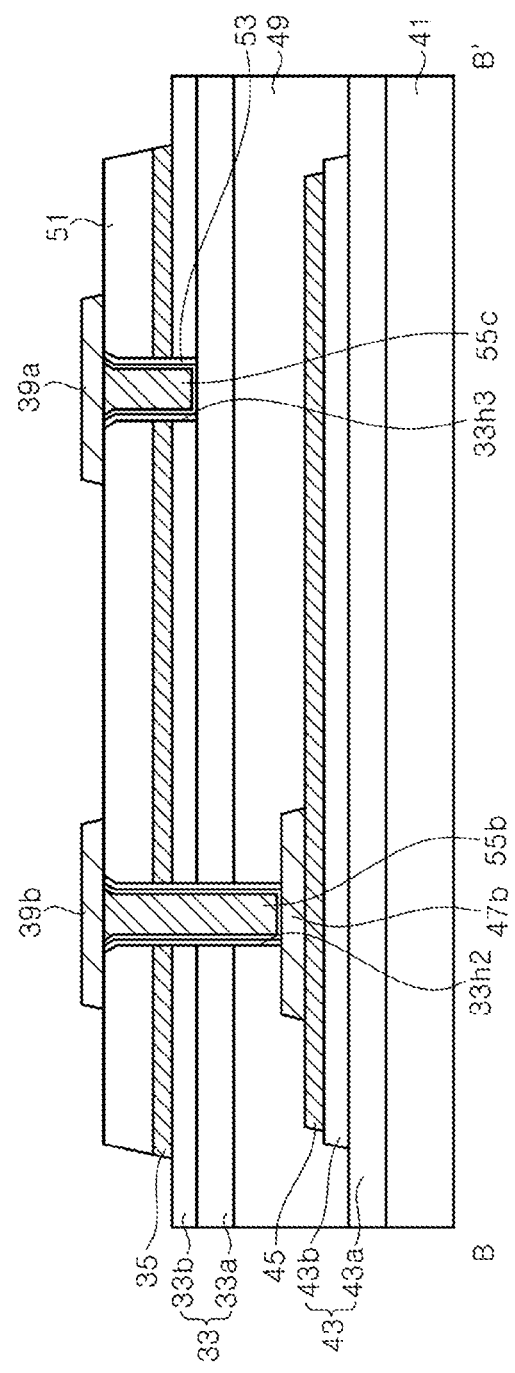

Referring to FIGS. 10A, 10B, and 10C, the first planarization layer 51 is patterned to partially remove the first planarization layer 51 near a device isolation region. Accordingly, the first planarization layer 51 is divided into a plurality of device regions on the third substrate 41.

While the first planarization layer 51 is patterned, the second transparent electrode 35 may also be patterned. Accordingly, the second conductivity type semiconductor layer 33*b* of the second LED stack 33 may be exposed near an edge of the first planarization layer 51.

Figure 11A:
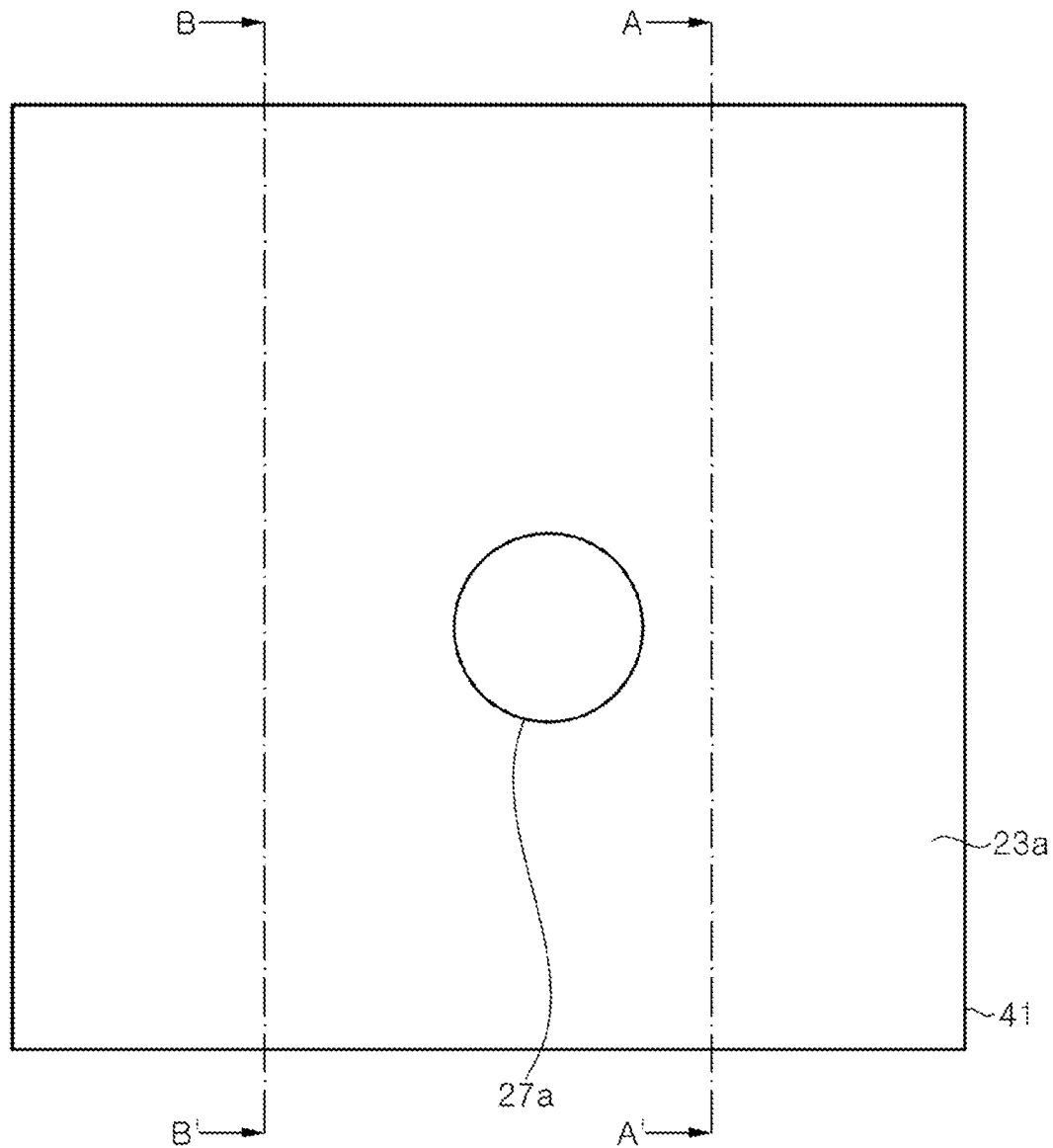
Figure 11B:
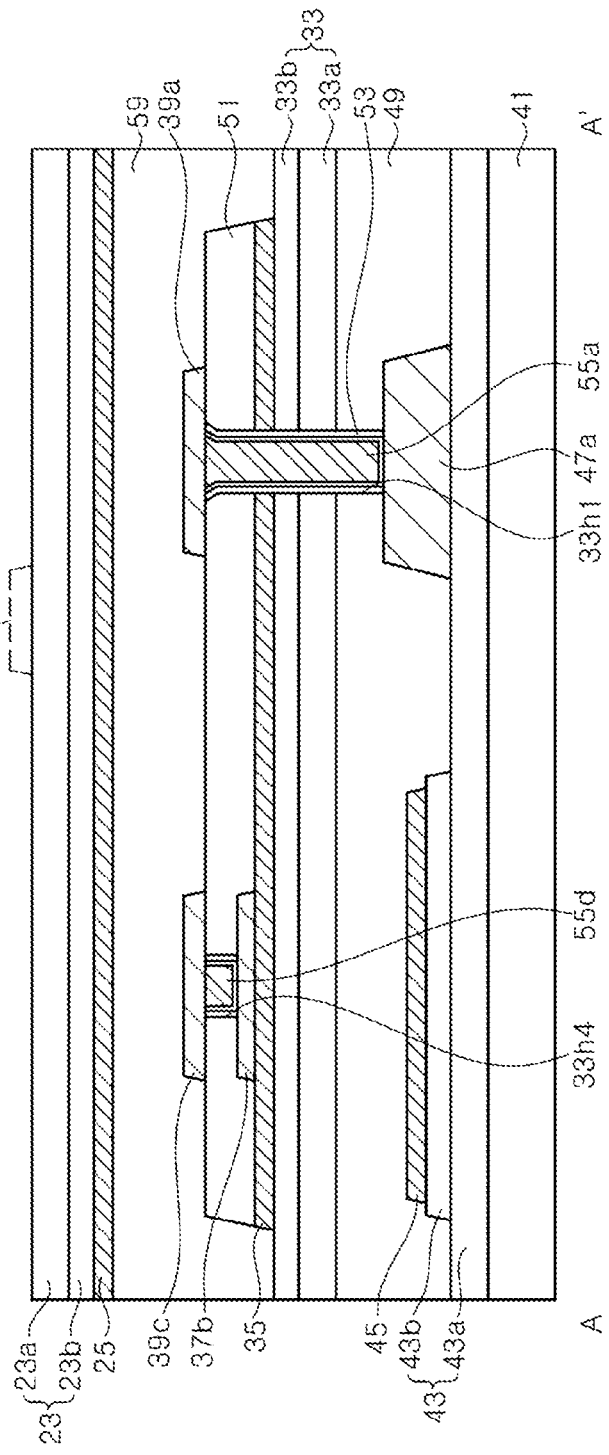
Figure 11C:
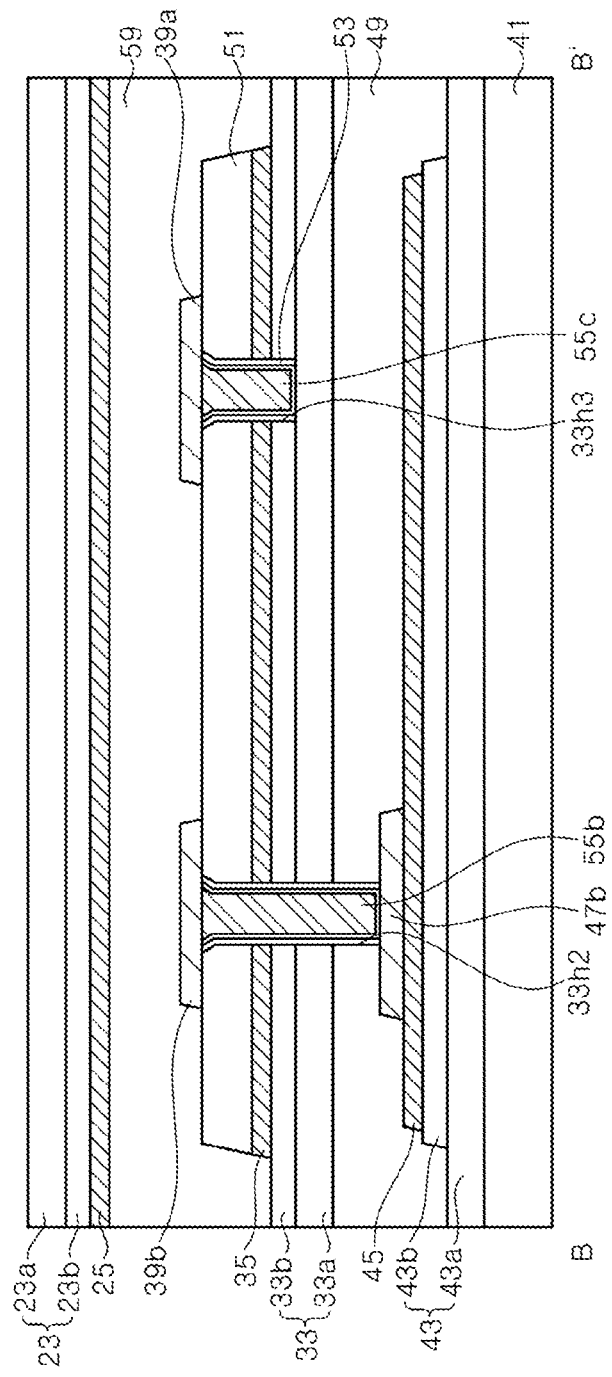

Referring to FIGS. 11A, 11B and 11C, the first LED stack 23 described in FIG. 5A is bonded to the second LED stack 33. The first LED stack 23 and the second LED stack 33 may be bonded using the second bonding layer 59 so that the first transparent electrode 25 faces the second LED stack 33. Accordingly, the second bonding layer 59 may contact the first transparent electrode 25, and may also contact the first planarization layer 51 and the lower connectors 39*a*, 39*b*, and 39*c*. In addition, the second bonding layer 59 may also contact side surfaces of the first planarization layer 51 and the second transparent electrode 35, and may contact the second conductivity type semiconductor layer exposed near the edge of the first planarization layer 51.

Meanwhile, a first substrate 21 is removed from the first LED stack 23. The first substrate 21 may be removed using, for example, an etching technique. After the first substrate 21 is removed, a first n-electrode pad 27*a* may be formed on a portion of a region of the first conductivity type semiconductor layer 23*a*. The first n-electrode pad 27*a* may be formed to be in ohmic contact with the first conductivity type semiconductor layer 23*a*.

Figure 12A:
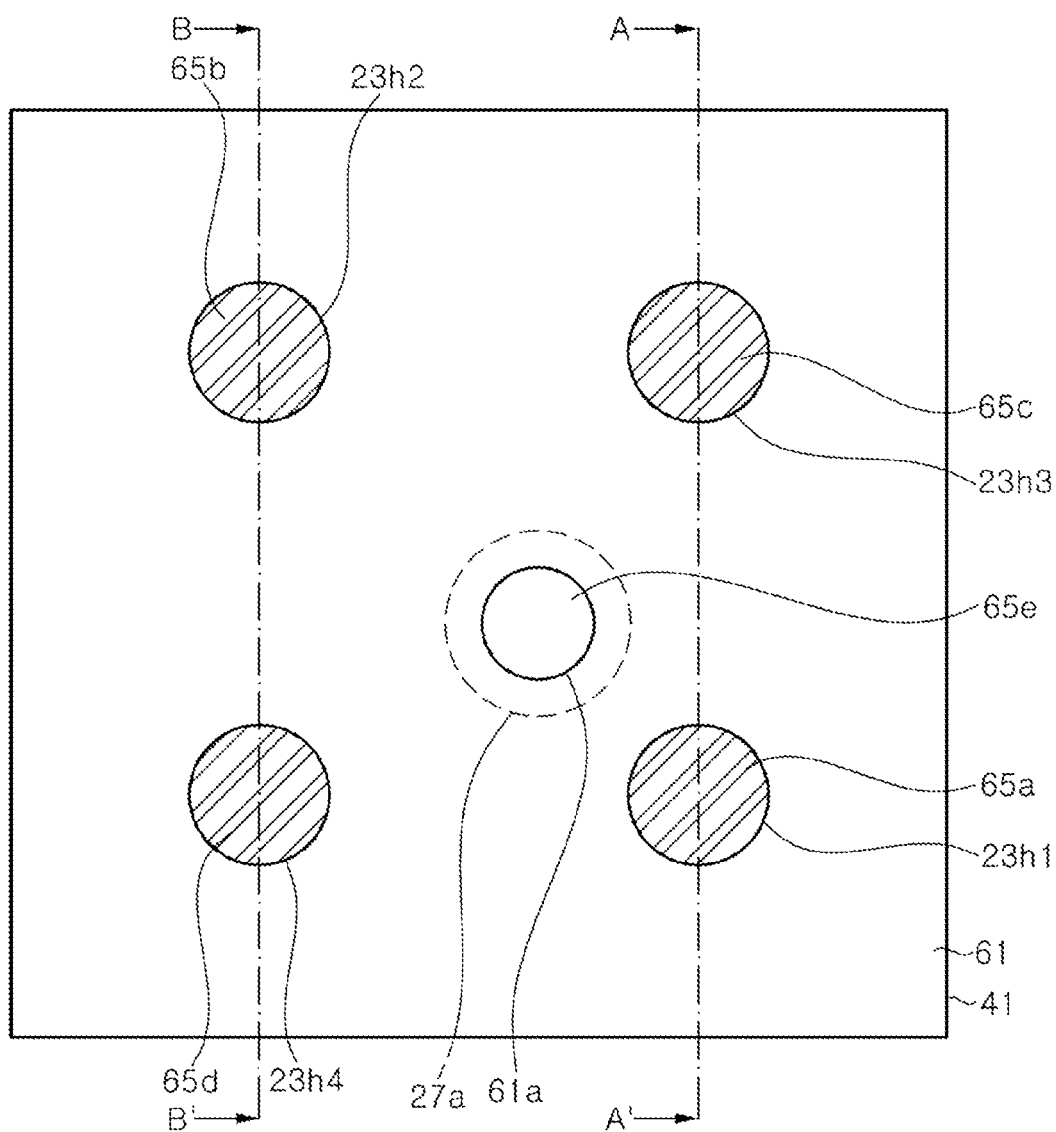
Figure 12B:
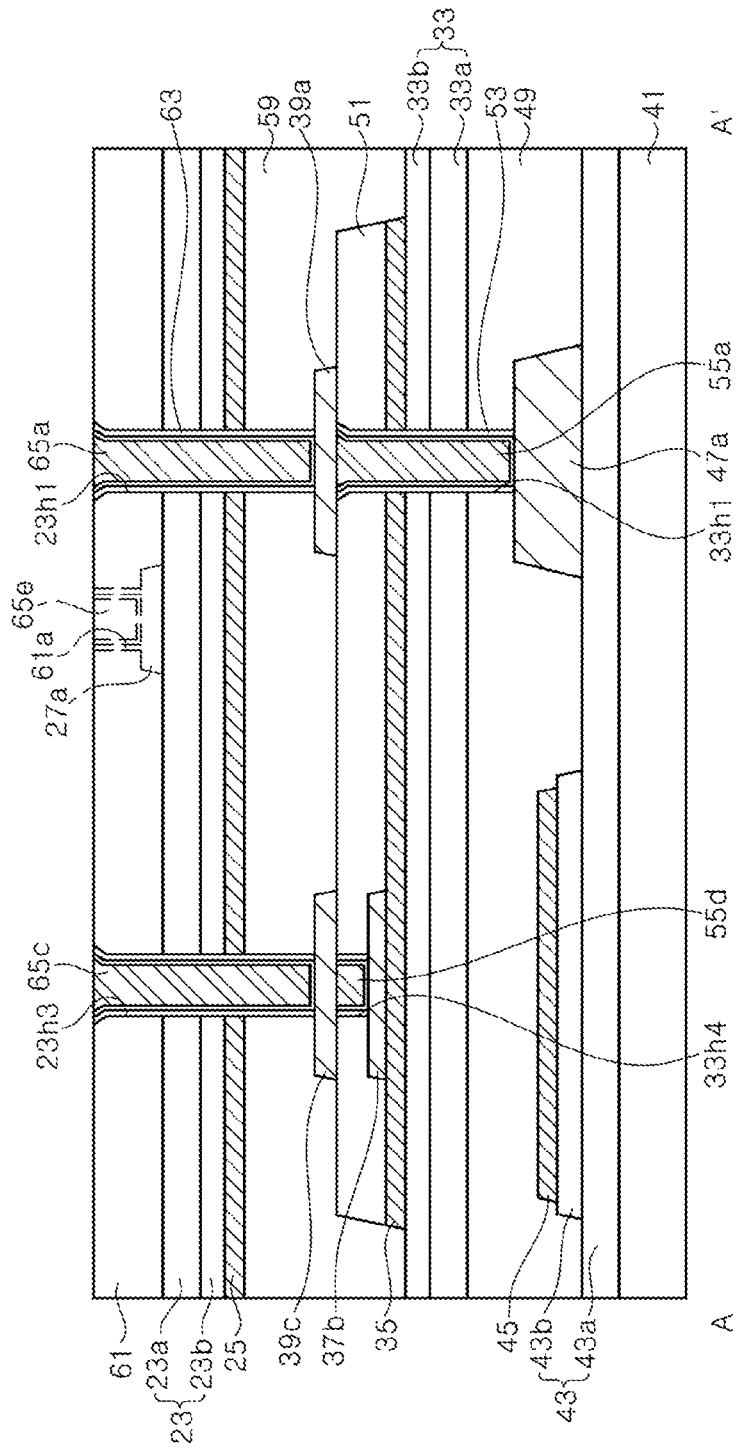
Figure 12C:
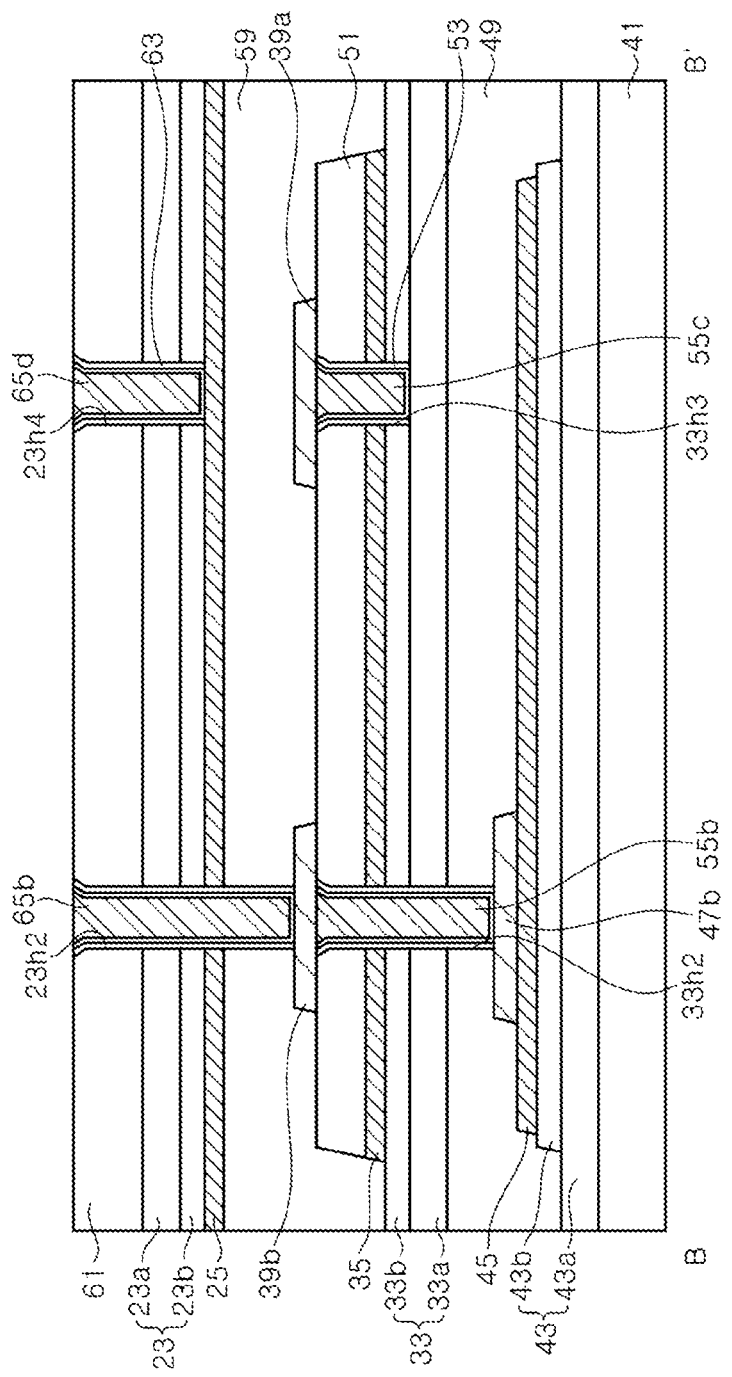

Referring to FIGS. 12A, 12B, and 12C, a second planarization layer 61 covering the first LED stack 23 and the first n-electrode pad 27*a* is formed. The second planarization layer 61 is formed to have a substantially flat upper surface.

Subsequently, through holes 23*h*1, 23*h*2, 23*h*3, and 23*h*4 passing through the second planarization layer 61 and openings 61*a* are formed. The through holes 23*h*1, 23*h*2, and 23*h*3 may pass through the first LED stack 23, the first transparent electrode 25, and the second bonding layer 59 to expose the lower connectors 39*a*, 39*b*, and 39*c*, respectively. Meanwhile, the through hole 23*h*4 may pass through the first LED stack 23 to expose the first transparent electrode 25. Meanwhile, the opening 61*a* exposes the first n-electrode pad 27*a*.

The through holes 23*h*1, 23*h*2, and 23*h*3 may be formed together through an identical process, and the through hole 23*h*4 and the opening 61*a* may be formed through a separate process from that of the through holes 23*h*1, 23*h*2, and 23*h*3. As described above, after the through holes 23*h*1, 23*h*2, and 23*h*3 are partially formed, the remaining portions of the through holes 23*h*1, 23*h*2, and 23*h*3 may be formed while the opening 61*a* and the through hole 23*h*4 are formed.

Subsequently, a second sidewall insulation layer 63 and upper buried vias 65*a*, 65*b*, 65*c*, 65*d*, and 65*e* are formed. Since a process of forming the second sidewall insulation layer 63 and the upper buried vias 65*a*, 65*b*, 65*c*, 65*d*, and 65*e* is substantially similar to that of forming the first sidewall insulation layer 53 and the lower buried vias 55*a*, 55*b*, 55*c*, and 55*d*, repeated descriptions thereof will be omitted.

Figure 13A:
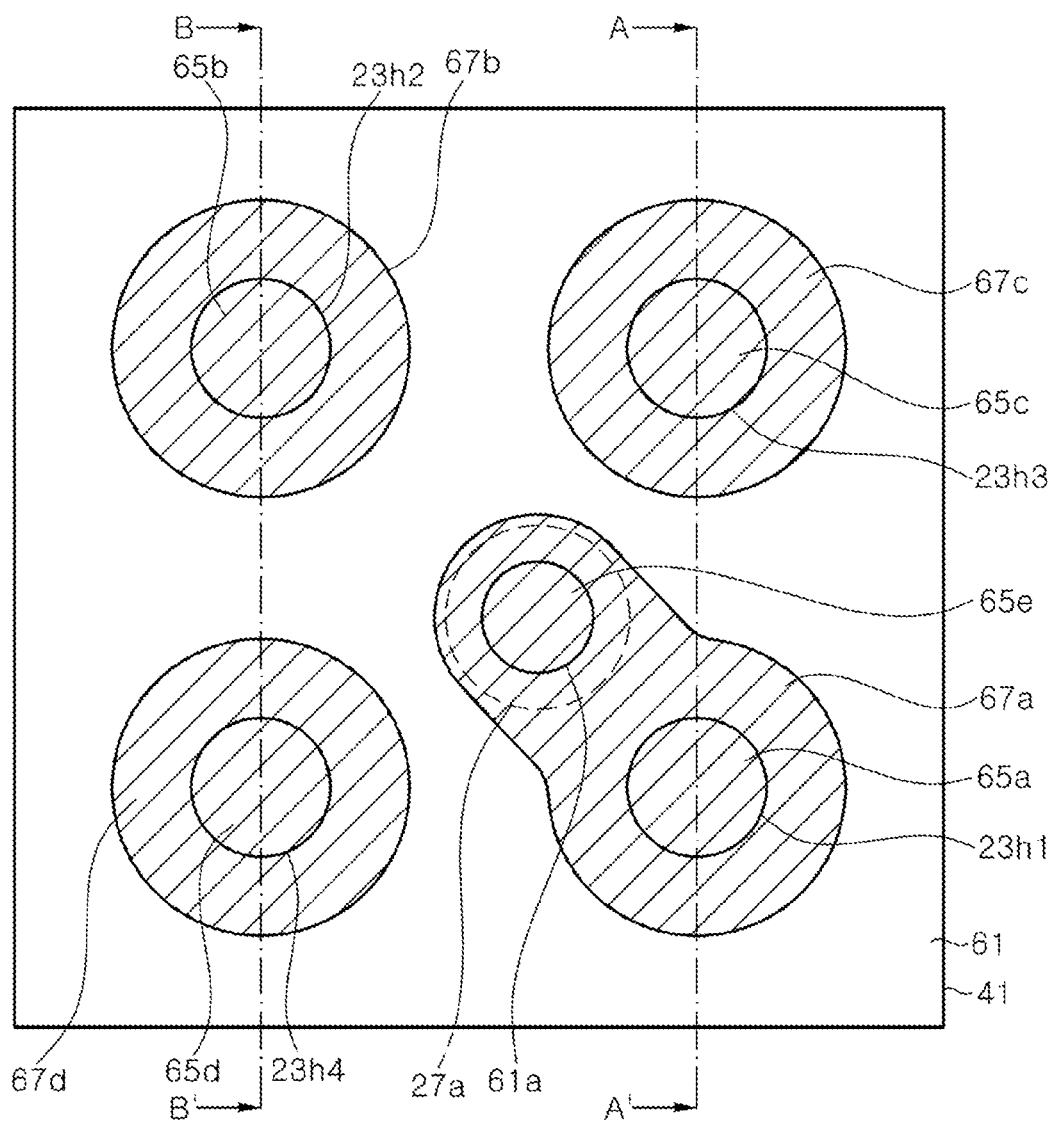
Figure 13B:
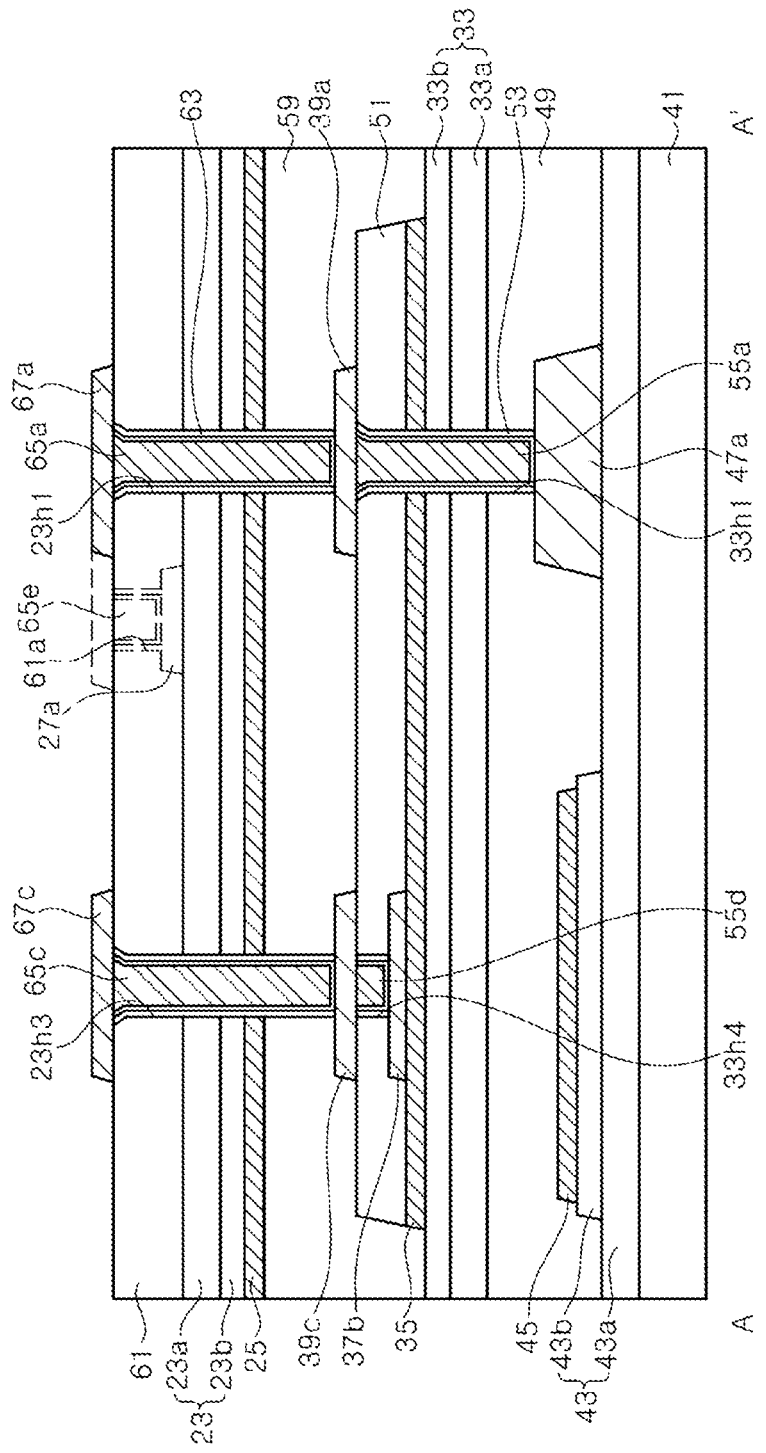
Figure 13C:
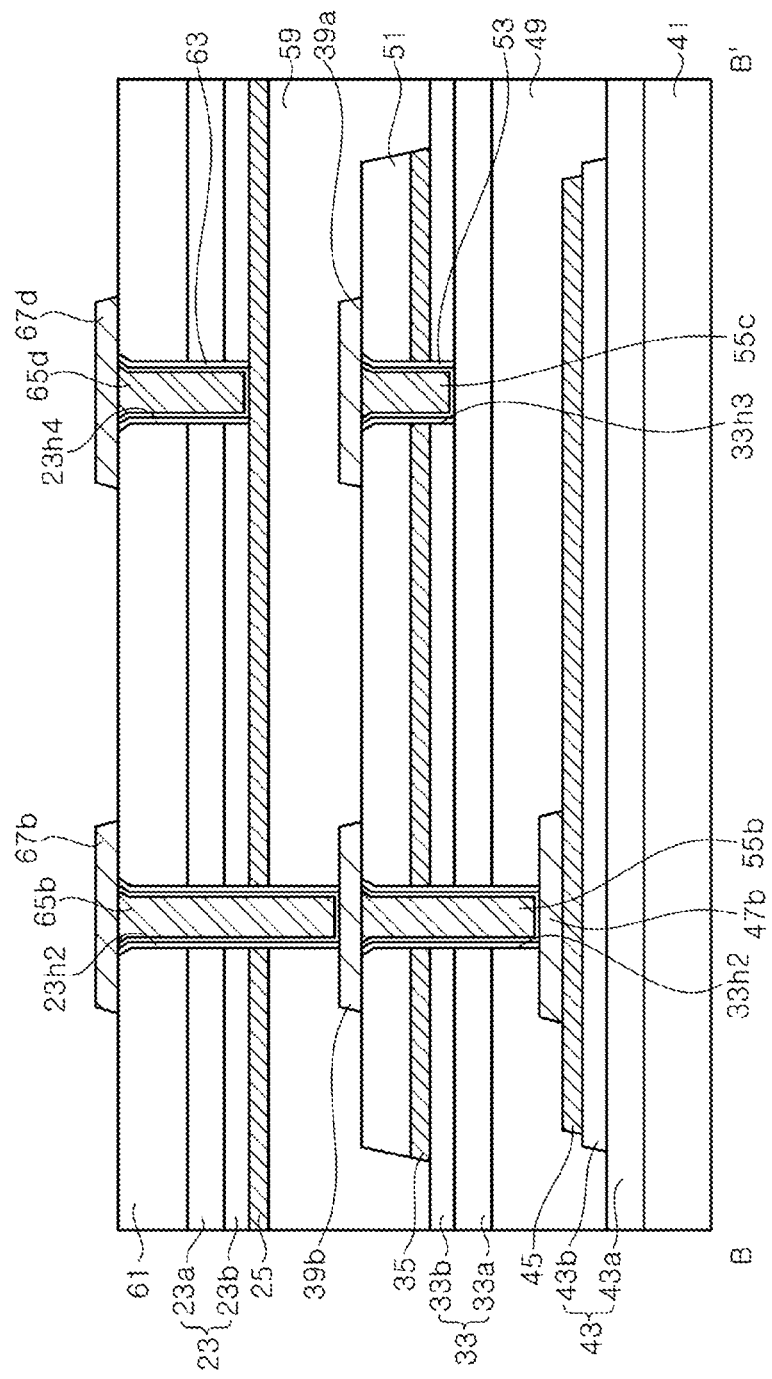

Referring to FIGS. 13A, 13B, and 13C, upper connectors 67*a*, 67*b*, 67*c*, and 67*d* are formed. The upper connectors 67*a*, 67*b*, 67*c*, and 67*d* may include a reflective metal layer, and thus, light generated in the first LED stack 23 may be reflected to improve light extraction efficiency. For example, the upper connectors 67*a*, 67*b*, 67*c*, and 67*d* may include Au or an Au alloy.

The upper connector 67*a* may electrically connect the upper buried via 65*a* to the upper buried via 65*e*. The upper connector 67*a* may cover the upper buried vias 65*a* and 65*e*. The upper connectors 67*b*, 67*c*, and 67*d* may be connected to the upper buried vias 65*b*, 65*c*, and 65*d*, respectively. The upper connectors 67*b*, 67*c*, and 67*d* may cover the upper buried vias 65*b*, 65*c*, and 65*d*, respectively.

Figure 14A:
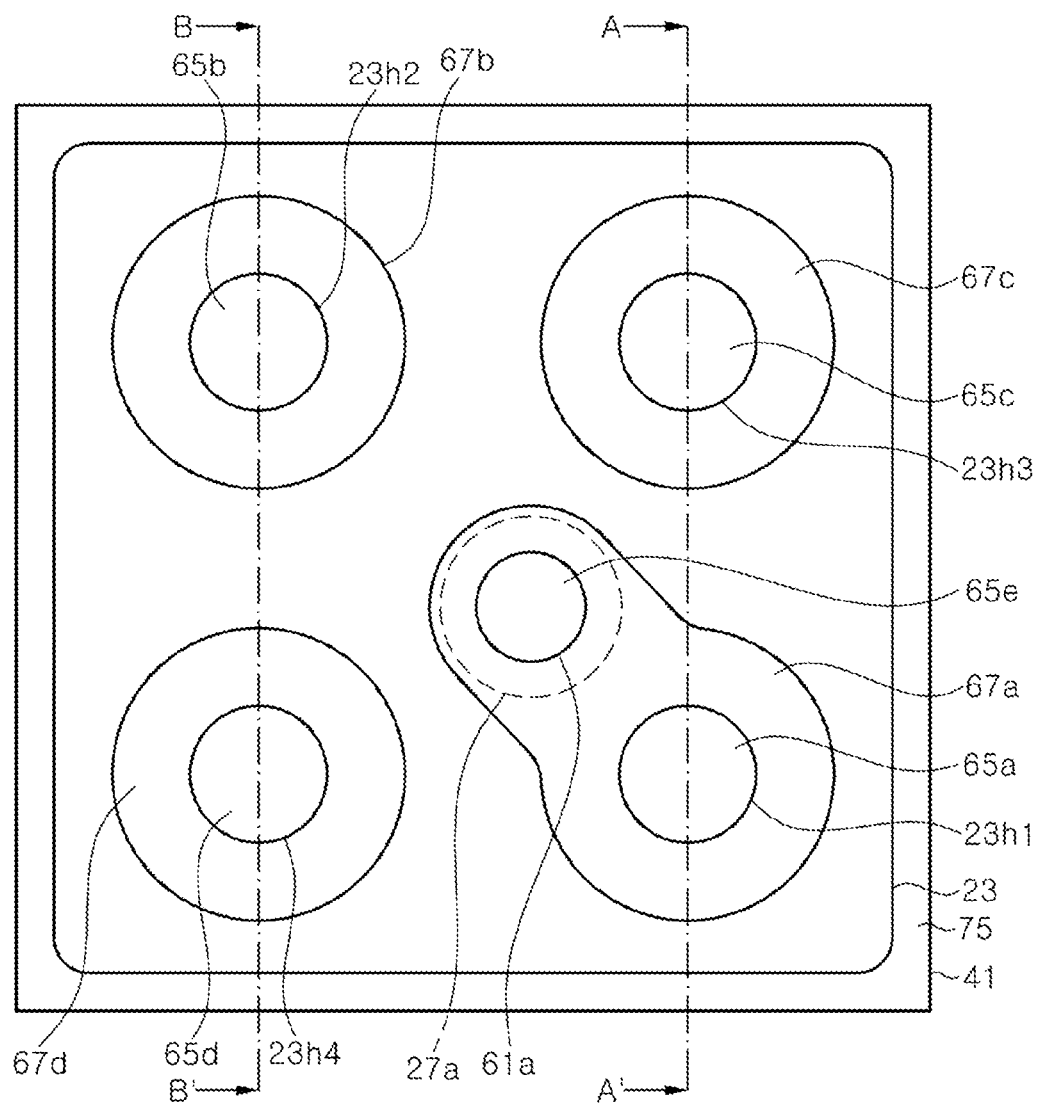
Figure 14B:
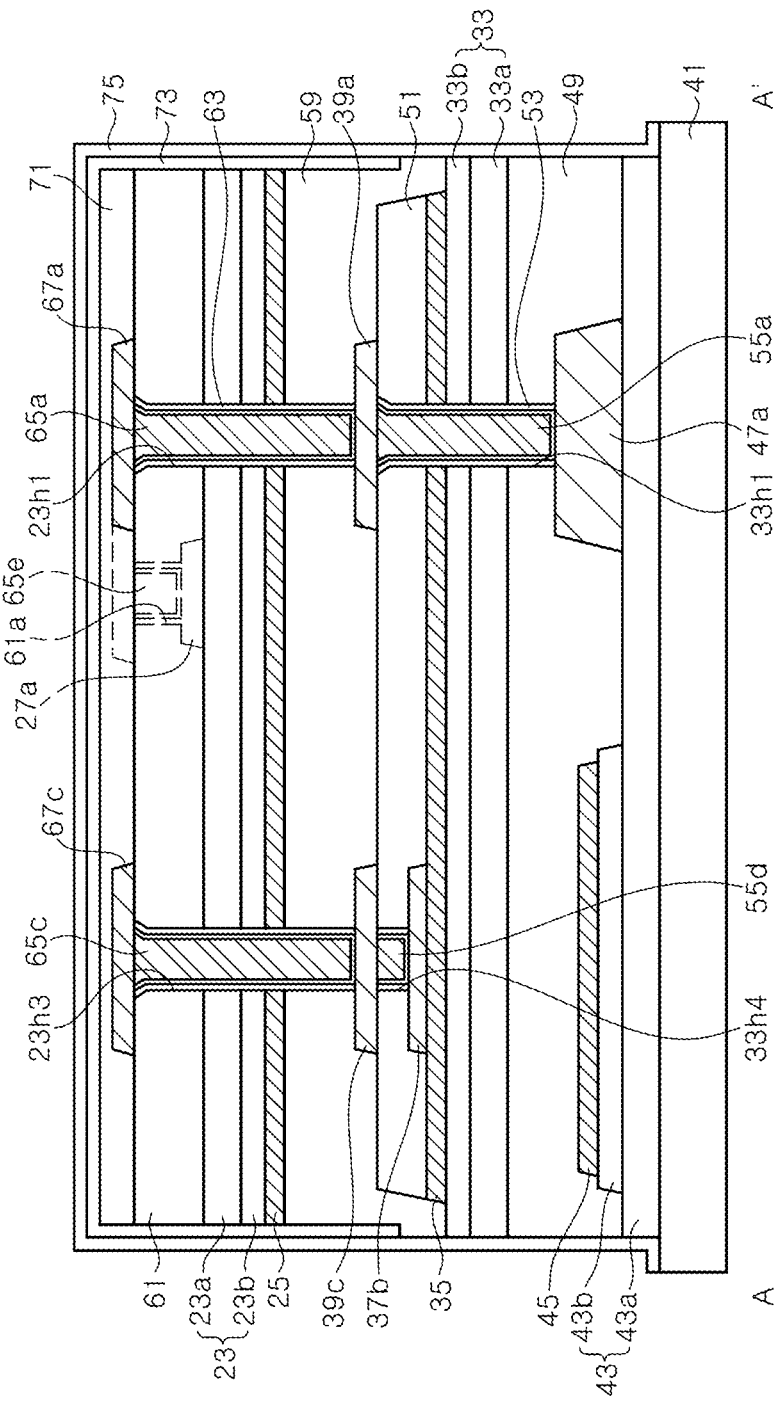
Figure 14C:
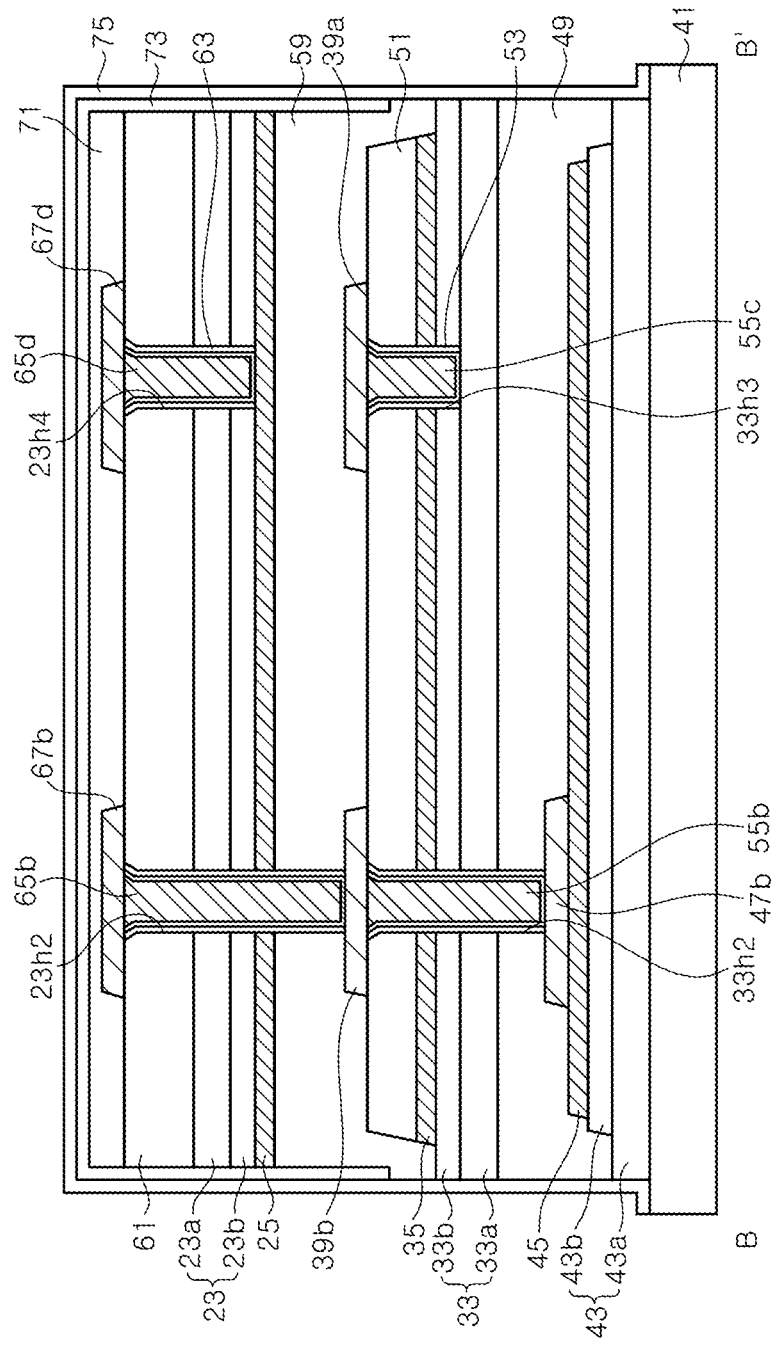

Referring to FIGS. 14A, 14B, and 14C, a first upper insulation layer 71 covering the second planarization layer 61 is formed. The first upper insulation layer 71 may be used as a hard mask. Subsequently, the first upper insulation layer 71 may be patterned to expose the second planarization layer 61 in the device isolation region. In another exemplary embodiment, the second planarization layer 61 may be patterned along with the first upper insulation layer 71 to expose the first LED stack 23 in the device isolation region.

Subsequently, the first LED stack 23, the first transparent electrode 25, and the second bonding layer 59 are etched using the first upper insulation layer 71 as a hard mask. When a thickness of the first upper insulation layer 71 is not sufficient, the upper connectors 67*a*, 67*b*, 67*c*, and 67*d* may be exposed and damaged while the device isolation region is etched. Accordingly, after the device isolation region is partially formed, the second upper insulation layer 73 may be additionally formed and the remaining device isolation region may be formed. All of the first upper insulation layer 71 disposed on the second planarization layer 61 may be removed while the device isolation region is formed. However, the second upper insulation layer 73 covering side surfaces of the first LED stack 23 and the first transparent electrode 25 will remain.

Thereafter, a third upper insulation layer 75 may be additionally formed to protect the second LED stack 33 and the third LED stack 43. The third upper insulation layer 75 may cover the second upper insulation layer 73, and may cover sidewalls of each of the light emitting devices exposed in the device isolation region.

Figure 15A:
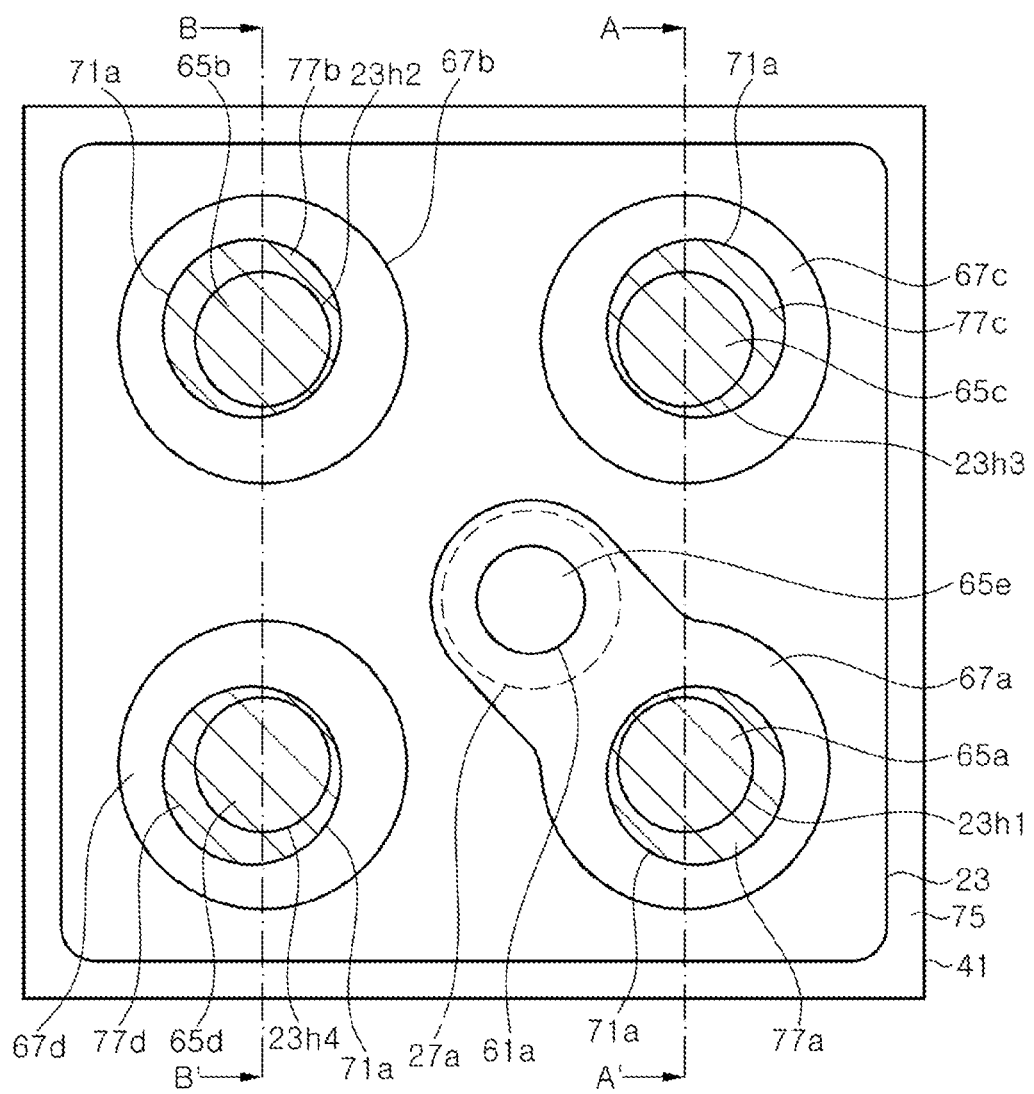
Figure 15B:
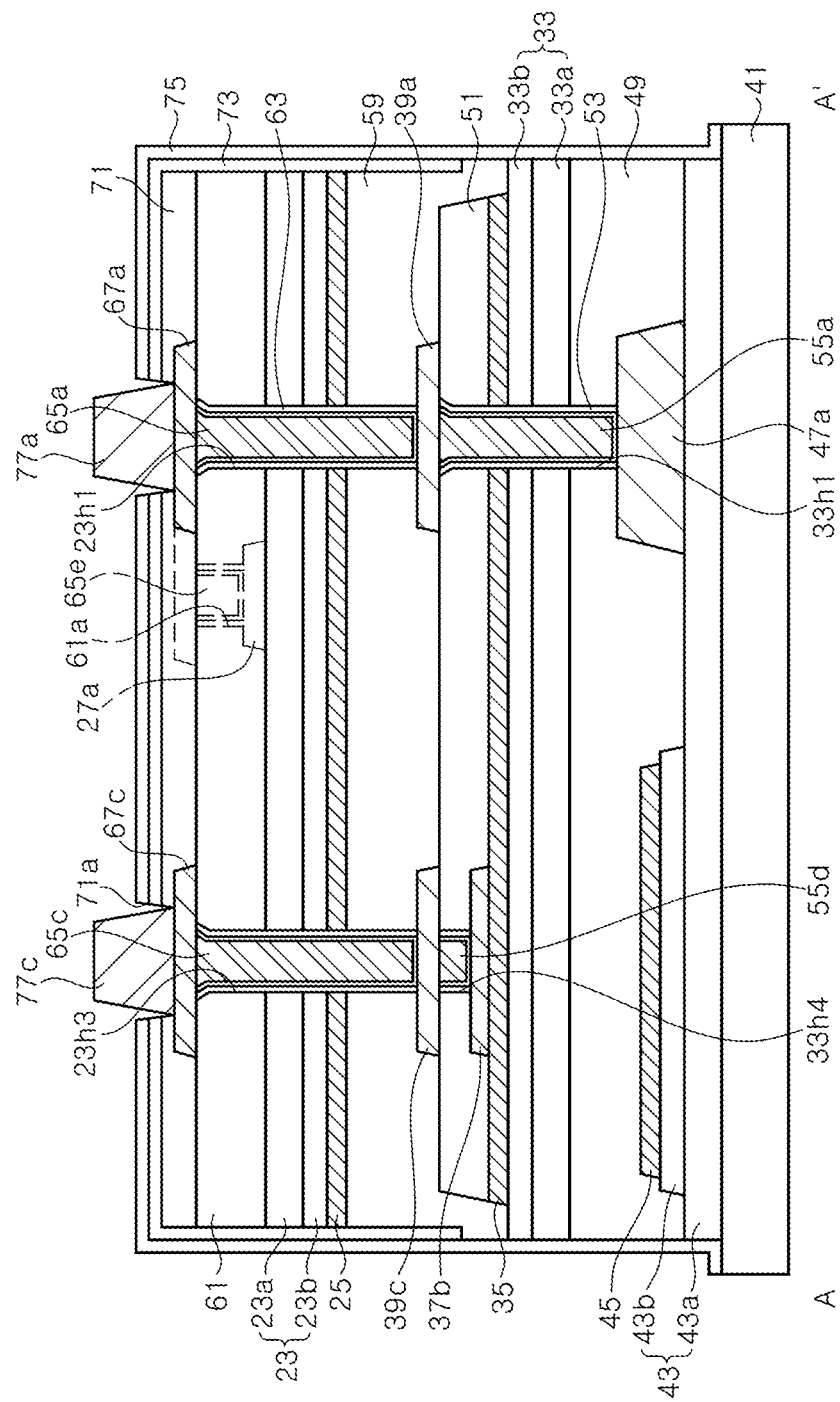
Figure 15C:
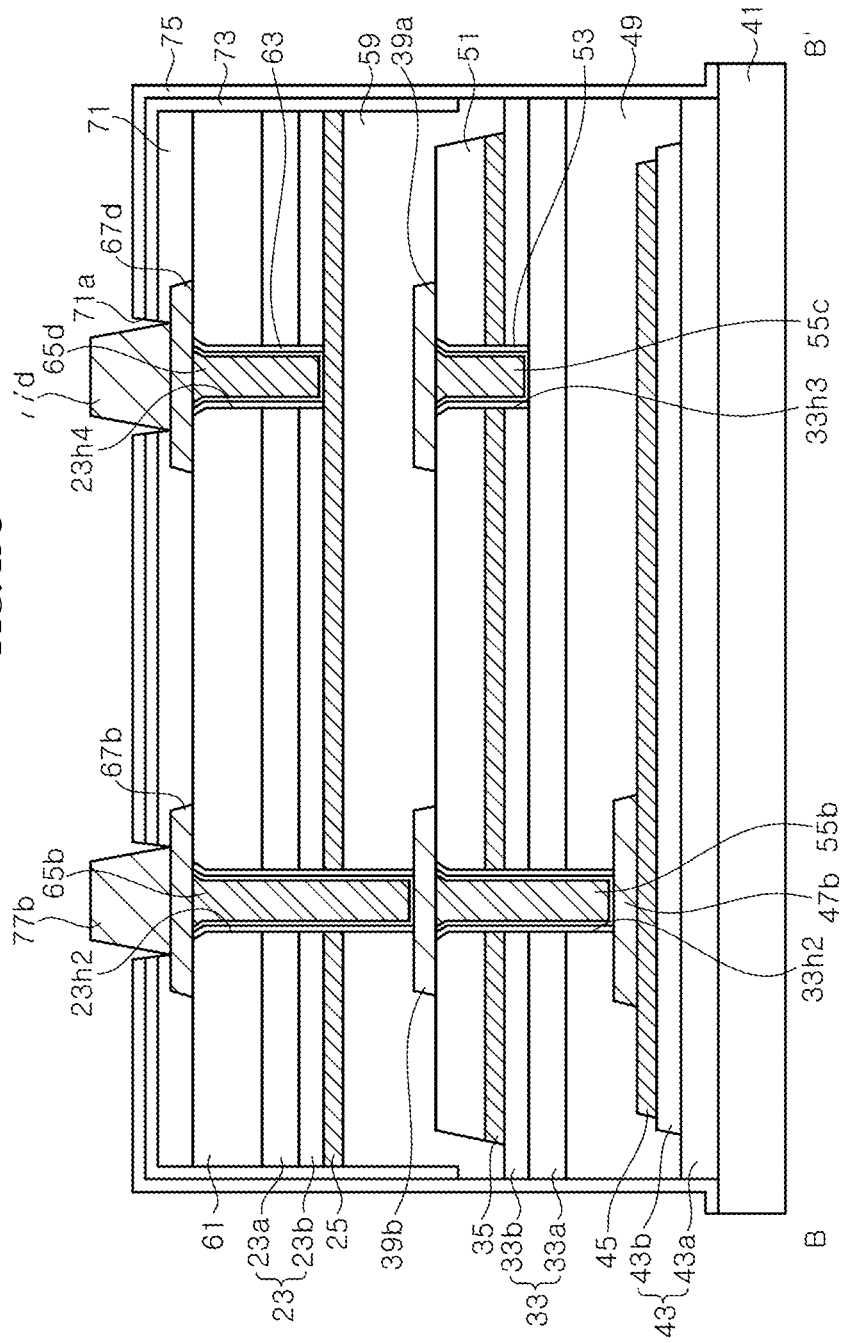

Referring to FIGS. 15A, 15B, and 15C, openings 71a exposing the upper connectors 67a, 67b, 67c, and 67d are formed by patterning the first, second, and third upper insulation layers 71, 73, and 75. The openings 71a may be formed using photolithography and etching techniques.

Subsequently, bump pads 77a, 77b, 77c, and 77d in the openings 71a may be formed. The first bump pad 77a is disposed on the first upper connector 67a, the second bump pad 77b is disposed on the second upper connector 67b, and the third bump pad 77c is disposed on the third upper connector 67c. The fourth bump pad 77d is disposed on the fourth upper connector 67d.

Accordingly, a plurality of light emitting devices 100 separated from one another is formed on the third substrate 41. The light emitting device 100 separated from the third substrate 41 is completed by bonding the light emitting device 100 onto a circuit board 101 and separating the substrate 41. A schematic cross-sectional view of the light emitting device 100 bonded to the circuit board 101 is exemplarily shown in FIG. 18, which will be described in detail later.

The exemplary embodiments achieve electrical connection using buried vias 55a, 55b, 55c, 55d, 65a, 65b, 65c, 65d, and 65e. Hereinafter, a process of forming the buried vias will be described in detail.

FIGS. 16A, 16B, 16C, and 16D are schematic cross-sectional views illustrating a process of forming a buried via according to an exemplary embodiment. Herein, the process of forming a buried via filling relatively deep through holes will be described.

Figure 16A:
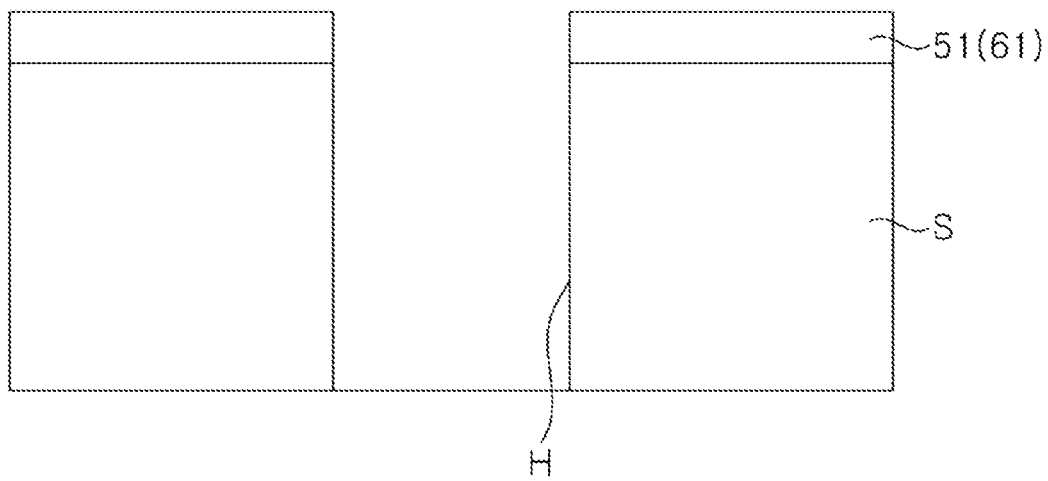
FIGS. 16A, 16B, 16C, and 16D are schematic cross-sectional views illustrating a process of forming a buried via according to an exemplary embodiment, where.

First, referring to FIG. 16A, a planarization layer 51 or 61 is formed on an underlying layer S. The underlying layer S may include a first LED stack 23 or a second LED stack 33. A hard mask defining an etching region is formed by patterning the planarization layer 51 or 61, and a through hole H may be formed using the hard mask as an etching mask. The through hole H may expose an element for electrical connection, for example, the third n-electrode pad 47a, the third p-electrode pad 47b, or the lower connectors 39a, 39b, and 39c.

Figure 16B:
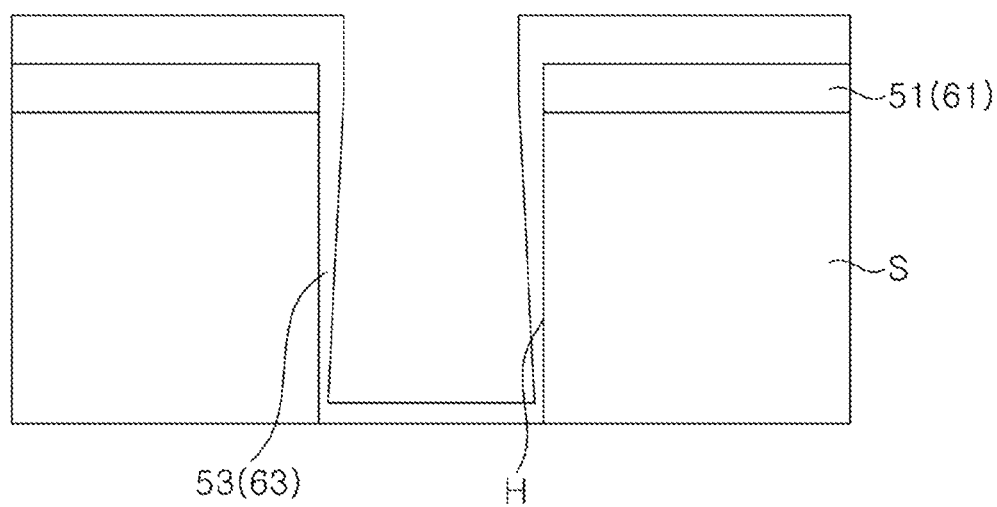

Referring to FIG. 16B, subsequently, a sidewall insulation layer 53 or 63 is formed. The sidewall insulation layer 53 or 63 may be formed on an upper surface of the planarization layer 51 or 61, and further, may be formed on a sidewall and a bottom of the through hole H. The sidewall insulation layer 53 or 63 may be formed thicker at an inlet than at the bottom of the through hole H due to a characteristic of layer coverage.

Figure 16C:
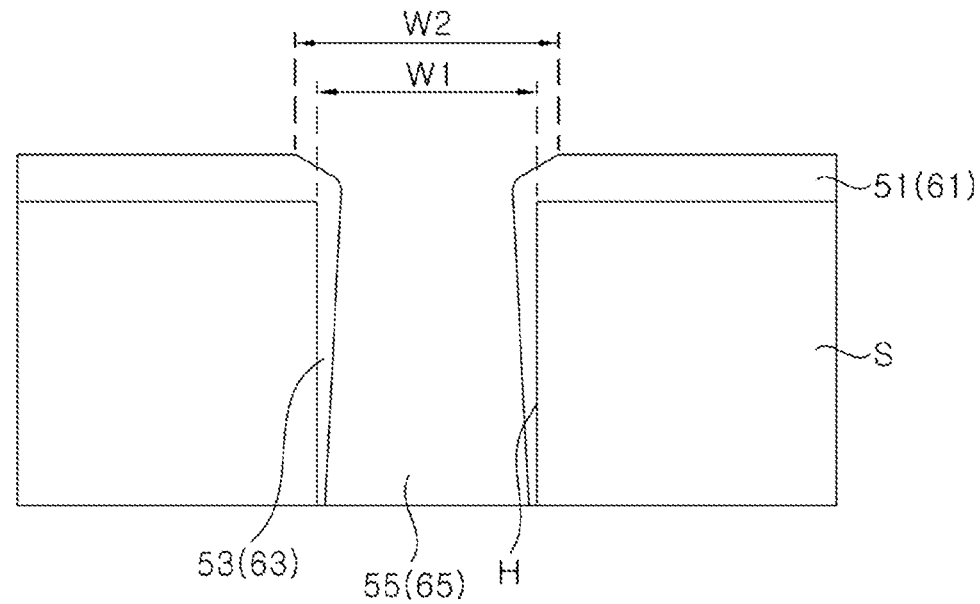

Referring to FIG. 16C, the sidewall insulation layer 53 or 63 is blanket etched using a dry etching technique. The sidewall insulation layer in which the through hole H is deposited on the bottom is removed by blanket etching, and the sidewall insulation layer disposed on the upper surface of the planarization layer 51 or 61 is also removed. Further, a portion of the planarization layer 51 or 61 near the inlet of the through hole H may also be removed. As such, a width W2 of the inlet may be larger than a width W1 of the through hole H. Since the width W2 of the inlet is increased, formation of a buried via using a plating technology in the future may be easier.

Figure 16D:
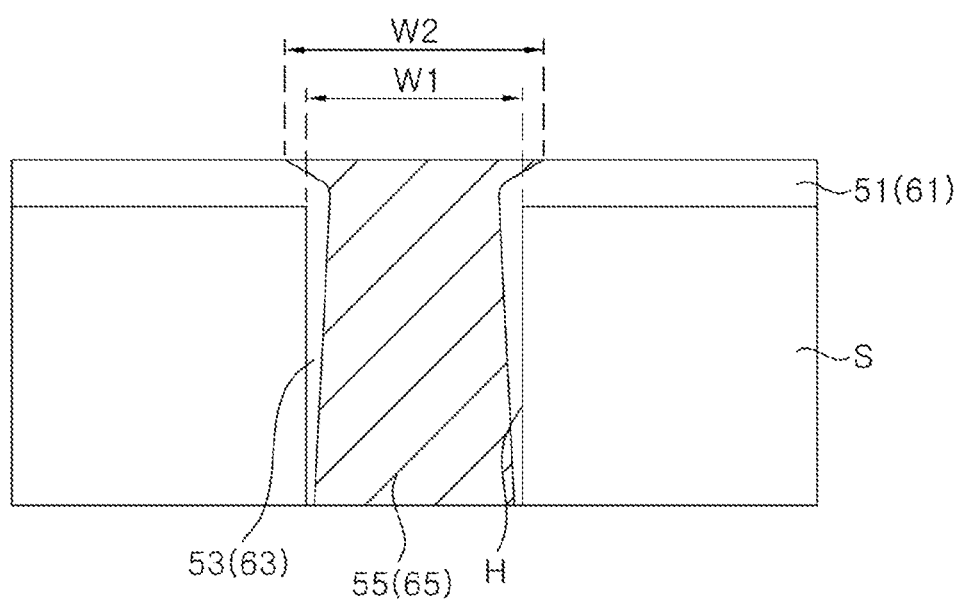

Referring to FIG. 16D, a seed layer may be formed in the planarization layer 51 or 61 and the through hole H, and a plating layer filling the through hole H may be formed using a plating technique. Subsequently, by removing the plating layer and the seed layer on the planarization layer 51 or 61 using a chemical etching technique, a buried via 55 or 65 as shown in FIG. 16D may be formed.

FIGS. 17A, 17B, 17C, and 17D are schematic cross-sectional views illustrating a process of forming a buried via according to an exemplary embodiment. Herein, the process of forming a buried via filling relatively low through holes will be described.

Figure 17A:
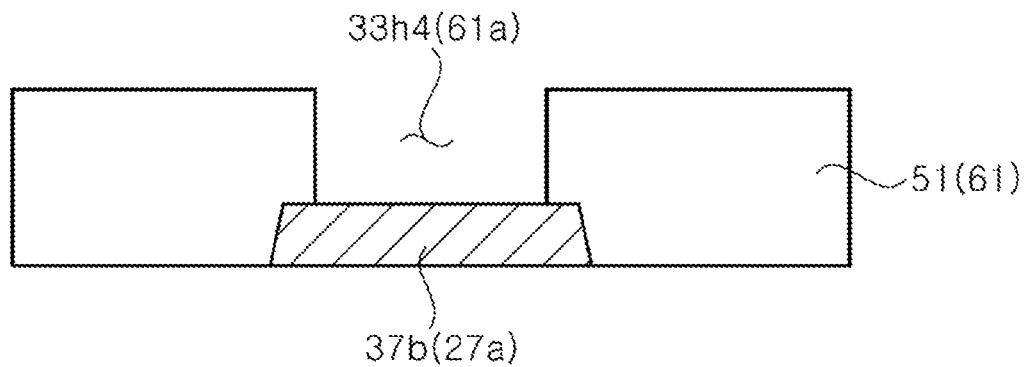
FIGS. 17A, 17B, 17C, and 17D are schematic cross-sectional views illustrating a process of forming a buried via according to an exemplary embodiment, where.

First, referring to FIG. 17A, a first or second planarization layer 51 or 61 covering a second p-electrode pad 37b or a first n-electrode pad 27a is formed. A through hole 33h4 or 61a is formed to expose the second p-electrode pad 37b or the first n-electrode pad 27a. Since the through hole 33h4 or 61a passing through these planarization layers 51 or 61 passes through only the planarization layer 51 or 61, a depth thereof is relatively small.

Figure 17B:
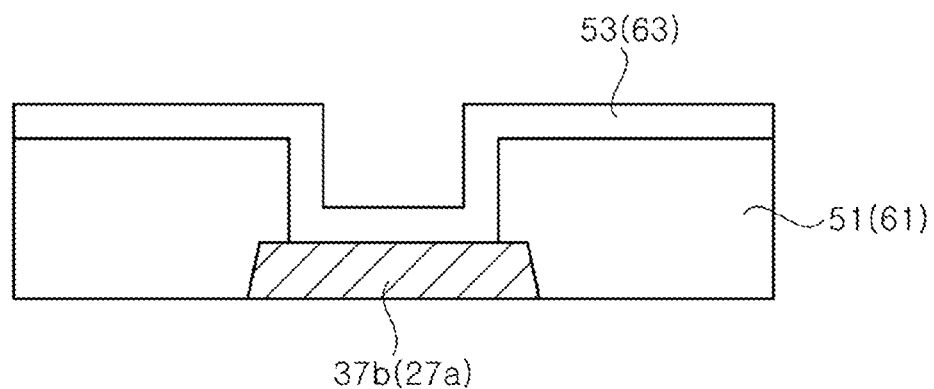

Referring to FIG. 17B, subsequently, a sidewall insulation layer 53 or 63 is formed. The sidewall insulation layer 53 or 63 may be formed on an upper surface of the planarization layer 51 or 61, and further, may be formed on a sidewall and a bottom of the through hole 33h4 or 61a. Since the depth of the through holes 33h4 or 61a is small, the sidewall insulation layer 53 or 63 may be formed to have a substantially uniform thickness on the bottom and the sidewall of the through holes 33h4 and 61a.

Figure 17C:
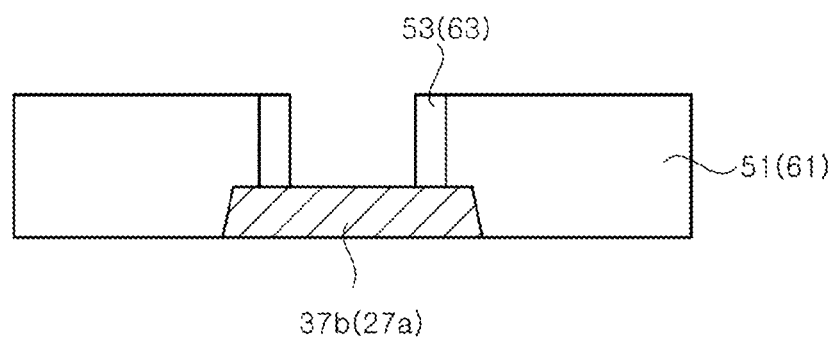

Referring to FIG. 17C, the sidewall insulation layer 53 or 63 is blanket etched using a dry etching technique. The sidewall insulation layer deposited on the bottom of the through hole 33h4 or 61a is removed by blanket etching, and the sidewall insulation layer disposed on the upper surface of the planarization layer 51 or 61 is removed.

Figure 17D:
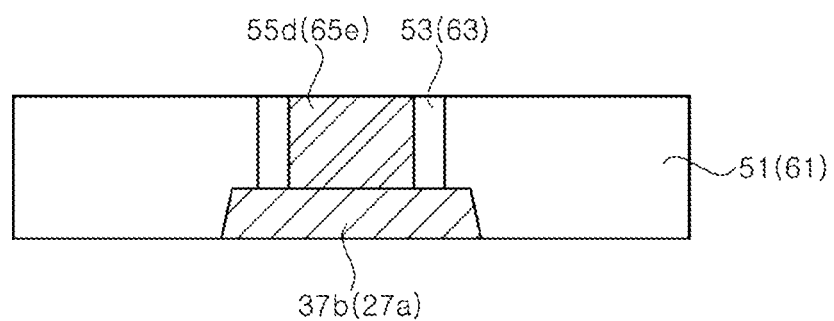

Referring to FIG. 17D, a seed layer may be formed in the planarization layer 51 or 61 and the through hole 33h4 or 61a, and a plating layer filling the through hole 33h4 or 61a may be formed using a plating technique. Subsequently, the plating layer and the seed layer on the planarization layer 51 or 61 are removed using a chemical etching technique to form a buried via 55d or 65e as shown in FIG. 17D. Herein, the buried via 55d or 65e may have substantially the same size of bottom and upper areas.

Figure 18:
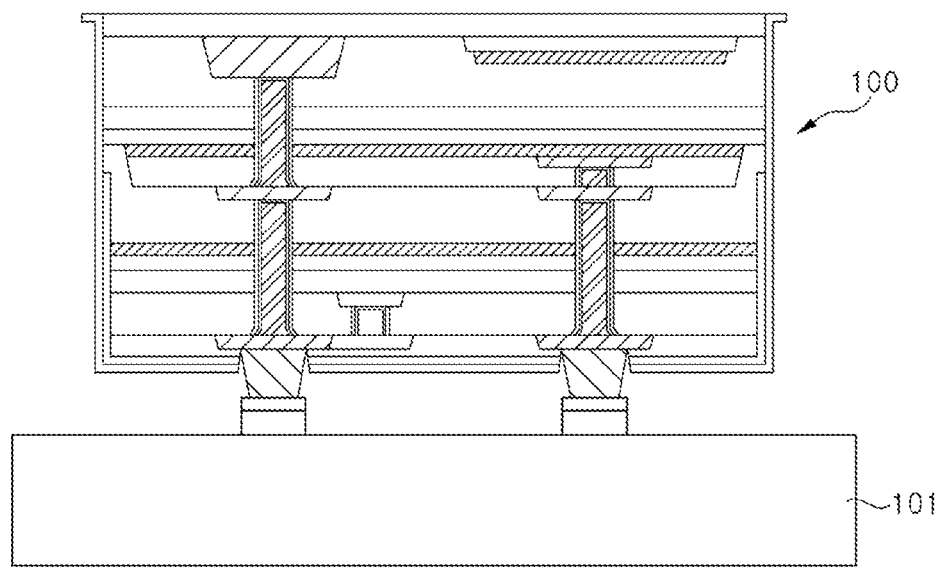
FIG. 18 is a schematic cross-sectional view illustrating a light emitting device bonded onto a circuit board.

FIG. 18 is a schematic cross-sectional view illustrating a light emitting device 100 bonded onto a circuit board.

The light emitting device 100 described above may be bonded onto the circuit board 101 using bump pads. FIG. 18 shows that a single light emitting device 100 is disposed on the circuit board 101, but a plurality of light emitting devices 100 is mounted on the circuit board 101. Each of the light emitting devices 100 constitutes one pixel capable of emitting blue light, green light, and red light, and a plurality of pixels is arranged on the circuit board 101 to provide a display panel.

Figure 19A:
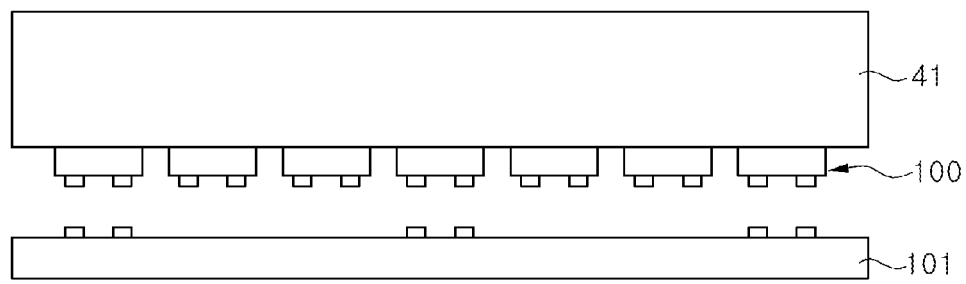
FIGS. 19A, 19B, and 19C are schematic cross-sectional views illustrating a method of transferring light emitting devices onto a circuit board according to an exemplary embodiment, where.
Figure 19B:
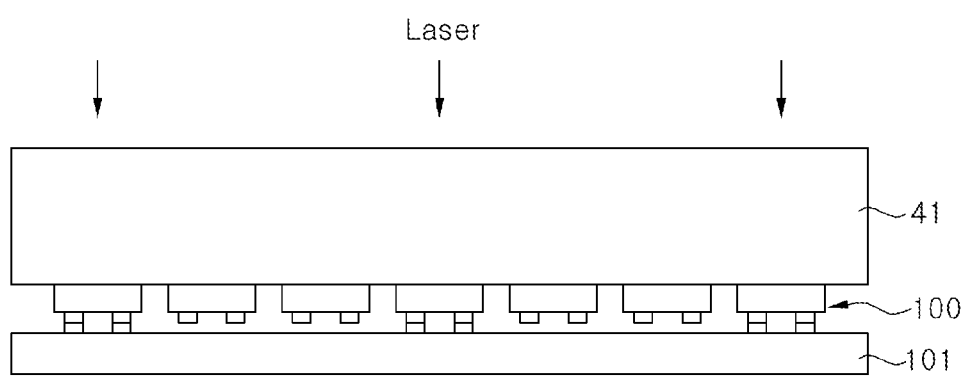
Figure 19C:
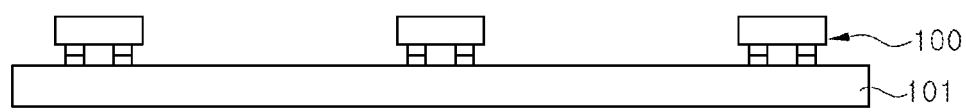

Meanwhile, the plurality of light emitting devices 100 may be formed together on a third substrate 41, and the light emitting devices 100 may be transferred onto the circuit board 101 in a group, not individually. FIGS. 19A, 19B, and 19C are schematic cross-sectional views illustrating a method of transferring the light emitting devices to the circuit board according to an exemplary embodiment. Hereinafter, a method of transferring the light emitting devices 100 formed on the third substrate 41 to the circuit board 101 in a group will be described.

Referring to FIG. 19A, as described in FIGS. 15A, 15B, and 15C, when the manufacturing process of the light emitting devices 100 on the third substrate 41 is completed, the plurality of light emitting devices 100 is isolated from one another and arranged on the third substrate 41 by a device isolation region.

Meanwhile, the circuit board 101 having pads on an upper surface thereof is provided. The pads are arranged on the circuit board 101 to correspond to locations where the pixels for a display are to be arranged. In general, an interval between the light emitting devices 100 arranged on the third substrate 41 may be more dense than that of the pixels on the circuit board 101.

Referring to FIG. 19B, bump pads of the light emitting devices 100 are selectively bonded to the pads on the circuit board 101. The bump pads and the pads may be bonded using solder bonding or In bonding, for example. In this case, the light emitting devices 100 located between pixel regions may be spaced apart from the circuit board 101, since these light emitting devices 100 do not have pads of the circuit board 101 to be boned to.

Subsequently, the third substrate 41 is irradiated with a laser. The laser is selectively irradiated onto the light emitting devices 100 bonded to the pads. To this end, a mask having openings for selectively exposing the light emitting devices 100 may be formed on the third substrate 41.

Thereafter, the light emitting devices 100 are transferred to the circuit board 101 by separating the light emitting devices 100 irradiated with the laser from the third substrate 41. Accordingly, as shown in FIG. 19C, the display panel in which the light emitting devices 100 are arranged on the circuit board 101 is provided. The display panel may be mounted on various display apparatuses as described with reference to FIG. 1.

Figure 20:
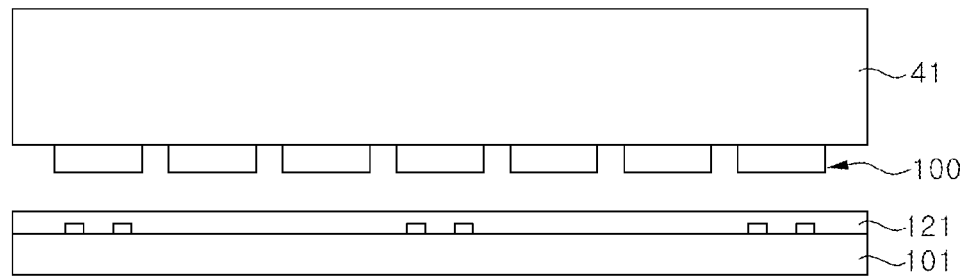
FIG. 20 is a schematic cross-sectional view illustrating a method of transferring light emitting devices onto a circuit board according to another exemplary embodiment.

FIG. 20 is a schematic cross-sectional view illustrating a method of transferring light emitting devices according to another exemplary embodiment.

Referring to FIG. 20, through the method of transferring the light emitting devices according to the exemplary embodiment, light emitting devices are bonded to pads using an anisotropic conductive adhesive film or an anisotropic conductive adhesive paste. That is, an anisotropic conductive adhesive film or adhesive paste 121 may be provided on the pads, and the light emitting devices 100 may be adhered to the pads through the anisotropic conductive adhesive film or adhesive paste 121. The light emitting devices 100 are electrically connected to the pads by the anisotropic conductive adhesive film or a conductive material in the adhesive paste 121.

In the exemplary embodiment, bump pads 77a, 77b, 77c, and 77d may be omitted, and upper connectors 67a, 67b, 67c, and 67d may be electrically connected to the pads through a conductive material.

Figure 21A:
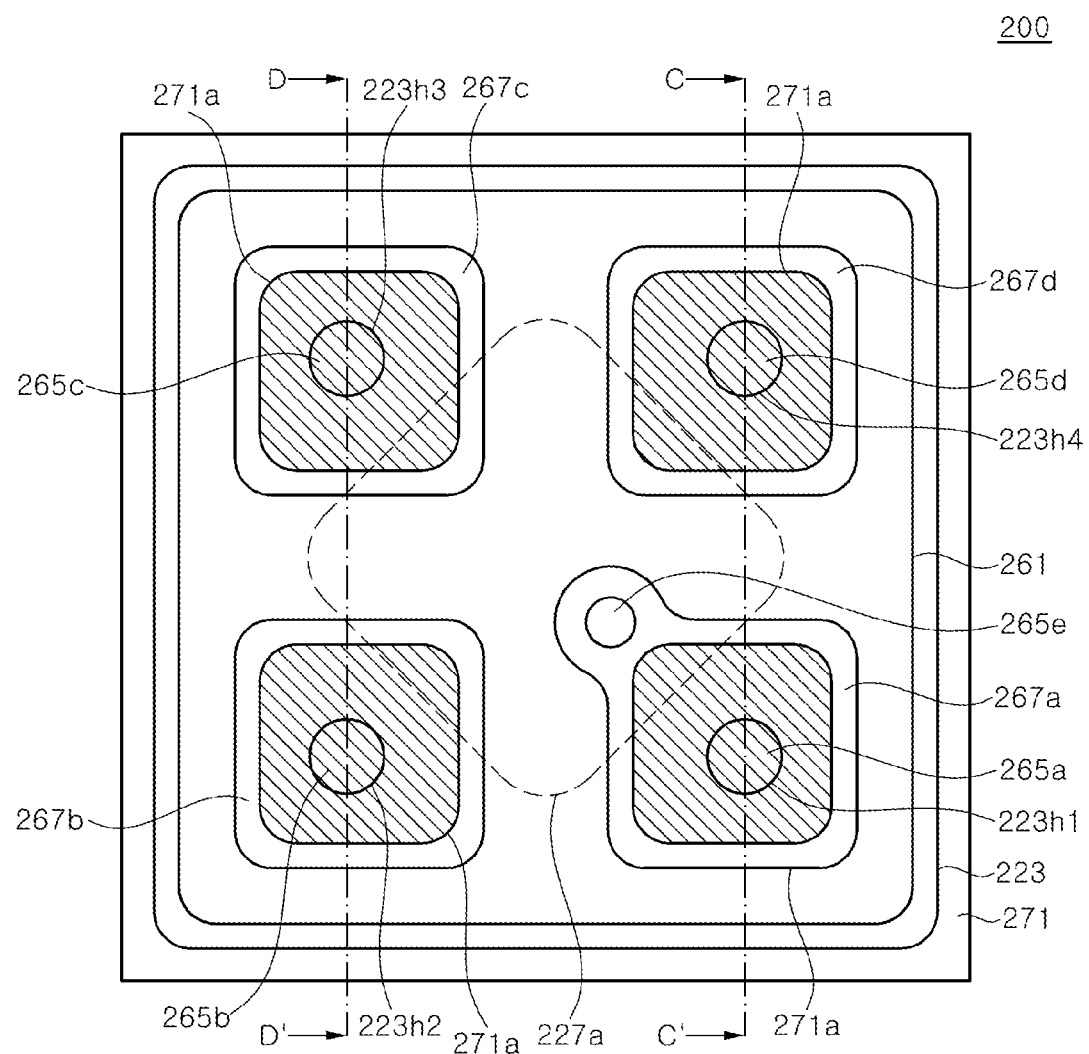
FIG. 21A is a schematic plan view illustrating a light emitting device according to another exemplary embodiment.
Figure 21B:
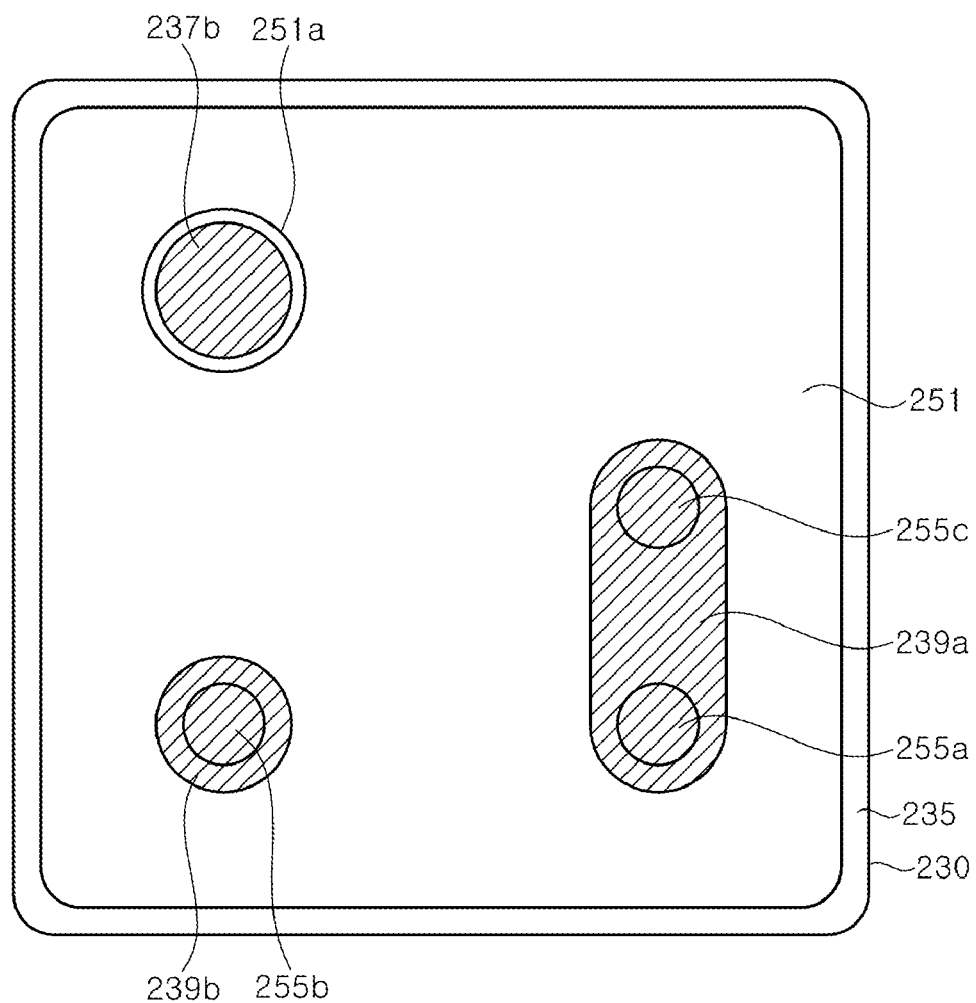
FIG. 21B represents a schematic plan view illustrating the light emitting device of FIG. 21A viewed downwardly from a second bonding layer.
Figure 21C:
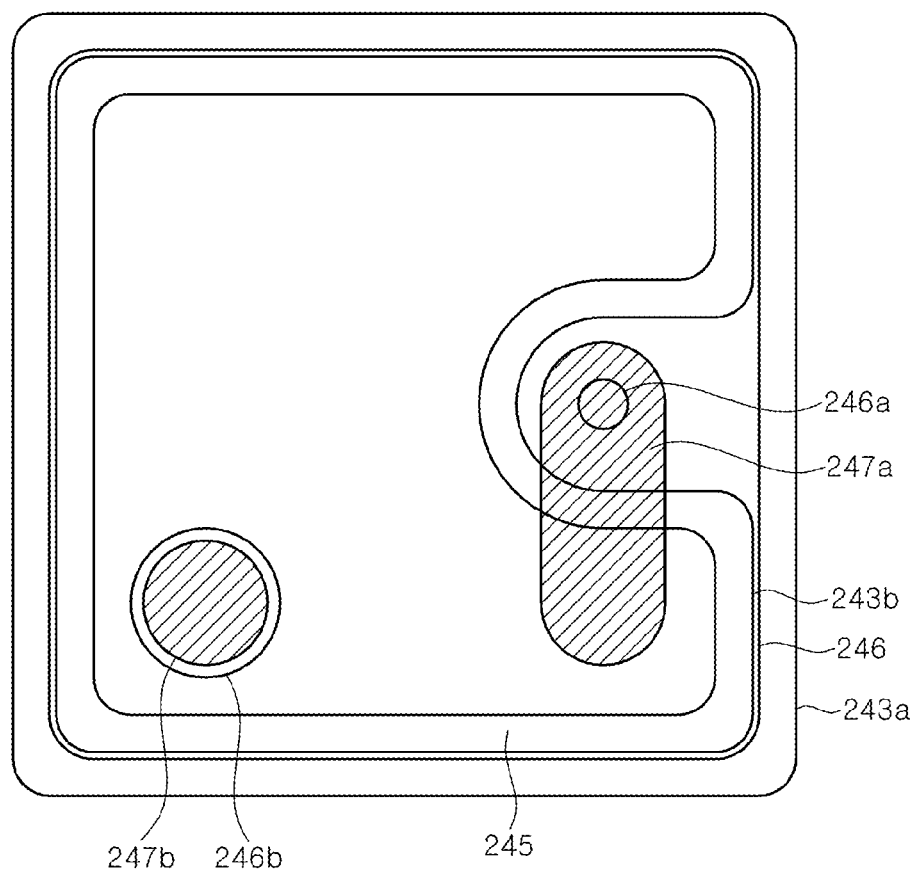
FIG. 21C represents a schematic plan view illustrating the light emitting device of FIG. 21A viewed downwardly from a first bonding layer.
Figure 22A:
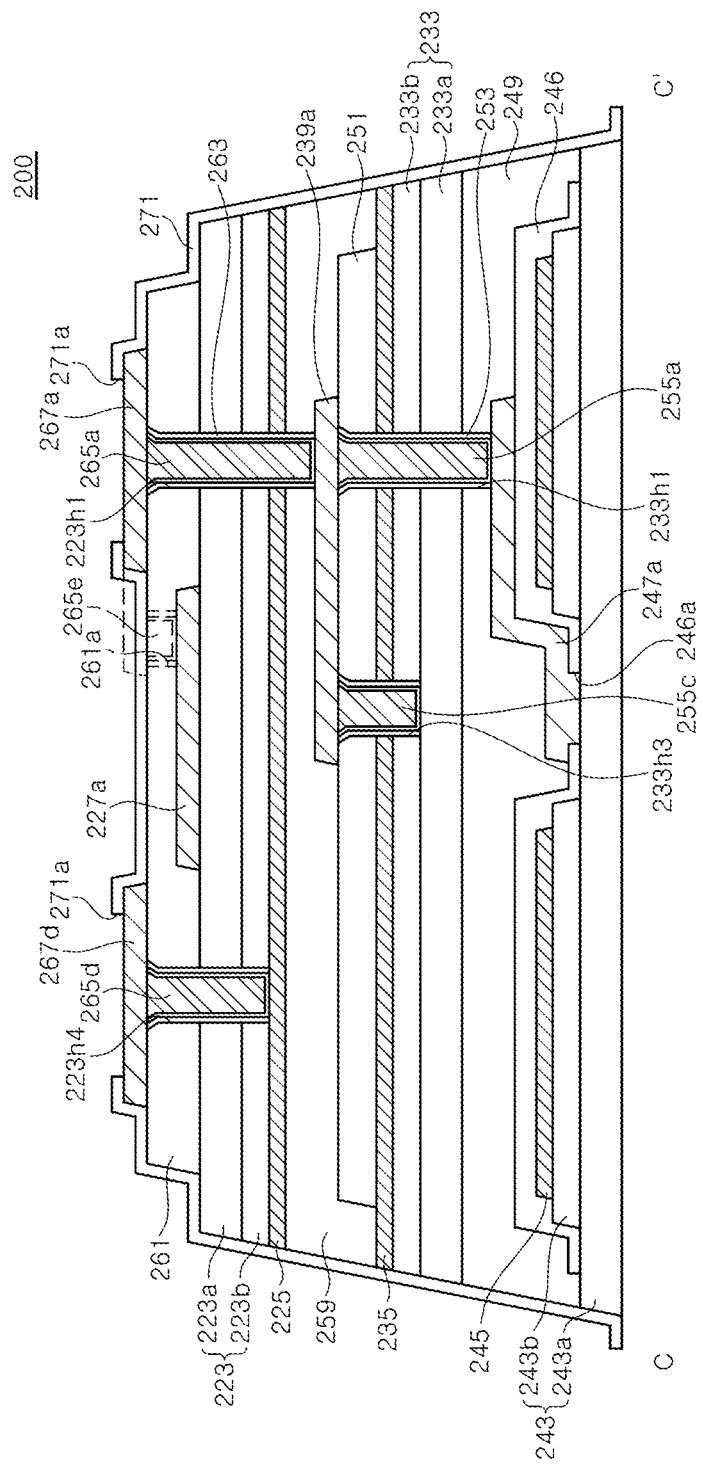
FIG. 22A is a schematic cross-sectional view taken along lines A-A' of FIG. 21A.
Figure 22B:
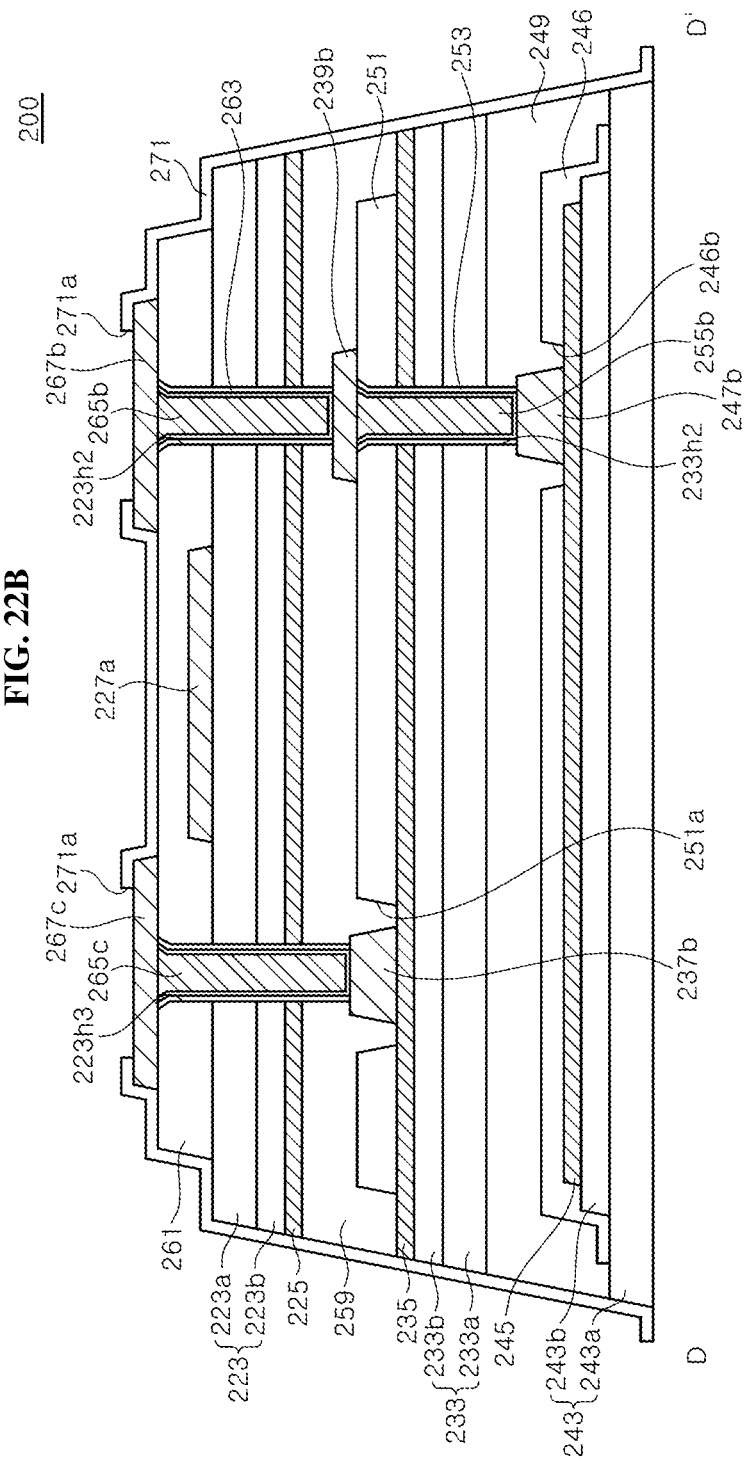
FIG. 22B is a schematic cross-sectional view taken along lines B-B' of FIG. 21A.

FIG. 21A is a schematic plan view illustrating a light emitting device 200 according to another exemplary embodiment, FIG. 21B represents a schematic plan view illustrating the light emitting device of FIG. 21A viewed from a region over a second LED stack before a second bonding layer is formed, and FIG. 21C represents a schematic plan view illustrating the light emitting device of FIG. 21A viewed from a region over a third LED stack before a first bonding layer is formed. Meanwhile, FIGS. 22A and 22B are schematic cross-sectional views taken along lines A-A' and B-B' of FIG. 21A, respectively.

Referring to FIGS. 21A, 21B, 21C, 22A, and 22B, the light emitting device 200 may include a first LED stack 223, a second LED stack 233, a third LED stack 243, a first transparent electrode 225, a second transparent electrode 235, a third transparent electrode 245, a first n-electrode pad 227a, a second p-electrode pad 237b, a third n-electrode pad 247a, a third p-electrode pad 247b, a first, and a second lower connectors 239a and 239b, lower buried vias 255a, 255b, and 255c, upper buried vias 265a, 265b, 265c, 265d, and 265e, a first sidewall insulation layer 253, a first. a second, a third, and a fourth upper connectors 267a, 267b, 267c, and 267d, a first bonding layer 249, a second bonding layer 259, an upper insulation layer 271, a first planarization layer 251, and a second planarization layer 261. Further, the light emitting device 200 may include through holes 223h1, 223h2, 223h3, and 223h4 passing through the first LED stack 223, through holes 233h1 and 233h2 passing through the second LED stack 233, and a through hole 233h3 partially passing through the second LED stack 233.

As described with reference to FIGS. 4A and 4B, the first to third LED stacks 223, 233, and 243 are stacked in a vertical direction. Each of the LED stacks 223, 233, and 243 is grown on a different growth substrate from one another, but the growth substrates may not remain on the final light emitting device 200 and may be all removed. Therefore, the light emitting device 200 does not include the growth substrates. However, the inventive concepts are not necessarily limited thereto, and at least one growth substrate may be included.

Each of the first LED stack 223, the second LED stack 233, and the third LED stack 243 includes a first conductivity type semiconductor layer 223a, 233a, or 243a, a second conductivity type semiconductor layer 223b, 233b, or 243b, and an active layer (not shown in the drawing) interposed therebetween. In particular, the active layer may have a multiple quantum well structure.

The second LED stack 233 is disposed under the first LED stack 223, and the third LED stack 243 is disposed under the second LED stack 233, as shown in FIG. 22A and FIG. 22B. Light generated in the first, second, and third LED stacks 223, 233, and 243 is finally emitted to the outside through the third LED stack 243.

Since the first LED stack 223, the second LED stack 233, and the third LED stack 243 are similar to the first LED stack 23, the second LED stack 33, and the third LED stack 43 described with reference to FIGS. 3, 4A, and 4B, repeated detailed descriptions thereof will be omitted to avoid redundancy.

The first transparent electrode 225 may be disposed between the first LED stack 223 and the second LED stack 233. Since the first transparent electrode 225 is similar to the first transparent electrode 25 described with reference to FIGS. 3, 4A, and 4B, a detailed description thereof will be omitted to avoid redundancy.

Meanwhile, the second transparent electrode 235 is in ohmic contact with the second conductivity type semiconductor layer 233b of the second LED stack 233. As illustrated in FIG. 22B, the second transparent electrode 235 contacts an upper surface of the second LED stack 233 between the first LED stack 223 and the second LED stack 233. The second transparent electrode 235 may be formed of a metal layer or a conductive oxide layer transparent to red light. The conductive oxide layer may include $SnO_2$, $InO_2$, ITO, ZnO, IZO, or the like. In particular, the second transparent electrode 235 may be formed of ITO. In some forms, a side surface of the second transparent electrode 235 may be recessed inwardly than a side surface of the second LED stack 233 as illustrated in FIGS. 4A and 4B, but the inventive concepts are not limited thereto. In other forms, as illustrated in FIGS. 22A and 22B, an outer side surface of the second transparent electrode 235 may be substantially flush with a side surface of the second conductivity type semiconductor layer 233b. As such, the side surface of the second transparent electrode 235 may not be covered with the second bonding layer 259, but may be covered with the upper insulation layer 271.

The third transparent electrode 245 is in ohmic contact with the second conductivity type semiconductor layer 243b of the third LED stack 243. The third transparent electrode 245 may be located between the second LED stack 233 and the third LED stack 243, and contacts an upper surface of the third LED stack 243. The third transparent electrode 245 may be formed of a metal layer or a conductive oxide layer transparent to red light and blue light. The conductive oxide layer may include $SnO_2$, $InO_2$, ITO, ZnO, IZO, or the like. In particular, the third transparent electrode 245 may be formed of ITO.

The third transparent electrode 245 is similar to the third transparent electrode 45 described with reference to FIGS. 3, 4A, and 4B, and detailed descriptions thereof will be omitted to avoid redundancy.

The first n-electrode pad 227a is in ohmic contact with the first conductivity type semiconductor layer 223a of the first LED stack 223. The first n-electrode pad 227a may include, for example, AuGe or AuTe. In the illustrated exemplary embodiment, the first n-electrode pad 227a may be disposed in a central region of the first LED stack 223. The first n-electrode pad 227a may have a relatively larger area than that of the first n-electrode pad 27a described with reference to FIGS. 3, 4A, and 4B. For example, the area of the first n-electrode pad 227a may exceed ⅕ of that of the first LED stack 223. Further, as illustrated in FIG. 21A, the first n-electrode pad 227a may have a substantially similar rectangular shape to that of the light emitting device 200, but it may be disposed to rotate 45 degrees with respect to the light emitting device 200. Since the first n-electrode pad 227a is formed over a large area, current spread may be facilitated, and reflectance of light generated in the first LED stack 223 may be increased.

The insulation layer 246 may be disposed on the third LED stack 243, and may cover the second conductivity type semiconductor layer 243b and the third transparent electrode 245. The insulation layer 246 may have openings 246a and 246b exposing the first conductivity type semiconductor layer 243a and the third transparent electrode 245, as shown in FIG. 22B.

The third n-electrode pad 247a is in ohmic contact with the first conductivity type semiconductor layer 243a of the third LED stack 243. In the illustrated exemplary embodiment, the third n-electrode pad 247a may contact the first conductivity type semiconductor layer 243a exposed through the second conductivity type semiconductor layer 243b, and further, may extend upwards to an upper region of the second conductivity type semiconductor layer 243b, as shown in FIG. 22A. That is, as illustrated in FIGS. 21C and 22A, the third n-electrode pad 247a is connected to the first conductivity type semiconductor layer 243a exposed to a mesa etching region through the opening 246a of the insulation layer 246, and a portion thereof is disposed over the third transparent electrode 245. The third n-electrode pad 247a is insulated from the third transparent electrode 245 and the second conductivity type semiconductor layer 243b by the insulation layer 246.

As the third n-electrode pad 247a extends from the mesa etching region to the upper region of the second conductivity type semiconductor layer 243b, the third n-electrode pad 247 does not need to be formed thick as described with reference to FIGS. 4A and 4B. As such, the third n-electrode pad 247a may be formed together with the third p-electrode pad 247b through an identical process.

As shown in FIG. 22B, the third p-electrode pad 247b may be electrically connected to the third transparent electrode 245 through the opening 246b of the insulation layer 246. The third p-electrode pad 247b may be disposed in the opening 246b, but the inventive concepts are not limited thereto, and may cover the opening 246b and extend to an upper region of the insulation layer 246. The third p-electrode pad 247b may be formed of an identical material as that of the third n-electrode pad 247a.

An upper surface of the third p-electrode pad 247b is located at substantially the same elevation as that of the third n-electrode pad 247a, and thus, when the through holes 233h1 and 233h2 are formed, the third p-electrode pad 247b and the third n-electrode pad 247a may be set to be exposed at the same time.

The second p-electrode pad 237b is disposed on the second transparent electrode 235. The second p-electrode pad 237b may be connected to the second transparent electrode 235, and may be electrically connected to the second conductivity type semiconductor layer 235b through the second transparent electrode 235. The second p-electrode pad 237b may be formed of a metallic material.

In the exemplary embodiment described with reference to FIGS. 3, 4A, and 4B, the second p-electrode pad 37b is formed before the first planarization layer 51 is formed, and is covered with the first planarization layer 51. The second p-electrode pad 37b is exposed through the through hole 33h4 formed in the first planarization layer 51, and is electrically connected to the third lower connector 39c through the lower buried via 55d.

However, in the present exemplary embodiment, the second p-electrode pad 237b may be formed in an opening 251a after the opening 251a is formed by patterning the first planarization layer 251. Accordingly, in the present exemplary embodiment, the lower buried via 55d or the third lower connector 39c is omitted, and the upper buried via 265c may be directly connected to the second p-electrode pad 237b. In addition, the second p-electrode pad 237b may be formed together with the lower connectors 239a and 239b in some forms. However, the inventive concepts are not limited thereto, and the second p-electrode pad 237b may be formed through a separate process from that of the lower connectors 239a and 239b in other forms.

Since the first bonding layer 249 and the second bonding layer 259 are similar to the first bonding layer 49 and the second bonding layer 59 described with reference to FIGS. 3, 4A, and 4B, detailed descriptions thereof will be omitted to avoid redundancy.

The first planarization layer 251 may be disposed on the second LED stack 233. The first planarization layer 251 may be continuous. The first planarization layer 251 may be disposed in an upper region of the second conductivity type semiconductor layer 233b, and may be recessed inwardly from an edge of the second LED stack 233. In the illustrated exemplary embodiment, the second transparent electrode 235 may be exposed along a side surface of the first planarization layer 251. However, the inventive concepts are not limited thereto, and the second transparent electrode 235 may also be recessed inwardly from the edge of the second LED stack 233 along with the first planarization layer 251.

The through holes 233h1 and 233h2 may pass through the first planarization layer 251, the second transparent electrode 235, the second LED stack 233, and the first bonding layer 249 to expose the third n-electrode pad 247a and the third p-electrode pad 247b. The through hole 233h3 may pass through the first planarization layer 251, the second transparent electrode 235, and the second conductivity type semiconductor layer 233b to expose the first conductivity type semiconductor layer 233a. As described above, the through hole 33h4 is omitted in the illustrated exemplary embodiment.

The first sidewall insulation layer 253 covers sidewalls of the through holes 233h1, 233h2, and 233h3, and has openings exposing bottoms of the through holes. The first sidewall insulation layer 253 may be formed using, for example, a chemical vapor deposition technique or an atomic layer deposition technique, and may be formed of, for example, $Al_2O_3$, $SiO_2$, $Si_3N_4$, or the like.

Since the lower buried vias 255a, 255b, and 255c are similar to the lower buried vias 55a, 55b, and 55c described with reference to FIGS. 3, 4A, and 4B, detailed descriptions thereof will be omitted to avoid redundancy.

The opening 251a may be formed using photolithography and etching processes after the lower buried vias 255a, 255b, and 255c are formed, and at this time, a side surface of the first planarization layer 251 may also be recessed.

The lower connectors 239a and 239b may be disposed on respective regions of the first planarization layer 251. The first lower connector 239a may be electrically connected to the lower buried via 255a, and may extend in the lateral direction to be electrically connected to the lower buried via 255c. Accordingly, the first conductivity type semiconductor layer 243a of the third LED stack 243 and the first conductivity type semiconductor layer 233a of the second LED stack 233 may be commonly electrically connected. The first lower connector 239a may cover the lower buried vias 255a and 255c (see FIG. 21B).

The second lower connector 239b is electrically connected to the lower buried via 255b. The second lower connector 239b may cover the lower buried via 255b.

In the illustrated exemplary embodiment, both the first and second lower connectors 239a and 239b are disposed on the first planarization layer 251. The first and second lower connectors 239a and 239b may be formed together through an identical process, and thus, elevations of upper surfaces thereof may be identical to each other. Meanwhile, the second p-electrode pad 237b may be formed together with the first and second lower connectors 239a and 239b. However, the second p-electrode pad 237b may be formed in the opening 251a of the first planarization layer 251 and may have an elevation lower than those of the first and second lower connectors 239a and 239b, as shown in FIG. 22B.

The second planarization layer 261 covers the first LED stack 223. The second planarization layer 261 may have a flat upper surface as that of the first planarization layer 251. The second planarization layer 261 may be formed of an aluminum oxide layer, a silicon oxide layer, or a silicon nitride layer. The second planarization layer 261 may be formed as a single layer or multiple layers. Furthermore, the second planarization layer 261 may be formed of a distributed Bragg reflector. The second planarization layer 261 may have an opening 261a exposing the first n-electrode pad 227a, as shown in FIG. 22A. The second planarization layer 261 may be recessed inwardly from an edge of the first LED stack 223.

Meanwhile, the through holes 223h1, 223h2, 223h3 and 223h4 pass through the second planarization layer 261 and the first LED stack 223. Further, the through holes 223h1, 223h2, and 223h3 may pass through the first transparent electrode 225 and the second bonding layer 259 to expose the lower connectors 239a and 239b and the second p-electrode pad 237b, and the through hole 223h4 may expose the first transparent electrode 225. For example, the through hole 223h1 is formed to provide a passage for allowing electrical connection to the lower buried via 255a, the through hole 223h2 is formed to provide a passage for allowing electrical connection to the lower buried via 255b, and the through hole 223h3 is formed to provide a passage for allowing electrical connection to the second p-electrode pad 237b.

Meanwhile, the through hole 223h4 is formed to provide a passage for allowing electrical connection to the first transparent electrode 225. In some forms, the through hole 223h4 does not pass through the first transparent electrode 225. However, the inventive concepts are not limited thereto, and in other forms, the through hole 223h4 may pass through the first transparent electrode 225 as long as it provides the passage for electrical connection to the first transparent electrode 225.

The second sidewall insulation layer 263 covers sidewalls of the through holes 223h1, 223h2, 223h3, and 223h4, and has openings exposing bottoms of the through holes. The second sidewall insulation layer 263 may also cover a sidewall of the opening 261a, and may have an opening exposing the first n-electrode pad 227a. The second sidewall insulation layer 263 may be formed using, for example, a chemical vapor deposition technique or an atomic layer deposition technique, and may be formed of, for example, $Al_2O_3$, $SiO_2$, $Si_3N_4$, or the like.

The upper buried vias 265a, 265b, 265c, and 265d may fill the through holes 223h1, 223h2, 223h3 and 223h4, respectively, and the upper buried via 265e may fill the opening 261a. The upper buried vias 265a, 265b, 265c, and 265d are electrically insulated from the first LED stack 223 by the second sidewall insulation layer 263.

The upper buried via 265a may be electrically connected to the lower buried via 255a through the first lower connector 239a, and the upper buried via 265b may be electrically connected to the lower buried via 255b through the second lower connector 239b, and the upper buried via 265c may be directly electrically connected to the second p-electrode pad 237b. In addition, the upper buried via 265d may be electrically connected to the first transparent electrode 225. The upper buried vias 265a and 265b may be disposed to be overlapped with the lower buried vias 255a and 255b, respectively. In addition, the upper buried via 265c may be disposed to be overlapped with the second p-electrode pad 237b. Meanwhile, the upper buried via 265d is spaced apart from the lower buried via 255c. The upper buried via 265d may be disposed over the lower buried vias 255c to be overlapped with the lower buried vias 255c, but as illustrated in FIG. 22A, the upper buried via 265d may be spaced apart from the lower buried via 255c in the lateral direction.

Since the upper buried vias 265a, 265b, 265c, 265d, and 265e may be manufactured similarly to those of the exemplary embodiment described with reference to FIGS. 3, 4A, and 4B, detailed descriptions thereof will be omitted. The upper buried vias 265a, 265b, 265c, 265d, and 265e may be substantially flush with the second planarization layer 261 which may be formed together through an identical process. However, the inventive concepts are not limited to the present exemplary embodiment, and the upper buried vias 265a, 265b, 265c, 265d, and 265e may be formed through different processes from one another.

The first upper connector 267a, the second upper connector 267b, the third upper connector 267c, and the fourth upper connector 267d are disposed on the second planarization layer 261. The first upper connector 267a may be electrically connected to the upper buried via 265a and the upper buried via 265e, the second upper connector 267b may be electrically connected to the upper buried via 265b, the third upper connector 267c may be electrically connected to the upper buried via 265c, and the fourth upper connector 267d may be electrically connected to the upper buried via 265d. As illustrated, the first, second, third, and fourth upper connectors 267a, 267b, 267c, and 267d may cover the upper buried vias 265a, 265b, 265c, and 265d, respectively. Further, the first upper connector 267a may cover the upper buried via 265e filling the opening 261a of the second planarization layer 261. As such, the first conductivity type semiconductor layers 223a, 233a, and 243a of the first, second, and third LED stacks 223, 233, and 243 can be commonly electrically connected to one another.

The first upper connector 267a, the second upper connector 267b, the third upper connector 267c, and the fourth upper connector 267d may be formed of an identical material in an identical process, for example, Ni/Au/Ti.

The upper insulation layer 271 may cover the second planarization layer 261, and may cover the first, second, third, and fourth upper connectors 267a, 267b, 267c, and 267d. The upper insulation layer 271 may also cover side surfaces of the first LED stack 223, the second LED stack 233, the third LED stack 243, the first bonding layer 249, and the second bonding layer 259. Furthermore, the upper insulation layer 271 may cover side surfaces of the first and second transparent electrodes 225 and 235. The upper insulation layer 271 may be formed of an insulation layer such as a silicon oxide layer, a silicon nitride layer, an aluminum oxide layer, or the like. To improve a layer covering characteristic of the upper insulation layer 271, a side surface of the light emitting device 200 may be inclined as illustrated in FIGS. 22A and 22B.

The upper insulation layer 271 may have openings 271a exposing the first, second, third, and fourth upper connectors 267a, 267b, 267c, and 267d. The openings 271a may be generally disposed on flat surfaces of the first upper connector 267a, the second upper connector 627b, the third upper connector 267c, and the fourth upper connector 267d.

In the illustrated exemplary embodiment, bump pads 77a, 77b, 77c, and 77d may be omitted, and the light emitting device 200 may be bonded onto a circuit board using the first, second, third, and fourth upper connectors 267a, 267b, 267c, and 267d exposed through the openings 271a. However, the inventive concepts are not limited thereto, and as described with reference to FIGS. 3, 4A, and 4B, the first, second, third, and fourth bump pads 77a, 77b, 77c, and 77d may be disposed on the first, second, third, and fourth upper connectors 267a, 267b, 267c, and 267d exposed to the openings 271a, respectively, Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus, comprising:
a circuit board; and
a light emitting device disposed on the circuit board,
wherein the light emitting device includes:
a first light source including a first semiconductor layer and a first transparent electrode;
a second light source including a second semiconductor layer and a second transparent electrode;
a third light source disposed between the first light source and the second light source and including a third semiconductor layer and a third transparent electrode;
a planar layer covering the first light source, the second light source and the third light source;
a first bump; and
a first connector disposed between the first bump and the first semiconductor layer,
wherein a center between two opposite edges of the first connector is shifted from a center between two opposite edges of the first bump,
wherein the first connector includes a first contact region and a second contact region spaced apart from each other by a single layer, and
wherein the single layer includes an opening including an inlet that has a width increases along a thickness direction.

2. The light emitting apparatus of claim 1, wherein the second light source includes a second bump and a second connector, and a center between two opposite edges of the second connector is shifted from a center between two opposite edges of the second bump.

3. The light emitting apparatus of claim 2, wherein the third light source includes a third bump and a third connector, and a center between two opposite edges of the third connector is shifted from a center between two opposite edges of the third bump.

4. The light emitting apparatus of claim 1, wherein the first connector includes a protrusion region on the first transparent electrode.

5. The light emitting apparatus of claim 2, wherein the second transparent electrode includes a recess region.

6. A light emitting apparatus, comprising:
a circuit board; and
a first light source disposed on the circuit board and including a first semiconductor layer and a first transparent electrode;
a second light source disposed on the circuit board and including a second semiconductor layer and a second transparent electrode;
a third light source disposed on the circuit board and including a third semiconductor layer and a third transparent electrode;
a planar layer disposed on the first light source, the second light source, and the third light source;
a first bump; and
a first connector disposed between the first bump and the first semiconductor layer,
wherein a center between two opposite sides of the first connector is shifted from a center between two opposite sides of the first bump,
wherein the first connector includes a first contact region and a second contact region spaced apart from each other by a single layer, and wherein the single layer includes an opening including an inlet that has a width increasing along a thickness direction.

7. The light emitting apparatus of claim 6, wherein the second light source includes a second bump and a second connector, and a center between two opposite sides of the second connector is shifted from a center between two opposite sides of the second bump.

8. The light emitting apparatus of claim 7, wherein the third light source includes a third bump and a third connector, and a center between two opposite side of the third connector is shifted from a center between two opposite sides of the third bump.

9. The light emitting apparatus of claim 6, wherein the first connector includes a protrusion region on the first transparent electrode.

10. The light emitting apparatus of claim 7, wherein the second transparent electrode includes a recess region.

11. A light emitting apparatus, comprising:
a circuit board; and
a first light source disposed on the circuit board and including a first semiconductor layer and a first transparent electrode;
a second light source disposed on the circuit board and including a second semiconductor layer and a second transparent electrode;
a third light source disposed on the circuit board and including a third semiconductor layer and a third transparent electrode;
a planar layer disposed on the first light source, the second light source, and the third light source;
a first bump; and
a first connector disposed between the first bump and the first semiconductor layer,
wherein a center between two opposite sides of the first connector is disposed outside a center between an first side and an opposite side of the first bump,
wherein the first connector includes a first contact region and a second contact region spaced apart from each other by a single layer, and
wherein the single layer includes an opening including an inlet that has a width increasing along a thickness direction.

12. The light emitting apparatus of claim 11, wherein the second light source includes a second bump and a second connector, and a center between two opposite sides of the second connector is shifted from a center between two opposite sides of the second bump.

13. The light emitting apparatus of claim 12, wherein the third light source includes a third bump and a third connector, and a center between two opposite sides of the third connector is shifted from a center between two opposite sides of the third bump.

14. The light emitting apparatus of claim 11, wherein the first connector includes a protrusion region on the first transparent electrode, and the first transparent electrode includes a recess region.

* * * * *